(12) United States Patent
Fleming et al.

(10) Patent No.: US 7,166,409 B2
(45) Date of Patent: Jan. 23, 2007

(54) MULTIPASS MULTIPHOTON ABSORPTION METHOD AND APPARATUS

(75) Inventors: Patrick R. Fleming, Lake Elmo, MN (US); Robert J. DeVoe, Oakdale, MN (US); Catherine A. Leatherdale, St. Paul, MN (US); Todd A. Ballen, St. Paul, MN (US); Jeffrey M. Florczak, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 200 days.

(21) Appl. No.: 10/297,968

(22) PCT Filed: Jun. 14, 2001

(86) PCT No.: PCT/US01/19125

§ 371 (c)(1),
(2), (4) Date: Dec. 12, 2002

(87) PCT Pub. No.: WO01/96961

PCT Pub. Date: Dec. 20, 2001

(65) Prior Publication Data

US 2004/0124563 A1   Jul. 1, 2004

Related U.S. Application Data

(60) Provisional application No. 60/211,704, filed on Jun. 15, 2000.

(51) Int. Cl.
G03F 7/038 (2006.01)

(52) U.S. Cl. .................. 430/269; 430/1; 430/270.13; 430/2; 359/3

(58) Field of Classification Search .................. 430/1, 430/2, 270, 13; 359/1, 3, 35
See application file for complete search history.

(56) References Cited

U.S. PATENT DOCUMENTS 3,018,262 A   1/1962   Schroeder (Continued)

FOREIGN PATENT DOCUMENTS

DE   2546079   *   5/1977

(Continued)

OTHER PUBLICATIONS

Payne et al. "High intensity laser beam attenuation based upon two-step absorption mechanism". J. Appl. Phys. vol. 72(9) pp. 4281-4287 (Nov. 1992).*

(Continued)

Primary Examiner—Martin Angebranndt
(74) Attorney, Agent, or Firm—Lucy C. Weiss; Ann M. Mueting

(57) ABSTRACT

A method of increasing the efficiency of a multiphoton absorption process and apparatus. The method includes: providing a photoreactive composition; providing a source of sufficient light for simultaneous absorption of at least two photons; exposing the photoreactive composition to at least one transit of light from the light source; and directing at least a portion of the first transit of the light back into the photoreactive composition using at least one optical element, wherein a plurality of photons not absorbed in at least one transit are used to expose the photoreactive composition in a subsequent transit.

27 Claims, 9 Drawing Sheets

U.S. PATENT DOCUMENTS

| | | | |
|---|---|---|---|
| 3,117,099 A | 1/1964 | Proops et al. | |
| 3,635,545 A * | 1/1972 | VanKerkhove et al. | 359/569 |
| 3,677,634 A | 7/1972 | Mathisen | |
| 3,720,921 A | 3/1973 | Schools et al. | |
| 3,729,313 A | 4/1973 | Smith | |
| 3,741,769 A | 6/1973 | Smith | |
| 3,758,186 A | 9/1973 | Brumm | |
| 3,779,778 A | 12/1973 | Smith et al. | |
| 3,806,221 A | 4/1974 | Kiemle | |
| 3,808,006 A | 4/1974 | Smith | |
| 3,954,475 A | 5/1976 | Bonham et al. | |
| 3,987,037 A | 10/1976 | Bonham et al. | |
| 4,041,476 A | 8/1977 | Swainson | |
| 4,078,229 A | 3/1978 | Swanson et al. | |
| 4,228,861 A | 10/1980 | Hart | |
| 4,238,840 A | 12/1980 | Swainson | |
| 4,250,053 A | 2/1981 | Smith | |
| 4,279,717 A | 7/1981 | Eckberg et al. | |
| 4,288,861 A | 9/1981 | Swainson et al. | |
| 4,333,165 A | 6/1982 | Swainson et al. | |
| 4,394,403 A | 7/1983 | Smith | |
| 4,394,433 A | 7/1983 | Gatzke | |
| 4,458,345 A | 7/1984 | Bjorklund et al. | |
| 4,466,080 A | 8/1984 | Swainson et al. | |
| 4,471,470 A | 9/1984 | Swainson et al. | |
| 4,491,628 A | 1/1985 | Ito et al. | |
| 4,496,216 A | 1/1985 | Cowan | |
| 4,515,445 A * | 5/1985 | Muller et al. | 359/386 |
| 4,547,037 A | 10/1985 | Case | |
| 4,588,664 A | 5/1986 | Fielding et al. | |
| 4,642,126 A | 2/1987 | Zador et al. | |
| 4,652,274 A | 3/1987 | Boettcher et al. | |
| 4,666,236 A | 5/1987 | Mikami et al. | |
| 4,775,754 A | 10/1988 | Vogel et al. | |
| 4,859,572 A | 8/1989 | Farid et al. | |
| 4,877,717 A | 10/1989 | Suzuki et al. | |
| 4,963,471 A | 10/1990 | Trout et al. | |
| 5,006,746 A | 4/1991 | Kasuga et al. | |
| 5,034,613 A | 7/1991 | Denk et al. | |
| 5,035,476 A * | 7/1991 | Ellis et al. | 359/202 |
| 5,037,917 A | 8/1991 | Babb et al. | |
| 5,145,942 A | 9/1992 | Hergenrother et al. | |
| 5,159,037 A | 10/1992 | Clement et al. | |
| 5,159,038 A | 10/1992 | Babb et al. | |
| 5,225,918 A | 7/1993 | Taniguchi et al. | |
| 5,235,015 A | 8/1993 | Ali et al. | |
| 5,283,777 A * | 2/1994 | Tanno et al. | 369/108 |
| 5,289,407 A | 2/1994 | Strickler et al. | |
| 5,405,733 A * | 4/1995 | Sirkin et al. | 430/313 |
| 5,422,753 A | 6/1995 | Harris | |
| 5,446,172 A | 8/1995 | Crivello et al. | |
| 5,478,869 A | 12/1995 | Takahashi et al. | |
| 5,479,273 A | 12/1995 | Ramsbottom | |
| 5,529,813 A | 6/1996 | Kobsa et al. | |
| 5,545,676 A | 8/1996 | Palazzotto et al. | |
| 5,633,735 A | 5/1997 | Hunter et al. | |
| 5,665,522 A | 9/1997 | Vogel et al. | |
| 5,703,140 A | 12/1997 | Kunita et al. | |
| 5,747,550 A | 5/1998 | Nohr et al. | |
| 5,750,641 A | 5/1998 | Ezzell et al. | |
| 5,753,346 A | 5/1998 | Leir et al. | |
| 5,759,721 A | 6/1998 | Dhal et al. | |
| 5,759,744 A | 6/1998 | Brueck et al. | |
| 5,770,737 A | 6/1998 | Reinhardt et al. | |
| 5,832,931 A | 11/1998 | Wachter et al. | |
| 5,847,812 A | 12/1998 | Ooki et al. | |
| 5,854,868 A | 12/1998 | Yoshimura et al. | |
| 5,856,373 A | 1/1999 | Kaisaki et al. | |
| 5,859,251 A | 1/1999 | Reinhardt et al. | |
| 5,864,412 A | 1/1999 | Wilde | |
| RE36,113 E | 2/1999 | Brueck et al. | |
| 5,952,152 A | 9/1999 | Cunningham et al. | |
| 5,998,495 A | 12/1999 | Oxman et al. | |
| 6,005,137 A | 12/1999 | Moore et al. | |
| 6,020,591 A | 2/2000 | Harter et al. | |
| 6,025,406 A | 2/2000 | Oxman et al. | |
| 6,025,938 A | 2/2000 | Kathman et al. | |
| 6,030,266 A | 2/2000 | Ida et al. | |
| 6,043,913 A | 3/2000 | Lu et al. | |
| 6,048,911 A | 4/2000 | Shustack et al. | |
| 6,051,366 A | 4/2000 | Baumann et al. | |
| 6,100,405 A | 8/2000 | Reinhardt et al. | |
| 6,103,454 A | 8/2000 | Dhar et al. | |
| 6,107,011 A | 8/2000 | Gelbart | |
| 6,215,095 B1 | 4/2001 | Partanen et al. | |
| 6,262,423 B1 * | 7/2001 | Hell et al. | 250/458.1 |
| 6,267,913 B1 | 7/2001 | Marder et al. | |
| 6,297,910 B1 | 10/2001 | Xuan et al. | |
| 6,312,876 B1 | 11/2001 | Huang et al. | |
| 6,316,153 B1 * | 11/2001 | Goodman et al. | 430/8 |
| 6,322,931 B1 | 11/2001 | Cumpston et al. | |
| 6,322,933 B1 * | 11/2001 | Daiber et al. | 430/2 |
| 6,327,074 B1 | 12/2001 | Bass et al. | |
| 6,441,356 B1 | 8/2002 | Mandella et al. | |
| 6,469,755 B1 | 10/2002 | Adachi et al. | |
| 6,541,591 B1 | 4/2003 | Olson et al. | |
| 6,608,228 B1 | 8/2003 | Cumpston et al. | |
| 6,618,174 B1 | 9/2003 | Parker et al. | |
| 6,624,915 B1 | 9/2003 | Kirkpatrick et al. | |
| 6,703,188 B1 | 3/2004 | Kagami et al. | |
| 6,750,266 B1 | 6/2004 | Bentsen et al. | |
| 2002/0034693 A1 | 3/2002 | Fukuda et al. | |
| 2004/0067431 A1 | 4/2004 | Arney et al. | |
| 2005/0009175 A1 | 1/2005 | Bergh et al. | |
| 2005/0054744 A1 | 3/2005 | DeVoe | |

FOREIGN PATENT DOCUMENTS

| | | | |
|---|---|---|---|
| DE | 41 42 327 | | 6/1993 |
| DE | 42 19 376 | | 12/1993 |
| DE | 4326473 | | 2/1995 |
| DE | 19653413 | | 6/1998 |
| JP | 06-097791 | * | 5/1987 |
| JP | 05-288992 | * | 11/1993 |
| JP | 6-265710 | | 9/1994 |
| WO | WO 92/00185 | | 1/1992 |
| WO | WO 97/27519 | | 7/1997 |
| WO | WO 98/21521 | | 5/1998 |
| WO | WO 99/23650 | | 5/1999 |
| WO | WO 99/53242 | | 10/1999 |
| WO | WO 99/54784 | | 10/1999 |
| WO | WO 02/079691 | | 10/2002 |

OTHER PUBLICATIONS

R. D. Allen, G. M. Wallraff, W. D. Hinsberg, and L. L. Simpson in *High Performance Acrylic Polymers for Chemically Amplified Photoresist Applications, J. Vac. Sci. Technol.* B, 9, 3357 (1991).

C. Xu and W. W. Webb in *J. Opt. Soc. Am. B*, 13, 481 (1996).

R. D Allen et al. in *Proc. SPIE* 2438, 474 (1995).

I. B. Berlman in *Handbook of Fluorescence Spectra of Aromatic Molecules*, Second Edition, pp. 24-27, Academic Press, New York (1971).

J. N. Demas and G. A. Crosby in *J. Phys. Chem.* 75, 991-1024 (1971).

J. V. Morris, M. A. Mahoney, and J. R. Huber in *J. Phys. Chem.* 80, 969-974 (1976).

*Bull. Chem. Soc.* Japan, 42, 2924-2930 (1969).

R. J. Cox, *Photographic Sensitivity*, Academic Press (1973), R.J. Cox, ed., pp. 241-263.

D. F. Eaton in *Advances in Photochemistry*, B. Voman et al., vol. 13, pp. 427-488, (1986).

Beringer et al., *J. Am. Chem. Soc.* 81, 342 (1959).

Makukha et al., *Two-Photon-Excitation Spatial Distribution for Cross Focused Gaussian Beams*, Applied Optics, vol. 40, No. 23, pp. 3932-3936 (Aug. 10, 2001).

Bunning et al. *Electronically Switchable Grating Formed Using Ultrafast Holographic Two-Photon-Induced Photopolymerization*, Chem. Mater., 2000, 12 pp. 2842-2844.

Diamond et al., *Two-Photon Holography in 3-D Photopolymer Host-Guest Matrix*, Optics Express, vol. 6, No. 3, Jan. 31, 2000, pp. 64-68.

Diamond et al., *Two-Photon Holography in 3-D Photopolymer Host-Guest Matrix: errata*, Optic Express, vol. 6, No. 4, Feb. 14, 2000, pp. 109-110.

Ashley et al., *Holographic Data Storage*, IBM J. Res. Develop. vol. 44, No. 3, May 2000, pp. 341-368.

Belfield et al., *Near-IR Two-Photon Photoinitiated Polymerization Using a Fluorone/Amine Initiating System*, J. Am. Chem. Soc., 2000, 122 pp. 1217-1218.

Campagnola et al., *3-Dimensional Submicron Polymcrization of Acrylamide By Multiphoton Excitation of Xanthene Dyes*, Macromolecules, 2000, vol. 33, pp. 1511-1513.

Hong-Bo Sun et al., *Three-dimensional Photonic Crystal Structures Achieved With Two-Photon-Absorption Photopolymerization of Material*, Applied Physics Letters, vol. 74, No. 6, Feb. 8, 1999, pp. 786-788.

Cumpston et. al. *Two-Photon Polymerization Initiators For Three-Dimensional Optical Data Storage and Microfabrication*, Nature, vol. 398, Mar. 4, 1999, pp. 51-54.

Joshi et al., *Three-dimensional Optical Circuitry Using Two-Photo-Assisted Polymerization*, Applied Physics Letters, vol. 74, No. 2, Jan. 11, 1999, pp. 170-172.

Bunning et al., *Electrically Switchable Grating Formed Using Ultrafast Holographic Two-Photon-Induced Photopolymerization*, Chem. Mater. 2000, vol. 12, pp. 2842-2844.

Kirkpatrick et al. *Holographic Recording Using Two-Photon-Induced Photopolymerization*, Appl. Phys. A, vol. 69, pp. 461-464, 1999.

Maruo s et al., *Movable Microstructures made by Two-Photon Three-Dimensional Microfabrication*, 1999 International Symposium on Micromechatronics and Human Science, vol. 23, pp. 173-178 XP002191032.

Kuebler S M et al., *Three-Dimensional Microfabrication Using Two-Photon Activated Chemistry*, SPIEvol. 3937, pp. 97-105, Jan. 27, 2000 XP008000209.

Cumpston B H et al., *New Photopolmers Based on Two-Photon Absorbing Chromophores and Application to Three-Dimensional Microfabrication and Optical Storage*, Mat. Res. Soc. Symp. Proc., vol. 488, pp. 217-225, 1998, XP008000191.

Kawata S. et al., *Photon-Iduces Micro/Nano Fabrication, Manipulation and Imaging with Unconvential Photo-Active Systems*, Mol. Cryst. Liq. Cryst. , vol. 314, pp. 173-178, Aug. 25, 1997, XP001059839.

Tanaka et al., *Three-Dimensional Fabrication and Observation of Micro-Structures Using Two-Photon Absorption and Fluorescence*, SPIE, vol. 3937, pp. 92-96, Jan. 27, 2000, XP001051866.

Wenseleers et al., *Five Orders-of-Magnitude Enhancement of Two-Photon Absorption for Dyes On Silver Nanoparticle Fractal Clusters*, J. Phys. Chem. B, vol. 106, pp. 6853-6863, 2002.

Zhou et al.. *Efficient Photacids Based Upon Triarylamine Dialkylsulfonium Salts*, J. Am. Chem. Soc., vol. 124, No. 9, pp. 1897-1901.

Zhou et al., *An Efficient Two-Photon-Generated Photoacid Applied To Positive-Tone 3D Microfabrication*, Science, vol. 296, pp. 1106-1109, May 10, 2002.

Stellacci et al., *Laser and Electon-Beam Induced Growth of Nanoparticles for 2D and 3D Metal Patterning*, Adv. Mater., vol. 14, No. 3, pp. 194-198, Feb. 2002.

Watanabe et al., *Photoreponsive Hydrogel Microstructure Fabricated by Two-Photon Initiated Polymerization*, Adv. Func. Mater., vol. 12, No. 9, pp. 611-614, Sep. 2002.

Hong-Bo Sun, *Real Three-Dimensional Microstructures Fabricated By Photpolymerization of Resins Through Two-Photon Absorption*, Optical Letters, vol. 25, No. 5, pp. 1110-1112, Aug. 2000.

Misawa et al., *Microfabrication By Femtosecond Laser Irradiation*, SPIE., vol. 3993, pp. 246-260, 2000.

Miwa, *Femtosecond Two-Photon Stereo-Lithography*, Applied Physics A, vol. 73, No. 5, pp. 561-566, 2001.

Kawata et al., *Two-Photon Photopolymerization of Functional Micro-Devices*, Journal of Photopolymer Science and Technology, vol. 15, No. 3, pp. 471-474, 2002.

Boiko et al., *Thresold Enhancement in Two-Photon Photopolymerization*, SPIE, vol. 4097, pp. 254-263, 2000.

Belfield et al., *Multiphoton-Absorbing Organic Materials For Microfabrication*, emerging Optical Applications and Non-Destructive Three-Dimensional Imaging, J. Phys. Org., vol. 13, pp. 837-849, 2000.

Serbin et al., *Femtosecond Laser-Induced Two-Photon Polymerization of Inorganic-Organic Hybrid Materials for Applications in Photonics*, Optics Letters, vol. 28, No. 5, pp. 301-303, Mar. 2003.

Davidson, *The Chemistry of Photoinitiators Some Recent Developments*, J. Photochem. Photobiol. A., vol. 73, pp. 81-96, 1993.

Dektar et al., *Photochemistry of Triarylsulfonium Salts*, J. Am. Chem. Soc., vol. 112, pp. 6004-6015, 1990.

Denk et al., *Two-Photon Laser Scanning Fluorescence Microscopy*, Science, vol. 248, pp. 73-76, Apr. 1990.

Dvornikov et al., *Two-Photon Three-Dimensional Optical Storage Memory*, Advances in Chemistry Series, vol. 240, pp. 161-177, 1994.

Goppert-Mayer, *Uber Elmentarakte Mit zwei Quantesprungen*, Ann. Phys., vol. 9, pp. 273-294, 1931.

Ito, *Chemical Amplifcation Resists: History and Development Within IBM*, IBM J. Res. Develop., vol. 41, No. ½, pp. 69-80, Mar. 1997.

Jenkins et al., *Fundamentals of Optics*, 3rd Edition, McGraw-Hill, New York, pp. 331, 1957.

Kavarnos et al., *Photosensitization By Reversible Electron Transfer : Theories, Experimental Evidence, and Examples*, Chem. Rev., vol. 86, pp. 401-449, Apr. 1986.

Kennedy et al., *p-Bis(o-methylstyryl) benzene as a Power-Squared Sensor for Two-Photon Absorption Measurements between 537 and 694 nm*, Anal. Chem., vol. 58, pp. 2643-2647, 1986.

Kewitsch et al., *Self-Focusing and Self-Trapping of Optical Beams Upon Photopolymerization*, Optics Letters, vol. 21, No. 1, pp. 24-26, Jan. 1996.

Lee et al., *Micromachining Applications of a High Resolution Ultrathick Photoresist*, J. Vac. Sci. Technol. B, vol. 13, pp. 3012-3016, Dec. 1995.

Lipson et al., *Nature of the Potential Energy Surfaces for the Snl Reaction A Picosecond Kinetic Study of Homolysis and Heterolysis for Diphenylmethyl Chlorides*, J. Am. Chem. Soc., vol. 118, pp. 2992-2997, 1996.

Lorenz et al., *SU-8: a low cost negative resisst for MEMS*, J. Micromech. Microeng. , vol. 7, pp. 121-124, 1997.

Maiti et al., *Measuring Serotonin Distribution in Live Cells with Three-Photon Excitation*, Science, vol. 275, pp. 530-532, Jan. 1997.

March, *Advanced Organic Chemistry: Reactions, Mechanisms and Structure*, Four Edition, 1992, Wiley-Interscience, New York, p. 205.

March, *Advanced Organic Chemistry: Reactions, Mechanisms and Structure*, Four Edition, 1992, Wiley-Interscience, New York, Chapter 2.

March, *Advanced Organic Chemistry: Reactions, Mechanisms and Structure*, Four Edition, 1992, Wiley-Interscience, New York, Chapter 9.

Maruo et al., *Two-Photon-Absorbed Photopolymerization for Three-Dimensional Microfabrication*, IEEE, The Tenth Annual International Workshop on Micro Electro Mechanical Systems, pp. 169-174, 1997.

Maruo et al., *Three-Dimensional Microfabrication With Two-Photon-Absorbed Photopolymerizaton*, Optics Letters, vol. 22, No. 2, pp. 132-134, Jan. 1997.

McClelland et al., *Laser Flash Photolysis of 9-Fluorenol. Production and Reactivities of the 9-Fluorenol Radical Cation and the 9-Fluorenyl Cation*, J. Am. Chem. Soc., vol. 112, pp. 4857-4861, 1990.

McClelland et al., *Flash Photolysis Study of a Friedel-Crafts alkylation. Reaction of the Photogenerated 9-Fluorenyl cation with aromatic compounds*, J. Chem. Soc., vol. 2, pp. 1531-1543, 1996.

Odian, *Principles of Polymerization Second Edition John Wiley & Sons*, New York, 1981, pp. 181.

Richardson, *Langmuir-Blodgett Films, An Introduction to Molecular Electronics*, Chapter 10, 1995.

Pitts et al., *Submicro Multiphoton Free-Form Fabrication of Proteins and Polymers : Studies of Reaction Efficiencies and Applications in Sustained Release*, Macromolecules, vol. 33, pp. 1514-1523, 2000.

He et al., *Two-Photon Absorption and Optical-Limiting Properties of Novel Organic Compounds*, Optics Letters, vol. 20, No. 5, pp. 435-437, Mar. 1995.

Parthenopoulos et al., *Three-Dimensional Optical Storage Memory*, Science, vol. 245, pp. 843-845, Aug. 1989.

Shaw et al., *Negative Photoresists for Optical Lithography*, IBM J. Res. Develop., vol. 41, No. 1/2, pp. 81-94, Jan./Mar. 1997.

Shirai et al., *Photoacid and Photobase Generators : Chemistry and Applications to Polymeric Materials*, Prog. Polym. Sci., vol. 21, pp. 1-45, 1996.

Smith, *Modern Optic Engineering*, 1996, McGraw-Hill pp. 104-105.

Strickler et al., *Three-Dimensional Optical Data Storage in Refractive Media by Two-Photon Point Excitation*, Optics Letters, vol. 16, No. 22, pp. 1780-1782, Nov. 1991.

Strickler et al., *3-D Optical Data Storage By Two-Photon Excitation*, Adv. Mater., vol. 5, No. 6, pp. 479, 1993.

Thayumanavan et al., Synthesis of Unsymmetrical Triarylamines for Photonic Applications via One-Pot Palladium-Catalyzed Aminations, Chem. Mater., vol. 9, pp. 3231-3235, 1997.

Wan et al., *Contrasting Photosolvolytic Reactivities of 9-Fluorenol vs. 5-Suberenol Derivatives. Enhanced Rate of Formation of Cyclically Conjugated Four π Carbocations in the Excited State*, J. Am. Chem. Soc., vol. 111, pp. 4887-4895, 1989.

Williams et al., *Two-Photon Molecular Excitation Provides Intrinsic 3-Dimensional Resolution for Laser-based Microscopy and Microphotochemistry*, FASEB Journal, vol. 8, pp. 804-813, Aug. 1994.

Xu et al., *Multiphoton Fluorescence Excitation: New Spectral Windows for Biological Nonlinear Microscopy*, Proc. Natl. Acad. Sci. USA, vol. 93, pp. 10763-10768, Oct. 1996.

Yuste et al., *Dendritic Spines as Basic Functional Units of Neuronal Integration*, Nature, vol. 375, pp. 682-684, Jun. 1995.

Kosar, *Photochemical Formation and Destruction of Dyes, Light-Sensitive Systems*, John Wiley & Sons, New York, NY, 1965, Chapter 8.

Badlwinson, *Auxiliaries Associated With Main Dye Classes, Colorants and Auxiliaries*, vol. 2, 1990, Chapter 12.

Syper et al., *Synthesis of Oxiranylquinones as New Potential Bioreductive Alkylating Agents*, Tetrahedron vol. 39, No. 5, pp. 781-792, 1983.

Zollinger, *Color Chemistry*, VCH, Weinheim, GE, 1991, Chapter 8.

Misawa et al., *Multibeam Laser Manipulation and Fixation of Microparticles*, Appl. Phys. Letter, vol. 60, No. 3, pp. 310-312, Jan. 20, 1992. (XP 002189602).

Sun et al., *Photonic Crystal Structures With Submicrometer Spatial Resolution Achieved By High Power Femtosecond Laser-Induced Photopolymerization*, SPIE, vol. 3888, pp. 122-130, 2000. (XP 001051864).

Translation of JP 62-097791.

Clark et al., "Fiber Delivery of Femosecond pulses from a Ti:sapphire Laser", Opt. Lett., vol. 26(17) pp. 1320-1322 (Sep. 2001).

Corning SNF-28 Optical Fiber (Product Brochure PI1036(Apr. 2002) 4 pages.

Göbel, "Distortion-Free Delivery of Nanojoule Femtosecond Pulses from a Ti:sapphire laser through a Hollow-core Photonic Crystal Fiber", Opt. Lett. vol. 29(11) pp. 1285-1287 (Jun. 2004).

Grime, G.W. , "Holographic Diffraction Grating Recorded in Photoresist", in Non-Silver Photographic Processes, Cox, Ed. (1975).

Bogdanov et al., "Parallel, confocal, and complete spectrum imager for fluorescent detection of high density micro array", Proc. SPIE vol. 3605 pp. 298-307 (Jan. 1999).

Hell et al., "Fundamental improvement of resolution with a 4Pi-confacl fluorescence microscope using two photon excitation", Opt. Commun. vol. 93 (5,6) pp. 277-282 (1992).

* cited by examiner

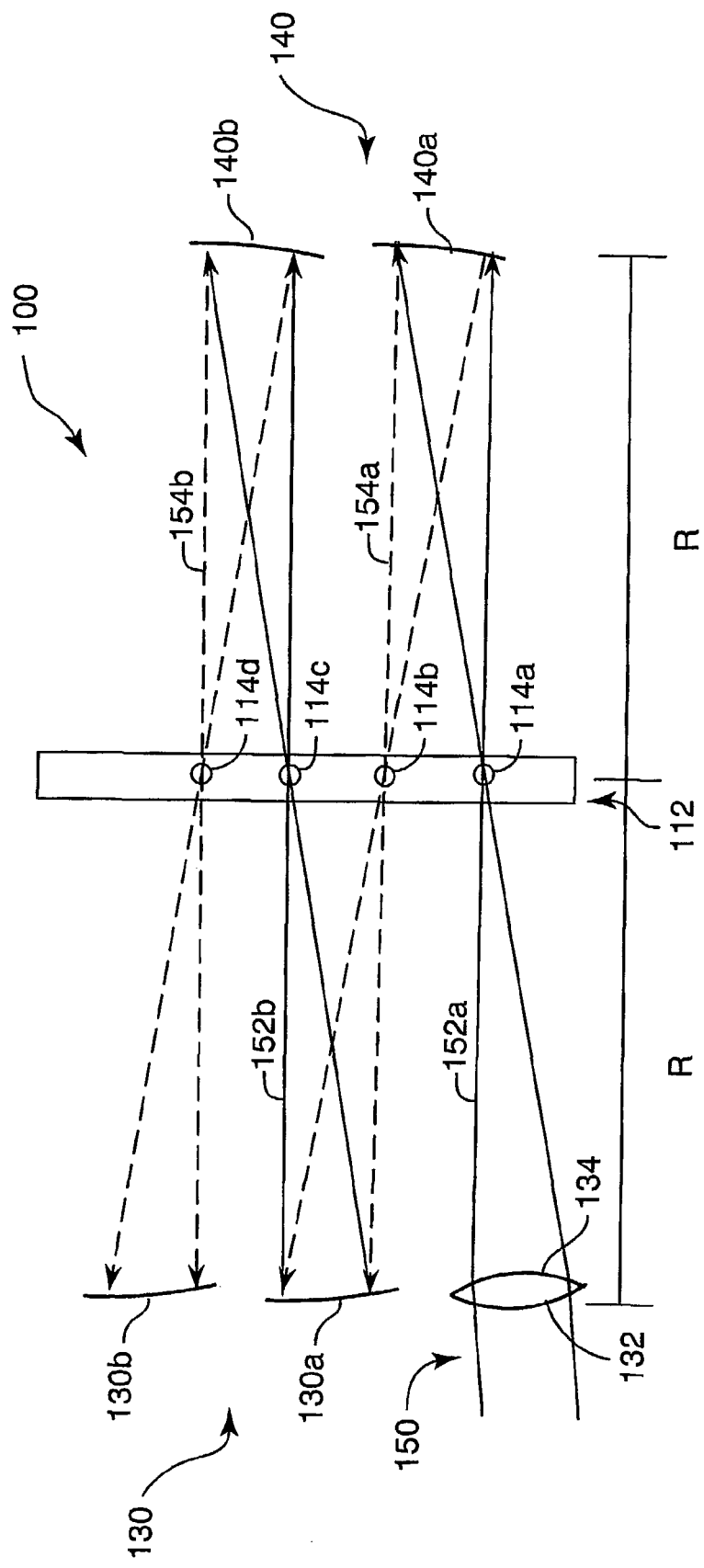

MULTIPASS MULTIPHOTON ABSORPTION METHOD AND APPARATUS

STATEMENT OF PRIORITY

This application claims the priority of U.S. Provisional Application No. 60/211,704 filed Jun. 15, 2000, the contents of which are hereby incorporated by reference.

FIELD

This invention relates to a method of enhancing the efficiency of a light source (e.g., a short pulse laser) used in a multiphoton absorption (e.g., curing) process, the method comprising passing the light through a photoreactive composition a plurality of times.

BACKGROUND

Molecular two-photon absorption was predicted by Goppert-Mayer in 1931. Upon the invention of pulsed ruby lasers in 1960, experimental observation of two-photon absorption became a reality. Subsequently, two-photon excitation has found application in biology and optical data storage, as well as in other fields.

There are two key differences between two-photon-induced photoprocesses and single-photon induced processes. Whereas single-photon absorption scales linearly with the intensity of the incident light, two-photon absorption scales quadratically. Higher-order absorptions scale with a related higher power of incident intensity. As a result, it is possible to perform multiphoton processes with three-dimensional spatial resolution. Also, because multiphoton processes involve the simultaneous absorption of two or more photons, the absorbing chromophore is excited with a number of photons whose total energy equals the energy of an excited state of a multiphoton photosensitizer, even though each photon individually has insufficient energy to excite the chromophore. Because the exciting light is not attenuated by single-photon absorption within a curable matrix or material, it is possible to selectively excite molecules at a greater depth within a material than would be possible via single-photon excitation by use of a beam that is focused to that depth in the material. These two phenomena also apply, for example, to excitation within tissue or other biological materials.

Major benefits have been achieved by applying multiphoton absorption to the areas of photocuring and microfabrication. For example, in multiphoton lithography or stereolithography, the nonlinear scaling of multiphoton absorption with intensity has provided the ability to write features having a size that is less than the diffraction limit of the light utilized, as well as the ability to write features in three dimensions (which is also of interest for holography). Such work has been limited, however, to slow writing speeds and high laser powers. Thus, there is a need for methods of improving the throughput and efficiency of multiphoton absorption systems.

SUMMARY

The present invention provides a method of increasing the efficiency of a multiphoton absorption process. The method includes: providing a photoreactive composition; providing a source of sufficient light for simultaneous absorption of at least two photons by the photoreactive composition; exposing (preferably, pulse irradiating, for example, using a near infrared pulsed laser having a pulse length of less than about 10 nanoseconds) the photoreactive composition to at least a first transit of light from the light source; and directing at least a portion of the first transit of the light back into the photoreactive composition using at least one optical element, wherein a plurality of photons not absorbed in the first transit are used to expose the photoreactive composition in a subsequent transit.

It is an advantage of the invention that more efficient use of high power laser light in a multiphoton absorption process can be obtained by passing the laser light through the photoreactive composition a plurality of times. This can be accomplished by use of an appropriate optical element, such as a focusing mirror, a waveguide, or a cube corner reflective element, for example.

Preferably, directing at least a portion of the first transit of the light back into the photoreactive composition includes directing at least a portion of the first transit of the light back into the photoreactive composition at the same location exposed to the first transit of light. Alternatively, directing at least a portion of the first transit of the light back into the photoreactive composition includes directing at least a portion of the first transit of the light back into the photoreactive composition at a location different from that exposed to the first transit of light.

The present invention also provides a method of increasing the efficiency of a multiphoton absorption process that includes: providing a photoreactive composition; providing a source of sufficient light for simultaneous absorption of at least two photons by the photoreactive composition; focusing the light at a first focal point within the photoreactive composition, wherein a first portion of light is absorbed by the photoreactive composition and a second portion of light transits the photoreactive composition; and focusing the second portion of light at a second focal point within the photoreactive composition.

Preferably, focusing the second portion of light at a second focal point further includes reflecting the second portion of light through the photoreactive composition. Alternatively, focusing the second portion of light includes focusing the second portion of light at a plurality of focal points. Preferably, reflecting the second portion of light includes reflecting multiple transits of the second portion of light through the photoreactive composition without focusing.

Preferably, reflecting multiple transits of the second portion of light includes selectively directing the second portion of light between a plurality of optical elements, wherein at least one optical element of the plurality of optical elements is capable of selectively reflecting the light through the photoreactive composition without focusing, and at least one optical element of the plurality of optical elements is capable of selectively focusing the light at a focal point within the photoreactive composition.

If desired, reflecting the second portion of light through the photoreactive composition and focusing the second portion of light is repeated one or more times to create a plurality of focal points. Furthermore, if desired, reflecting the second portion of light involves reflecting multiple transits of the second portion of light through the photoreactive composition without focusing.

Preferably, the photoreactive composition includes a curable species that is cured proximate the first focal point and proximate the second focal point. If desired, the first focal point and the second focal point are at the same location within the photoreactive composition.

The present invention also provides a method of increasing the efficiency of a multiphoton absorption process. The method includes: providing a photoreactive composition disposed on a reflective substrate; providing a source of sufficient light for simultaneous absorption of at least two photons by the photoreactive composition; exposing the photoreactive composition to the light from the light source at a first focal point; and reflecting the light back into the photoreactive composition by the reflective substrate. Preferably, the method further includes directing the light to an optical element for reflecting the light back into the photoreactive composition at a second focal point. More preferably, in this method, reflecting the light by the reflective substrate and reflecting the light by an optical element are repeated one or more times to create a plurality of focal points.

A photoreactive composition of the present invention includes a reactive species, which is preferably a curable species, such as monomers, oligomers, reactive polymers, and mixtures thereof, although non-curable species are also possible. Preferred examples of a curable species include addition-polymerizable monomers and oligomers, addition-crosslinkable polymers, cationically-polymerizable monomers and oligomers, cationically-crosslinkable polymers, and mixtures thereof.

Preferably, the photoreactive composition also includes a multiphoton photosensitizer. A photoreactive composition may or may not include an electron donor compound. A photoreactive composition can optionally include a photoinitiator.

A preferred photoreactive composition includes about 5% to about 99.79% by weight of the at least one reactive species, about 0.01% to about 10% by weight of the at least one multiphoton photosensitizer, up to about 10% by weight of the at least one electron donor compound, and about 0.1% to about 10% by weight of the at least one photoinitiator, based upon the total weight of solids.

The present invention also provides an apparatus for multiphoton absorption. The apparatus includes: a photoreactive composition; a light source providing sufficient light for simultaneous absorption of at least two photons by the photoreactive composition; a plurality of optical elements, wherein the photoreactive composition is located between at least two of the plurality of optical elements, wherein at least one optical element of the plurality of optical elements is capable of selectively reflecting the light through the photoreactive composition without focusing, and at least one optical element of the plurality of optical elements is capable of selectively focusing the light at a focal point within the photoreactive composition.

The optical element is preferably one or more of concave spherical mirrors, concave aspheric mirrors, planar mirrors, digital micromirror devices, polarizers, lenses, retroreflectors, gratings, phase masks, holograms, diffusers, Pockels cells, wave-guides, wave plates, birefringent liquid crystals, prisms, and combinations thereof.

The light source preferably includes a pulsed laser. Preferably, the wavelength of the light is about 300 nm to about 1500 nm, more preferably, about 600 nm to about 1100 nm, and most preferably, about 750 nm to about 850 nm.

DEFINITIONS

As used herein:

"multiphoton absorption" means simultaneous absorption of two or more photons to reach a reactive, electronic excited state that is energetically inaccessible by the absorption of a single photon of the same energy;

"simultaneous" means two events that occur within the period of $10^{-14}$ second or less;

"electronic excited state" means an electronic state of a molecule that is higher in energy than the molecule's electronic ground state, that is accessible via absorption of light, and that has a lifetime greater than $10^{-13}$ second;

"react" means to effect curing (polymerization and/or crosslinking) as well as to effect depolymerization or other reactions;

"optical system" means a system for controlling light, the system including at least one element chosen from refractive optical elements such as lenses, reflective optical elements such as mirrors, and diffractive optical elements such as gratings; optical elements shall also include diffusers, waveguides, and other elements known in the optical arts;

"exposure system" means an optical system plus a light source;

"sufficient light" means light of sufficient intensity and appropriate wavelength to effect multiphoton absorption;

"photosensitizer" means a molecule that lowers the energy required to activate a photoinitiator by absorbing light of lower energy than is required by the photoinitiator for activation and interacting with the photoinitiator to produce a photoinitiating species therefrom;

"photochemically effective amounts" (of the components of the photoinitiator system) means amounts sufficient to enable the reactive species to undergo at least partial reaction under the selected exposure conditions (as evidenced, for example, by a change in density, viscosity, color, pH, refractive index, or other physical or chemical property);

"transit" means passing light completely through a volume of a photoreactive composition; and "focus" or "focusing" means bringing collimated light to a point or forming an image of an object.

BRIEF DESCRIPTION OF THE DRAWINGS

FIGS. 3a–3e illustrate alternative embodiments of a multipass multiphoton apparatus extended to any number (N) of passes through a sample.

DETAILED DESCRIPTION OF PREFERRED EMBODIMENTS

A preferred system for multiphoton absorption can include an exposure system that includes a light source and an appropriate optical element, and a photoreactive composition that includes at least one reactive species, at least one multiphoton photosensitizer, optionally at least one electron donor compound, and optionally at least one photoinitiator for the photoreactive composition. The photoinitiator is typically optional except when the reactive species is a cationic resin.

In practice, the method of the present invention can be used to prepare complex, three-dimensional objects by exposure of a photoreactive composition to a light source of sufficient energy to cause a photoreactive composition to react (e.g., cure). Preferably, unreacted material is separated from the desired object by, e.g., washing with a solvent or other art-known means.

Unlike conventional photocuring, very little of the incident light is absorbed and used when a photoreactive composition is exposed. While curing systems are not limited by the amount of light available, it is probable that they will be sometime in the near future. By passing the light (e.g., laser) through the sample more than once, one can make much more efficient use of the light. Since short pulse photons require considerable resources to generate, and there is currently no way to scale up existing sources, multipassing may be important to make two photon polymerization practical. Light that is directed back into the photoreactive composition can be directed to the same focus spot of interest for the previous transit, or it may be directed to a separate focus spot.

Figure 1:
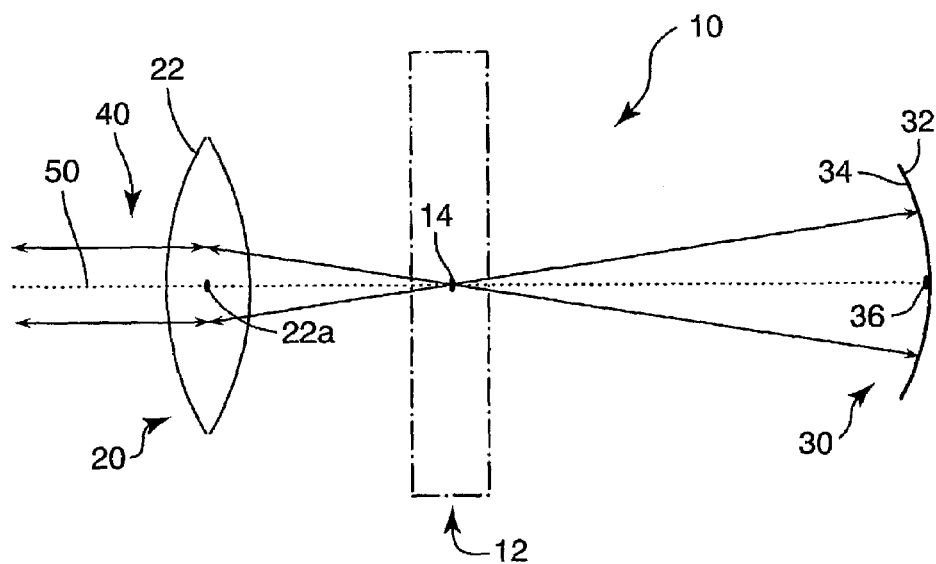
FIG. 1 illustrates a multipass multiphoton absorption apparatus of one embodiment of the present invention.

FIG. 1, illustrates a multipass multiphoton absorption apparatus 10 of one embodiment of the present invention where light is directed back into the photoreactive composition at the same focus spot of interest as the previous transit. The apparatus 10 includes at least one first optical element 20, at least one second optical element 30, and a photoreactive composition 12. The photoreactive composition 12, which is described in greater detail below, is preferably of a highly uniform thickness to prevent imaging aberrations and so that the full working distance of the imaging system can be utilized.

As shown in FIG. 1, light 40 approaches the at least one first optical element 20 generally parallel to an axis 50. The at least one first optical element 20 focuses the light 40 to a focal point 14 within the photoreactive composition 12. The at least one first optical element 20 includes a converging lens 22 with its center 22a lying on axis 50. Although depicted as a converging lens 22, the at least one first optical element 20 may include any suitable optical device known in the art capable of focusing light to a focal point. As is well known in the art, converging lens 22 will focus parallel light to a focal point at a distance from the center of the lens 22a equal to a focal length f. Here, the distance from the center 22a of the converging lens 22 to the focal point 14 is equal to the focal length f for the lens 22. After being focused at focal point 14, light 40 begins to diverge as it leaves the photoreactive composition 12.

The divergent beam 40 is collected by an at least one second optical element 30 located on the opposite side of the photoreactive composition 12 from the at least one first optical element 20. The at least one second optical element 30 includes a spherical focusing mirror 32 having a first reflective surface 34. Although depicted in FIG. 1 as a spherical focusing mirror, the at least one second optical element 30 may be any suitable optical device known in the art, e.g., an aspheric mirror, or a combination of elements that produce the same effect, e.g., a collimating lens and a planar mirror, etc. After collecting the divergent light 40, the spherical focusing mirror 32 reflects the light 40 back toward to photoreactive composition 12, focusing the light 40 back to focal point 14. As is well known in the art, reflective spherical focusing elements such as spherical focusing mirror 32 have a focal length f that is equal to one-half the radius of curvature of the mirror times the index of refraction n for the medium between the mirror and its focus. Here, spherical focusing mirror 32 has a focal length equal to the distance from a vertex 36 of the mirror to focal point 14 along axis 50, such that the mirror 32 projects the image of focal point 14 back to precisely the same location in the photoreactive composition 12.

Because the at least one second optical element 30 refocuses the light 40 at the focal point 14, the dose of light received by the photoreactive composition 12 is effectively doubled. The photoreactive composition 12 is moved relative to the optical elements 20 and 30 to react (e.g., cure) the composition in an arbitrary pattern. This allows for an increase in manufacturing speed since the photoreactive composition may now be moved at least twice as fast as a single transit geometry and still receive the same amount of absorbed energy.

Figure 2:
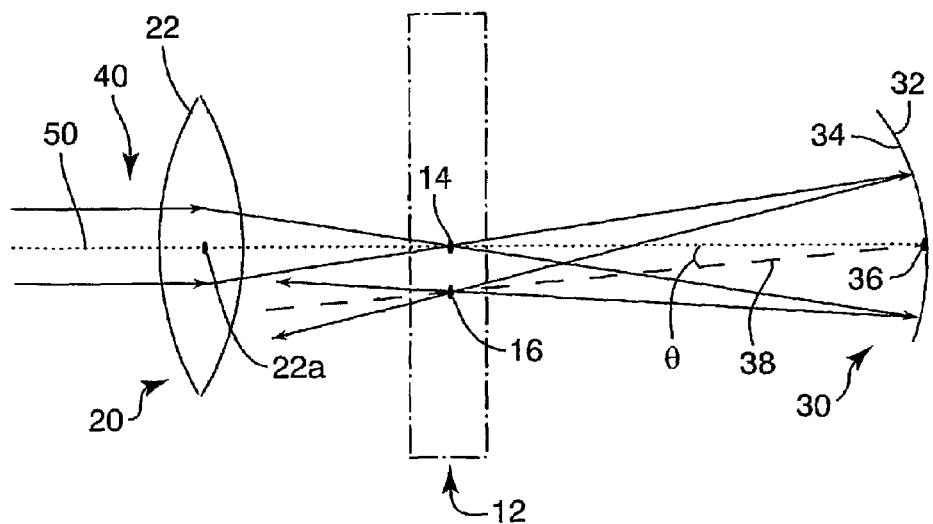
FIG. 2 illustrates an alternative embodiment of a multipass multiphoton absorption apparatus.

FIG. 2 illustrates another embodiment of the multipass multiphoton absorption apparatus 10 of FIG. 1. In FIG. 2, the at least one second optical element 30 is tilted at an angle θ, which is formed by the axis 50 and an axis 38 that intersects the vertex 36 and a second focal point 16. The tilt in the at least one second optical element 30 is such that the light 40 is refocused at a second focal point 16. This also allows a second gain in efficiency since the same laser beam 40 is being used to react (e.g., cure) multiple locations (i.e., first focal point 14 and second focal point 16) in the photoreactive composition 12. In both cases, the at least one second optical element 30 should have a numerical aperture greater than or equal to that utilized by the at least one first optical element 20 to maximize light gathering.

In theory at least, the principles described in FIG. 2 may be extended to any number (N) of passes through the sample as long as sufficient light intensity is retained. FIGS. 3a–3e show some possible embodiments of such a system.

Figure 3A:
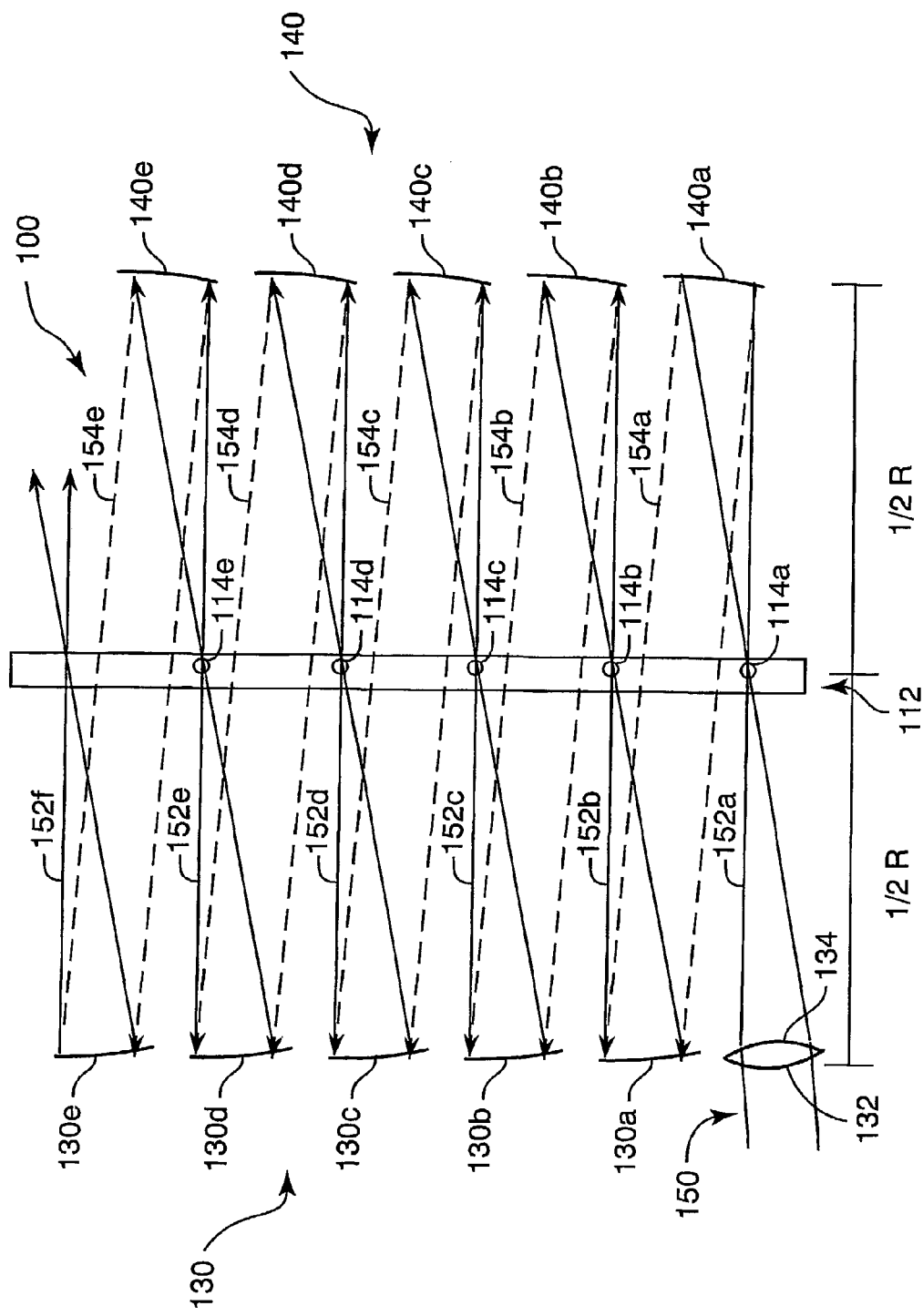

FIG. 3a shows a plurality of first optical elements 130, a plurality of second optical elements 140, a photoreactive composition 112, and a light beam 150 focused by optical element 132. The plurality of first optical elements 130 includes spherical focusing mirrors 130a–130e, and the plurality of second optical elements 140 includes spherical focusing mirrors 140a–140e. Optical element 132 includes converging lens 134. The photoreactive composition 112 is positioned such that it is in between the plurality of first optical elements 130 and the plurality of second optical elements 140. As depicted, the distance between the plurality of first optical elements 130 and the plurality of second optical elements 140 is equal to the radius of curvature (R) of each of the spherical focusing mirrors 130a–130e and 140a–140e.

As illustrated in FIG. 3a, the light beam 150 is sent through the converging lens 134, which focuses the beam 150 at a first focal point 114a in the photoreactive composition 112. The first focal point 114a is at a distance f that is the focal length of converging lens 134. The diverging light leaving the photoreactive composition 112 is collected and reflected by spherical focusing mirror 140a. Because the first focal point 114a is at a distance f that is approximately equal to the focal length of the spherical focusing mirror 140a, light from the first focal point 114a will be reflected by mirror 140a as parallel, or recollimated beam 154a, which will pass through the photoreactive composition 112 without focusing at a focal point and thus no reaction with the photoreactive composition 112 (e.g., curing) takes place. This can be accomplished by setting the intensity of the beam of pulsed light 150 such that negligible 2-photon absorption occurs as the large diameter, collimated beams 154a–e pass through the photoreactive composition.

When the recollimated light beam 154a reaches the spherical focusing mirror 130a, it is reflected as light beam 152b, which is focused to a second focal point 114b, thus reacting with (e.g., curing) the photoreactive composition 112 at focal point 114b. The spot size of focal point 114b will depend on the numerical aperture of the plurality of first and second optical elements 130 and 140, respectively.

As can be seen in FIG. 3a, the multipass multiphoton absorption apparatus 100 can include any number of first and second optical elements that continue to collect and reflect either focused or unfocused light through the photoreactive composition 112.

To produce a three-dimensional pattern, the photoreactive composition 112 is scanned in the xyz planes, holding the positions of both banks of the plurality of first and second optical elements 130 and 140 fixed. Alternatively, the arrays of the plurality of first and second optical elements 130 and 140 can be moved as a group, keeping the distance between them constant (e.g., the radius of curvature R) and the photoreactive composition held fixed. This system is suitable for reproducing three-dimensional patterns at multiple locations.

An alternative system also suitable for reproducing a three-dimensional pattern at multiple locations can be made by placing the banks of optical elements (e.g., mirrors) 130 and 140 a distance equal to two times the radius of curvature R apart. In FIG. 3b, the multipass multiphoton absorption apparatus 100 of FIG. 3a is depicted in an alternative embodiment where the plurality of first optical elements 130 is located a distance from the plurality of second optical elements 140 of twice the radius of curvature R of spherical focusing mirrors 130a–130b and 140a–140b. By placing the mirrors at a distance of 2R, the image of the first focal point 114a will be reproduced 1:1 (i.e., without magnification) each time the light beams 152b and 154a–154b pass through the photoreactive composition 112 at focal points 114b–144d. The photoreactive composition 112 is then scanned in the xyz planes to produce the pattern.

Figure 3C:
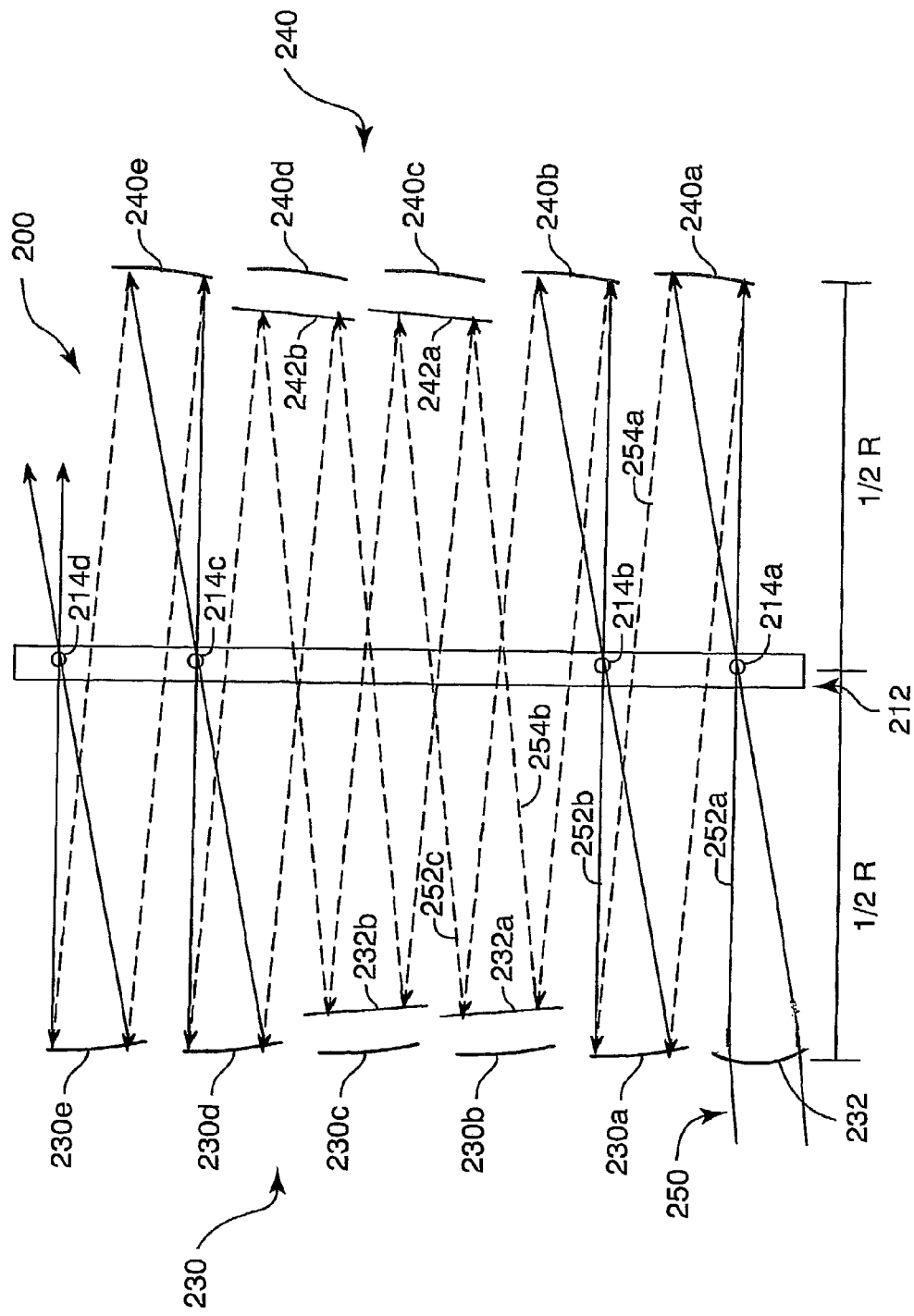

To produce an arbitrary pattern that is stitched together from multiple imaging spots it may be preferable to incorporate active control of focusing into each of the mirrors. One way to accomplish this is to place a flat mirror (whose reflectivity may be turned on and off) in front of each curved mirror. FIG. 3c is an illustration of this technique.

The embodiment depicted in FIG. 3c is similar to the multipass multiphoton absorption apparatus 100 depicted in FIG. 3a. In FIG. 3c, a multipass multiphoton absorption apparatus 200 is configured to produce four writing spots (i.e., focal points 214a, 214b, 214c, and 214d) and two regions where absorption (resulting in a reaction such as curing) doesn't take place. The apparatus 200 includes a plurality of first optical elements 230, a plurality of second optical elements 240, and a photoreactive composition 212. As in FIG. 3a, the plurality of first optical elements 230 are placed at a distance from the plurality of second optical elements 240 equal to the radius of curvature R of the spherical focusing mirrors 230a–230e and 240a–240e.

What differentiates the multiphoton absorption apparatus 200 of FIG. 3c from the embodiment depicted in FIG. 3a is the placement of flat mirrors 232a, 232b, 242a, and 242b in front of spherical focusing mirrors 230b, 230c, 240c, and 240d, respectively. In this embodiment, focusing lens 232 initially focuses light beam 250 at focal point 214a, which is then reflected by spherical focusing mirror 240a. After passing through the photoreactive composition 212, light beam 254a is reflected by spherical focusing mirror 230a back through focal point 214b along 252b to spherical focusing mirror 240b, and back through the photoreactive composition 212 to optical element 232a, which, as pictured in FIG. 3c, is a flat mirror placed in front of spherical focusing mirror 230b. The flat mirror 232a is any suitable flat mirror known in the art. The flat mirror 232a may be of the type that can be turned on and off by an electrical field. When the flat mirror is "on," the light beam 254b is directed to the next writing location without focusing. When the flat mirror is "off" the underlying spherical focusing mirror 230b focuses the light into the photoreactive composition 212. Depending on the speed of actuation of the mirrors, the configuration of flat and curved mirrors could be changed during processing or preset at the beginning of the photoimaging process.

Figure 3D:
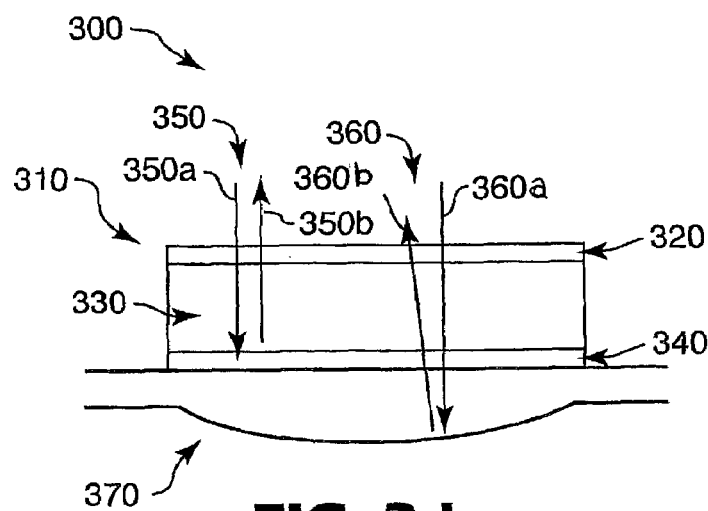

An example of a configuration using the planar mirror 232a and spherical focusing mirror 230b of FIG. 3c is illustrated as an alternative embodiment in FIG. 3d. Here, a planar mirror system 300 includes a planar mirror 310 and a concave mirror 370. The planar mirror 310 has controllable reflectivity (which can be used with polarized light). When the planar mirror system 300 is in its "on" state, light beam 350 passes through polarizer 320 along path 350a and enters a birefringent liquid crystal layer 330. When in the "on" state, the birefringent liquid crystal layer 330 rotates the polarization state of the light so that it is perpendicular to the transmission axis of an underlying reflective polarizer 340. Because the polarization of light beam 350 is now perpendicular to the underlying reflective polarizer 340, the beam 350 will not pass through polarizer 340. Instead, beam 350 is reflected back along path 350b and through polarizer 320.

When the planar mirror system 300 is in its "off" state, light beam 360 passes through polarizer 320 along path 360a and into the liquid crystal layer 330 where the liquid crystal layer 330 rotates the polarization state of the beam 360 so that it is parallel to the transmission axis of the reflective polarizer 340. The beam 360 passes through the reflective polarizer 340 and proceeds to the concave mirror 370, where it is focused back through the reflective polarizer 340 and the liquid crystal layer 330 along path 360b to form a focal point within the photoreactive composition (see, e.g., photoreactive composition 212 of FIG. 3c).

A similar action can be achieved by using total internal reflection (TIR) and frustrated TIR at the rear interface of the mirror to achieve the "on" and "off" states of the mirror. The TIR effect could be frustrated through the use of a piezoelectric driven membrane (or other means) positioned near the rear interface of the mirror. When the membrane (or other material) is brought near to the dielectric mirror, the evanescent wave present at the interface couples into the membrane and reduces the reflectivity of the mirror.

Figure 3E:
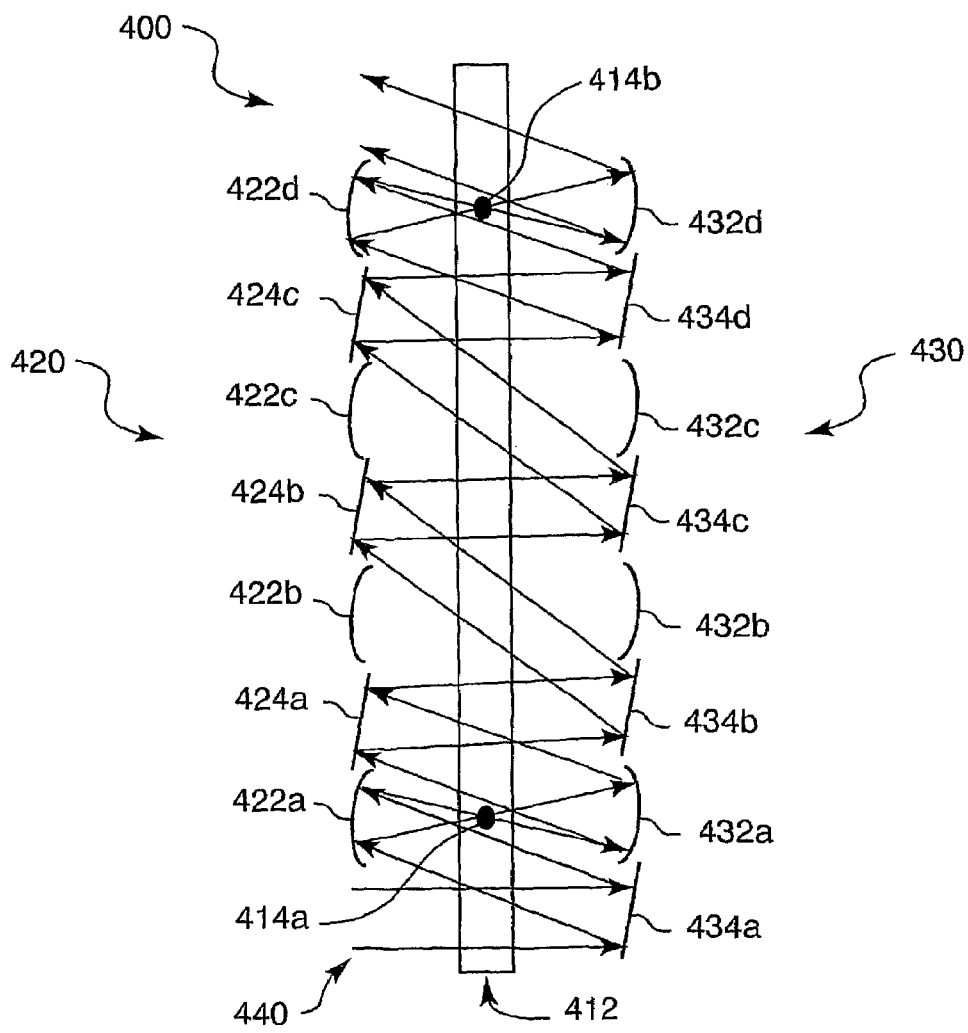

Another possibility is to physically move the mirrors to select (in a binary manner) particular locations to write during multiple passes through the photoreactive composition. An embodiment of this is shown in FIG. 3e, where stationary spherical focusing mirrors and movable planar mirrors are interlaced in a linear array configuration. In FIG. 3e, a multipass multiphoton absorption apparatus 400 includes a plurality of first optical elements 420, a plurality of second optical elements 430, and a photoreactive composition 412 located between the plurality of first optical elements 420 and the plurality of second optical elements 430. The plurality of first optical elements 420 includes spherical focusing mirrors 422a, 422b, 422c, and 422d, which alternate with planar mirrors 424a, 424b, and 424c. The plurality of second optical elements 430 includes spherical focusing mirrors 432a, 432b, 432c, and 432d, and planar mirrors 434a, 434b, 434c, and 434d. The planar mirrors can be moved to steer a collimated light beam either to a concave mirror, which then focuses the beam into the photoreactive composition 412, or to the next planar mirror, effectively skipping one of the focal points.

For example, planar mirror 434a reflects light beam 440 to spherical focusing mirror 422a, and planar mirror 434d reflects the light beam 440 to spherical focusing mirror 422d. Alternatively, planar mirror 434a can be tilted to reflect beam 440 to planar mirror 424a, which in turn reflects the beam 440 to planar mirror 434b, by-passing spherical focusing mirror 422a. The mirror arrangement shown in FIG. 3e is configured to write one spot at a first focal point 414a, leave two regions of unreacted (e.g., uncured) material, and to write another spot at a second focal point 414b. Micro-electromechanical systems such as the digital micromirror device arrays produced by Texas Instruments may be useful in constructing this configuration.

As the beam undergoes multiple passes through the multiphoton reactive (i.e., photoreactive) composition of the present invention, its intensity will be slowly reduced by losses from a variety of sources, e.g., scattering from material imperfections, and diffractive losses from small mirrors and lenses. This leads to a lower dose of light in the last writing spots than in the first passes. This defect may be overcome by placing a mirror or retroreflector at the end of the array that directs the beam precisely back along the path it just traveled. This will reduce the variation in dose. Once the loss per pass is known precisely, the reflector can be positioned so as to make the dose per pass as constant as possible. Dispersion compensating elements may also be added to recompress the light pulse.

Also of concern are imaging aberrations that can be propagated through the system. Like spherical lenses, spherical mirrors are prone to off-axis aberrations and are best used for beams striking the mirror close to normal. Aspherical surfaces may be preferable in off-axis focusing situations such as shown in FIGS. 3a–3e.

In a multiple pass system such as those described in FIGS. 3a–3e, considerable attention is given to both the reflectance of the mirrors and the pulse dispersion as these may contribute more to the loss of useful laser intensity than the material absorption.

The substrate for the photoreactive composition is preferably transparent at the laser wavelength and should also preferably exhibit minimal dispersion; however, expanding the system capabilities to include active focal length control of the focusing mirrors allows the use of a reflective substrate.

Figure 4:
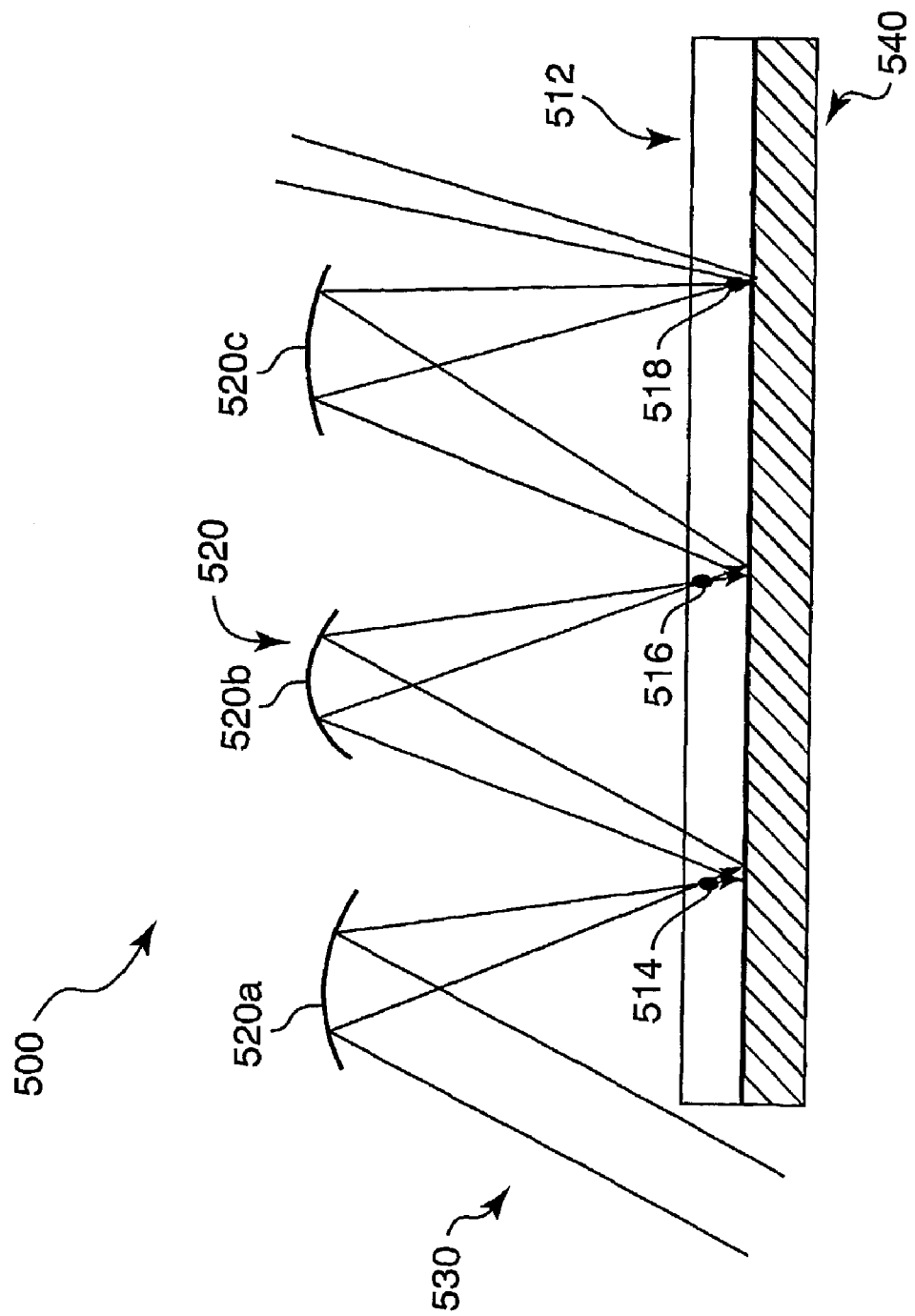
FIG. 4 illustrates an embodiment of a multipass multiphoton apparatus whereby active focal length control of the focusing mirrors is depicted.

FIG. 4 depicts an illustrative embodiment of the present invention whereby active focal length control of the focusing mirrors is depicted. As shown in FIG. 4, active focal length control is necessary to compensate for the difference in propagation distance before and after the focal point. This focal length control can be achieved by either adjusting the shape of the focusing mirror or by introducing a variable optical delay into portions of the beam path.

FIG. 4 depicts a multipass multiphoton absorption apparatus 500 that includes a plurality of optical elements 520, a light beam 530, a photoreactive composition 512, and a reflective substrate 540. The plurality of optical elements 520 includes spherical focusing mirrors 520a, 520b, and 520c.

As shown, beam 530 is reflected and focused by spherical focusing mirror 520a to a first focal point 514 within the photoreactive substrate 512. After focusing at first focal point 514, the beam 530 is reflected by the reflective substrate 540 toward the spherical focusing mirror 520b, where it is reflected back toward the substrate and refocused at a second focal point 516. As is depicted by FIG. 4, the spherical focusing mirror 520b is more curved than mirror 520a and thus has a shorter radius of curvature. This shorter radius of curvature causes the beam 530 to be refocused within the photoreactive composition 512 at second focal point 516 that is closer to the surface of the photoreactive composition 512 than first focal point 514.

After focusing at second reflective point 516, the beam 530 is again reflected by the reflective substrate 540 and directed toward spherical focusing mirror 520c. As depicted, mirror 520c has a slightly longer radius of curvature than mirrors 520a or 520b. This longer radius causes the beam 530 to be reflected and then refocused at a third focal point 518 that is closer to the reflective substrate 540 than either the first focal point 514 or second focal point 516. By changing the radius of curvature of the plurality of optical elements 520, varying patterns can be formed within the photoreactive composition 512.

Photoreactive compositions useful in the present invention include at least one reactive species, at least one multiphoton photosensitizer, optionally at least one electron donor compound, and optionally at least one photoinitiator for the photoreactive composition.

Reactive Species

Reactive species suitable for use in the photoreactive compositions include both curable and non-curable species. Curable species are generally preferred and include, for example, addition-polymerizable monomers and oligomers and addition-crosslinkable polymers (such as free-radically polymerizable or crosslinkable ethylenically-unsaturated species including, for example, acrylates, methacrylates, and certain vinyl compounds such as styrenes), as well as cationically-polymerizable monomers and oligomers and cationically-crosslinkable polymers (including, for example, epoxies, vinyl ethers, cyanate esters, etc.), and the like, and mixtures thereof.

Suitable ethylenically-unsaturated species are described, for example, by Palazzotto et al. in U.S. Pat. No. 5,545,676 at column 1, line 65, through column 2, line 26, and include mono-, di-, and poly-acrylates and methacrylates (for example, methyl acrylate, methyl methacrylate, ethyl acrylate, isopropyl methacrylate, n-hexyl acrylate, stearyl acrylate, allyl acrylate, glycerol diacrylate, glycerol triacrylate, ethyleneglycol diacrylate, diethyleneglycol diacrylate, triethyleneglycol dimethacrylate, 1,3-propanediol diacrylate, 1,3-propanediol dimethacrylate, trimethylolpropane triacrylate, 1,2,4-butanetriol trimethacrylate, 1,4-cyclohexanediol diacrylate, pentaerythritol triacrylate, pentaerythritol tetraacrylate, pentaerythritol tetramethacrylate, sorbitol hexacrylate, bis[1-(2-acryloxy)]-p-ethoxyphenyldimethylmethane, bis[1-(3-acryloxy-2-hydroxy)]-p-propoxyphenyldimethylmethane, trishydroxyethyl-isocyanurate trimethacrylate, the bis-acrylates and bis-methacrylates of polyethylene glycols of molecular weight about 200–500, copolymerizable mixtures of acrylated monomers such as those of U.S. Pat. No. 4,652,274, and acrylated oligomers such as those of U.S. Pat. No. 4,642,126); unsaturated amides (for example, methylene bis-acrylamide, methylene bis-methacrylamide, 1,6-hexamethylene bis-acrylamide, diethylene triamine tris-acrylamide and beta-methacrylaminoethyl methacrylate); vinyl compounds (for example, styrene, diallyl phthalate, divinyl succinate, divinyl adipate, and divinyl phthalate); and the like; and mixtures thereof. Suitable reactive polymers include polymers with pendant (meth)acrylate groups, for example, having from 1 to about 50 (meth)acrylate groups per polymer chain. Examples of such polymers include aromatic acid (meth)acrylate half ester resins such as Sarbox™ resins available from Sartomer (for example, Sarbox™ 400, 401, 402, 404, and 405). Other useful reactive polymers curable by free radical chemistry include those polymers that have a hydrocarbyl backbone and pendant peptide groups with free-radically polymerizable functionality attached thereto, such as those described in U.S. Pat. No. 5,235,015 (Ali et al.). Mixtures of two or more monomers, oligomers, and/or reactive polymers can be used if desired. Preferred ethylenically-unsaturated species include acrylates, aromatic acid (meth)acrylate half ester resins, and polymers that have a hydrocarbyl backbone and pendant peptide groups with free-radically polymerizable functionality attached thereto.

Suitable cationically-reactive species are described, for example, by Oxman et al. in U.S. Pat. Nos. 5,998,495 and 6,025,406 and include epoxy resins. Such materials, broadly called epoxides, include monomeric epoxy compounds and epoxides of the polymeric type and can be aliphatic, alicyclic, aromatic, or heterocyclic. These materials generally have, on the average, at least 1 polymerizable epoxy group per molecule (preferably, at least about 1.5 and, more preferably, at least about 2). The polymeric epoxides include linear polymers having terminal epoxy groups (for example, a diglycidyl ether of a polyoxyalkylene glycol), polymers having skeletal oxirane units (for example, polybutadiene polyepoxide), and polymers having pendant epoxy groups (for example, a glycidyl methacrylate polymer or copolymer). The epoxides can be pure compounds or can be mixtures of compounds containing one, two, or more epoxy groups per molecule. These epoxy-containing materials can vary greatly in the nature of their backbone and substituent groups. For example, the backbone can be of any type and substituent groups thereon can be any group that does not substantially interfere with cationic cure at room temperature. Illustrative of permissible substituent groups include halogens, ester groups, ethers, sulfonate groups, siloxane groups, nitro groups, phosphate groups, and the like. The molecular weight of the epoxy-containing materials can vary from about 58 to about 100,000 or more.

Useful epoxy-containing materials include those which contain cyclohexene oxide groups such as epoxycyclohexanecarboxylates, typified by 3,4-epoxycyclohexylmethyl-3, 4-epoxycyclohexanecarboxylate, 3,4-epoxy-2-methylcyclohexylmethyl-3,4-epoxy-2-methylcyclohexane carboxylate, and bis(3,4-epoxy-6-methylcyclohexylmethyl) adipate. A more detailed list of useful epoxides of this nature is set forth in U.S. Pat. No. 3,117,099.

Other epoxy-containing materials that are useful include glycidyl ether monomers of the formula

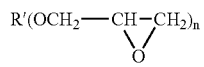

where R' is alkyl or aryl and n is an integer of 1 to 6. Examples are glycidyl ethers of polyhydric phenols obtained by reacting a polyhydric phenol with an excess of a chlorohydrin such as epichlorohydrin (for example, the diglycidyl ether of 2,2-bis-(2,3-epoxypropoxyphenol)-propane). Additional examples of epoxides of this type are described in U.S. Pat. No. 3,018,262, and in *Handbook of Epoxy Resins*, Lee and Neville, McGraw-Hill Book Co., New York (1967).

Numerous commercially available epoxy resins can also be utilized. In particular, epoxides that are readily available include octadecylene oxide, epichlorohydrin, styrene oxide, vinyl cyclohexene oxide, glycidol, glycidylmethacrylate, diglycidyl ethers of Bisphenol A (for example, those available under the trade designations Epon™ 828, Epon™ 825, Epon™ 1004, and Epon™ 1010 from Resolution Performance Products, formerly Shell Chemical Co., as well as DER™-331, DER™-332, and DER™-334 from Dow Chemical Co.), vinylcyclohexene dioxide (for example, ERL-4206 from Union Carbide Corp.), 3,4-epoxycyclohexylmethyl-3,4-epoxycyclohexene carboxylate (for example, ERL-4221 or Cyracure™ UVR 6110 or UVR 6105 from Union Carbide Corp.), 3,4-epoxy-6-methylcyclohexylmethyl-3,4-epoxy-6-methyl-cyclohexene carboxylate (for example, ERL-4201 from Union Carbide Corp.), bis(3,4-epoxy-6-methylcyclohexylmethyl) adipate (for example, ERL-4289 from Union Carbide Corp.), bis(2,3-epoxycyclopentyl)ether (for example, ERL-0400 from Union Carbide Corp.), aliphatic epoxy modified from polypropylene glycol (for example, ERL-4050 and ERL-4052 from Union Carbide Corp.), dipentene dioxide (for example, ERL-4269 from Union Carbide Corp.), epoxidized polybutadiene (for example, Oxiron™ 2001 from FMC Corp.), silicone resin containing epoxy functionality, flame retardant epoxy resins (for example, DER™-580, a brominated bisphenol type epoxy resin available from Dow Chemical Co.), 1,4-butanediol diglycidyl ether of phenolformaldehyde novolak (for example, DEN™-431 and DEN™-438 from Dow Chemical Co.), resorcinol diglycidyl ether (for example, Kopoxite™ from Koppers Company, Inc.), bis(3,4-epoxycyclohexyl) adipate (for example, ERL-4299 or UVR-6128, from Union Carbide Corp.), 2-(3,4-epoxycyclohexyl-5, 5-spiro-3,4-epoxy) cyclohexane-meta-dioxane (for example, ERL-4234 from Union Carbide Corp.), vinylcyclohexene monoxide 1,2-epoxyhexadecane (for example, UVR-6216 from Union Carbide Corp.), alkyl glycidyl ethers such as alkyl $C_8$–$C_{10}$ glycidyl ether (for example, Heloxy™ Modifier 7 from Resolution Performance Products), alkyl $C_{12}$–$C_{14}$ glycidyl ether (for example, Heloxy™ Modifier 8 from Resolution Performance Products), butyl glycidyl ether (for example, Heloxy™ Modifier 61 from Resolution Performance Products), cresyl glycidyl ether (for example, Heloxy™ Modifier 62 from Resolution Performance Products), p-tert-butylphenyl glycidyl ether (for example, Heloxy™ Modifier 65 from Resolution Performance Products), polyfunctional glycidyl ethers such as diglycidyl ether of 1,4-butanediol (for example, Heloxy™ Modifier 67 from Resolution Performance Products), diglycidyl ether of neopentyl glycol (for example, Heloxy™ Modifier 68 from Resolution Performance Products), diglycidyl ether of cyclohexanedimethanol (for example, Heloxy™ Modifier 107 from Resolution Performance Products), trimethylol ethane triglycidyl ether (for example, Heloxy™ Modifier 44 from Resolution Performance Products), trimethylol propane triglycidyl ether (for example, Heloxy™ Modifier 48 from Resolution Performance Products), polyglycidyl ether of an aliphatic polyol (for example, Heloxy™ Modifier 84 from Resolution Performance Products), polyglycol diepoxide (for example, Heloxy™ Modifier 32 from Resolution Performance Products), bisphenol F epoxides (for example, Epon™-1138 or GY-281 from Ciba-Geigy Corp.), and 9,9-bis[4-(2,3-epoxypropoxy)-phenyl]fluorenone (for example, Epon™ 1079 from Resolution Performance Products).

Other useful epoxy resins comprise copolymers of acrylic acid esters of glycidol (such as glycidylacrylate and glycidylmethacrylate) with one or more copolymerizable vinyl compounds. Examples of such copolymers are 1:1 styrene-glycidylmethacrylate, 1:1 methylmethacrylate-glycidylacrylate, and a 62.5:24:13.5 methylmethacrylate-ethyl acrylate-glycidylmethacrylate. Other useful epoxy resins are well known and contain such epoxides as epichlorohydrins, alkylene oxides (for example, propylene oxide), styrene oxide, alkenyl oxides (for example, butadiene oxide), and glycidyl esters (for example, ethyl glycidate).

Useful epoxy-functional polymers include epoxy-functional silicones such as those described in U.S. Pat. No. 4,279,717 (Eckberg), which are commercially available from the General Electric Company. These are polydimethylsiloxanes in which 1–20 mole % of the silicon atoms have been substituted with epoxyalkyl groups (preferably, epoxy cyclohexylethyl, as described in U.S. Pat. No. 5,753,346 (Kessel)).

Blends of various epoxy-containing materials can also be utilized. Such blends can comprise two or more weight average molecular weight distributions of epoxy-containing compounds (such as low molecular weight (below 200), intermediate molecular weight (about 200 to 10,000), and higher molecular weight (above about 10,000)). Alternatively or additionally, the epoxy resin can contain a blend of epoxy-containing materials having different chemical natures (such as aliphatic and aromatic) or functionalities (such as polar and non-polar). Other cationically-reactive polymers (such as vinyl ethers and the like) can additionally be incorporated, if desired.

Preferred epoxies include aromatic glycidyl epoxies (such as the Epon™ resins available from Resolution Performance Products) and cycloaliphatic epoxies (such as ERL-4221 and ERL-4299 available from Union Carbide).

Suitable cationally-reactive species also include vinyl ether monomers, oligomers, and reactive polymers (for example, methyl vinyl ether, ethyl vinyl ether, tert-butyl vinyl ether, isobutyl vinyl ether, triethyleneglycol divinyl ether (Rapi-Cure™ DVE-3, available from International Specialty Products, Wayne, N.J.), trimethylolpropane trivinyl ether (TMPTVE, available from BASF Corp., Mount Olive, N.J.), and the Vectomer™ divinyl ether resins from Allied Signal (for example, Vectomer™ 2010, Vectomer™ 2020, Vectomer™ 4010, and Vectomer™ 4020 and their equivalents available from other manufacturers)), and mixtures thereof. Blends (in any proportion) of one or more vinyl ether resins and/or one or more epoxy resins can also be utilized. Polyhydroxy-functional materials (such as those described, for example, in U.S. Pat. No. 5,856,373 (Kaisaki et al.)) can also be utilized in combination with epoxy- and/or vinyl ether-functional materials.

Non-curable species include, for example, reactive polymers whose solubility can be increased upon acid- or radical-induced reaction. Such reactive polymers include, for example, aqueous insoluble polymers bearing ester groups that can be converted by photogenerated acid to aqueous soluble acid groups (for example, poly(4-tert-butoxycarbonyloxystyrene). Non-curable species also include the chemically-amplified photoresists described by R. D. Allen, G. M. Wallraff, W. D. Hinsberg, and L. L. Simpson in "High Performance Acrylic Polymers for Chemically Amplified Photoresist Applications," *J. Vac. Sci. Technol. B*, 9, 3357 (1991). The chemically-amplified photoresist concept is now widely used for microchip manufacturing, especially with sub-0.5 micron (or even sub-0.2 micron) features. In such photoresist systems, catalytic species (typically hydrogen ions) can be generated by irradiation, which induces a cascade of chemical reactions. This cascade occurs when hydrogen ions initiate reactions that generate more hydrogen ions or other acidic species, thereby amplifying reaction rate. Examples of typical acid-catalyzed chemically-amplified photoresist systems include deprotection (for example, t-butoxycarbonyloxystyrene resists as described in U.S. Pat. No. 4,491,628, tetrahydropyran (THP) methacrylate-based materials, THP-phenolic materials such as those described in U.S. Pat. No. 3,779,778, t-butyl methacrylate-based materials such as those described by R. D Allen et al. in *Proc. SPIE*, 2438, 474 (1995), and the like); depolymerization (for example, polyphthalaldehyde-based materials); and rearrangement (for example, materials based on the pinacol rearrangements).

Useful non-curable species also include leuco dyes, which tend to be colorless until they are oxidized by acid generated by the multiphoton photoinitiator system, and which, once oxidized, exhibit a visible color. (Oxidized dyes are colored by virtue of their absorbance of light in the visible portion of the electromagnetic spectrum (approximately 400–700 nm).) Leuco dyes useful in the present invention are those that are reactive or oxidizable under moderate oxidizing conditions and yet that are not so reactive as to oxidize under common environmental conditions. There are many such chemical classes of leuco dyes known to the imaging chemist.

Leuco dyes useful as reactive species in the present invention include acrylated leuco azine, phenoxazine, and phenothiazine, which can, in part, be represented by the structural formula:

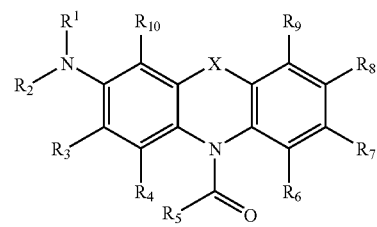

wherein X is selected from O, S, and —N—$R^{11}$, with S being preferred;

$R^1$ and $R^2$ are independently selected from H and alkyl groups of 1 to about 4 carbon atoms; $R^3$, $R^4$, $R^6$, and $R^7$ are independently selected from H and alkyl groups of 1 to about 4 carbon atoms, preferably methyl; $R^5$ is selected from alkyl groups of 1 to about 16 carbon atoms, alkoxy groups of 1 to about 16 carbon atoms, and aryl groups of up to about 16 carbon atoms; $R^8$ is selected from —N($R^1$)($R^2$), H, alkyl groups of 1 to about 4 carbon atoms, wherein $R^1$ and $R^2$ are independently selected and defined as above; $R^9$ and $R^{10}$ are independently selected from H and alkyl groups of 1 to about 4 carbon atoms;

and $R^{11}$ is selected from alkyl groups of 1 to about 4 carbon atoms and aryl groups of up to about 11 carbon atoms (preferably, phenyl groups). The following compounds are examples of this type of leuco dye:

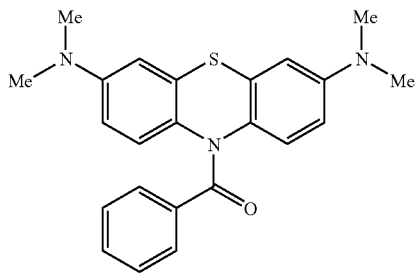

Copichem II

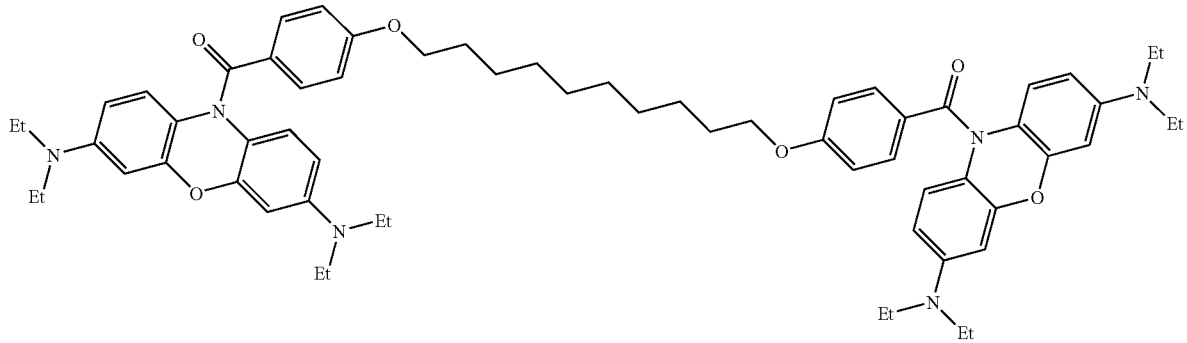

Other useful leuco dyes include, but are not limited to, Leuco Crystal Violet (4,4',4"-methylidynetris-(N,N-dimethylaniline)), Leuco Malachite Green (p,p'-benzylidenebis-(N,N-dimethylaniline)), Leuco Atacryl Orange-LGM (Color Index Basic Orange 21, Comp. No. 48035 (a Fischer's base type compound)) having the structure

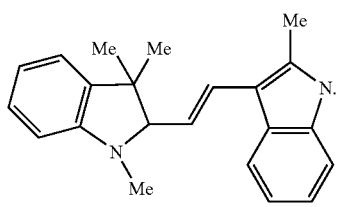

Leuco Atacryl Brilliant Red-4G (Color Index Basic Red 14) having the structure

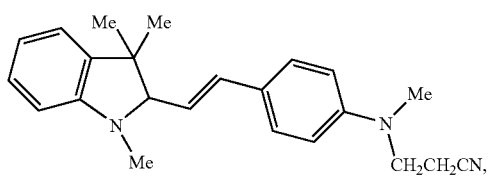

Leuco Atacryl Yellow-R (Color Index Basic Yellow 11, Comp. No. 48055) having the structure

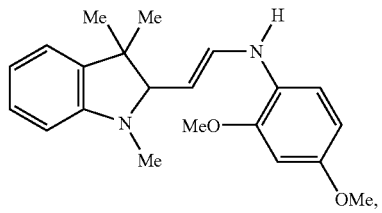

Leuco Ethyl Violet (4,4',4"-methylidynetris-(N,N-diethylaniline), Leuco Victoria Blu-BGO (Color Index Basic Blue 728a, Comp. No. 44040; 4,4'-methylidynebis-(N,N,-dimethylaniline)-4-(N-ethyl-1-napthalamine)), and LeucoAtlantic Fuchsine Crude (4,4',4"-methylidynetris-aniline).

The leuco dye(s) can generally be present at levels of at least about 0.01% by weight of the total weight of a light sensitive layer (preferably, at least about 0.3% by weight; more preferably, at least about 1% by weight; most preferably, at least about 2% to 10% or more by weight). Other materials such as binders, plasticizers, stabilizers, surfactants, antistatic agents, coating aids, lubricants, fillers, and the like can also be present in the light sensitive layer. One of skill in the art can readily determine the desirable amount of additives. For example, the amount of filler is chosen such that there is no undesirable scatter at the writing wavelength.

If desired, mixtures of different types of reactive species can be utilized in the photoreactive compositions. For example, mixtures of free-radically-reactive species and cationically-reactive species, mixtures of curable species and non-curable species, and so forth, are also useful.

Photoinitiator System (1) Multiphoton Photosensitizers

Multiphoton photosensitizers suitable for use in the multiphoton photoinitiator system of the photoreactive compositions are those that are capable of simultaneously absorbing at least two photons when exposed to sufficient light. Preferably, they have a two-photon absorption cross-section greater than that of fluorescein (that is, greater than that of 3', 6'-dihydroxyspiro[isobenzofuran-1(3H), 9'-[9H]xanthen] 3-one). Generally, the cross-section can be greater than about $50 \times 10^{-50}$ cm$^4$ sec/photon, as measured by the method described by C. Xu and W. W. Webb in *J. Opt. Soc. Am. B*, 13, 481 (1996) (which is referenced by Marder and Perry et al. in International Publication No. WO 98/21521 at page 85, lines 18–22).

This method involves the comparison (under identical excitation intensity and photosensitizer concentration conditions) of the two-photon fluorescence intensity of the photosensitizer with that of a reference compound. The reference compound can be selected to match as closely as possible the spectral range covered by the photosensitizer absorption and fluorescence. In one possible experimental set-up, an excitation beam can be split into two arms, with 50% of the excitation intensity going to the photosensitizer and 50% to the reference compound. The relative fluorescence intensity of the photosensitizer with respect to the reference compound can then be measured using two photomultiplier tubes or other calibrated detector. Finally, the fluorescence quantum efficiency of both compounds can be measured under one-photon excitation.

Methods of determining fluorescence and phosphorescence quantum yields are well-known in the art. Typically, the area under the fluorescence (or phosphorescence) spectrum of a compound of interest is compared with the area under the fluorescence (or phosphorescence) spectrum of a standard luminescent compound having a known fluorescence (or phosphorescence) quantum yield, and appropriate corrections are made (which take into account, for example, the optical density of the composition at the excitation wavelength, the geometry of the fluorescence detection apparatus, the differences in the emission wavelengths, and the response of the detector to different wavelengths). Standard methods are described, for example, by I. B. Berlman in *Handbook of Fluorescence Spectra of Aromatic Molecules*, Second Edition, pages 24–27, Academic Press, New York (1971); by J. N. Demas and G. A. Crosby in *J. Phys. Chem.*, 75, 991–1024(1971); and by J. V. Morris, M. A. Mahoney, and J. R. Huber in *J. Phys. Chem.*, 80, 969–974 (1976).

Assuming that the emitting state is the same under one- and two-photon excitation (a common assumption), the two-photon absorption cross-section of the photosensitizer ($\delta_{sam}$), is equal to $\delta_{ref} K (I_{sam}/I_{ref})(\phi_{sam}/\phi_{ref})$, wherein $\delta_{ref}$ is the two-photon absorption cross-section of the reference compound, $I_{sam}$ is the fluorescence intensity of the photosensitizer, $I_{ref}$ is the fluorescence intensity of the reference compound, $\phi_{sam}$ is the fluorescence quantum efficiency of the photosensitizer, $\phi_{ref}$ is the fluorescence quantum efficiency of the reference compound, and K is a correction factor to account for slight differences in the optical path and response of the two detectors. K can be determined by measuring the response with the same photosensitizer in both the sample and reference arms. To ensure a valid measurement, the clear quadratic dependence of the two-photon fluorescence intensity on excitation power can be confirmed, and relatively low concentrations of both the photosensitizer and the reference compound can be utilized (to avoid fluorescence reabsorption and photosensitizer aggregation effects).

When the photosensitizer is not fluorescent, the yield of electronic excited states can to be measured and compared with a known standard. In addition to the above-described method of determining fluorescence yield, various methods of measuring excited state yield are known (including, for example, transient absorbance, phosphorescence yield, photoproduct formation or disappearance of photosensitizer (from photoreaction), and the like).

Preferably, the two-photon absorption cross-section of the photosensitizer is greater than about 1.5 times that of fluorescein (or, alternatively, greater than about $75 \times 10^{-50}$ cm$^4$ sec/photon, as measured by the above method); more preferably, greater than about twice that of fluorescein (or, alternatively, greater than about $100 \times 10^{-50}$ cm$^4$ sec/photon); most preferably, greater than about three times that of fluorescein (or, alternatively, greater than about $150 \times 10^{-50}$ cm$^4$ sec/photon); and optimally, greater than about four times that of fluorescein (or, alternatively, greater than about $200 \times 10^{-50}$ cm$^4$ sec/photon).

Preferably, the photosensitizer is soluble in the reactive species (if the reactive species is liquid) or is compatible with the reactive species and with any binders (as described below) that are included in the composition. Most preferably, the photosensitizer is also capable of sensitizing 2-methyl-4,6-bis(trichloromethyl)-s-triazine under continuous irradiation in a wavelength range that overlaps the single photon absorption spectrum of the photosensitizer (single photon absorption conditions), using the test procedure described in U.S. Pat. No. 3,729,313. Using currently available materials, that test can be carried out as follows:

A standard test solution can be prepared having the following composition: 5.0 parts of a 5% (weight by volume) solution in methanol of 45,000–55,000 molecular weight, 9.0–13.0% hydroxyl content polyvinyl butyral (Butvar™ B76, Monsanto); 0.3 parts trimethylolpropane trimethacrylate; and 0.03 parts 2-methyl-4,6-bis(trichloromethyl)-s-triazine (see *Bull. Chem. Soc. Japan*, 42, 2924–2930 (1969)). To this solution can be added 0.01 parts of the compound to be tested as a photosensitizer. The resulting solution can then be knife-coated onto a 0.05 mm clear polyester film using a knife orifice of 0.05 mm, and the coating can be air dried for about 30 minutes. A 0.05 mm clear polyester cover film can be carefully placed over the dried but soft and tacky coating with minimum entrapment of air. The resulting sandwich construction can then be exposed for three minutes to 161,000 Lux of incident light from a tungsten light source providing light in both the visible and ultraviolet range (FCH™ 650 watt quartz-iodine lamp, General Electric). Exposure can be made through a stencil so as to provide exposed and unexposed areas in the construction. After exposure the cover film can be removed, and the coating can be treated with a finely divided colored powder, such as a color toner powder of the type conventionally used in xerography. If the tested compound is a photosensitizer, the trimethylolpropane trimethacrylate monomer will be polymerized in the light-exposed areas by the light-generated free radicals from the 2-methyl-4,6-bis (trichloromethyl)-s-triazine. Since the polymerized areas will be essentially tack-free, the colored powder will selectively adhere essentially only to the tacky, unexposed areas of the coating, providing a visual image corresponding to that in the stencil.

Preferably, a photosensitizer can also be selected based in part upon shelf stability considerations. Accordingly, selection of a particular photosensitizer can depend to some extent upon the particular reactive species utilized (as well as upon the choices of electron donor compound and/or photoinitiator).

Particularly preferred multiphoton photosensitizers include those exhibiting large multiphoton absorption cross-sections, such as Rhodamine B (that is, N-[9-(2-carboxyphenyl)-6-(diethylamino)-3H-xanthen-3-ylidene]-N-ethylethanaminium chloride, and the hexafluoroantimonate salt of Rhodamine B) and the four classes of photosensitizers described, for example, by Marder and Perry et al. in International Patent Publication Nos. WO 98/21521 and WO 99/53242. The four classes can be described as follows: (a) molecules in which two donors are connected to a conjugated π (pi)-electron bridge; (b) molecules in which two donors are connected to a conjugated π (pi)-electron bridge which is substituted with one or more electron accepting groups; (c) molecules in which two acceptors are connected to a conjugated π (pi)-electron bridge; and (d) molecules in which two acceptors are connected to a conjugated π (pi)-electron bridge which is substituted with one or more electron donating groups (where "bridge" means a molecular fragment that connects two or more chemical groups, "donor" means an atom or group of atoms with a low ionization potential that can be bonded to a conjugated π (pi)-electron bridge, and "acceptor" means an atom or group of atoms with a high electron affinity that can be bonded to a conjugated π (pi)-electron bridge).

Representative examples of such photosensitizers include:

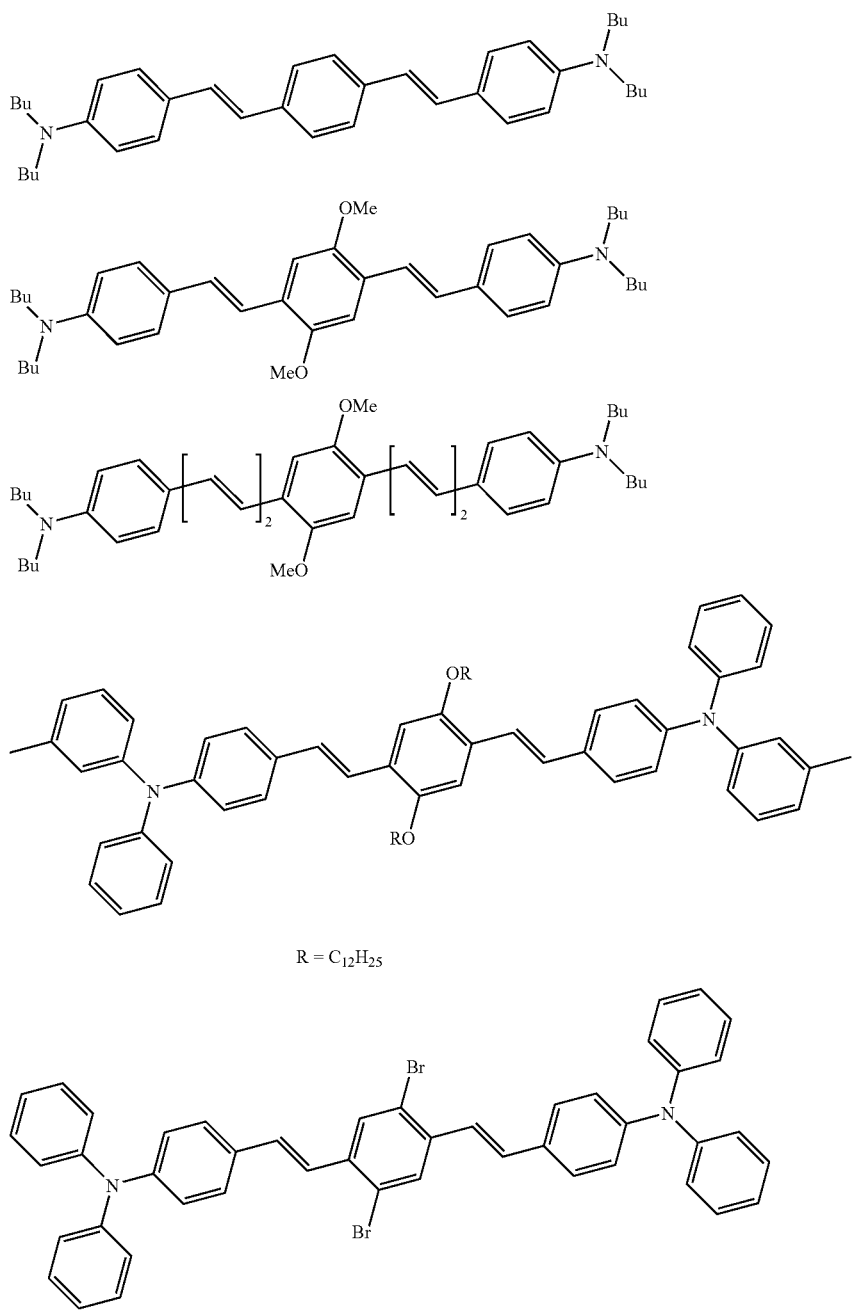

-continued
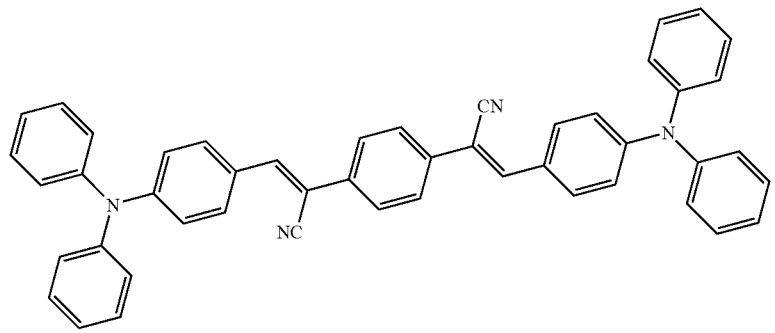
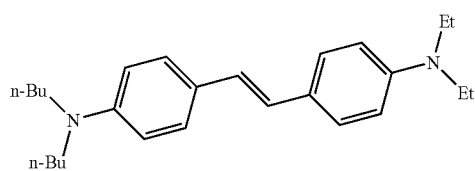
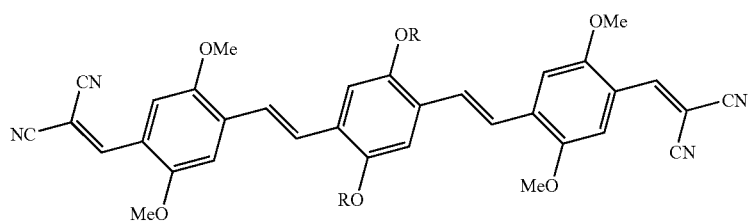
R = C₁₂H₂₅
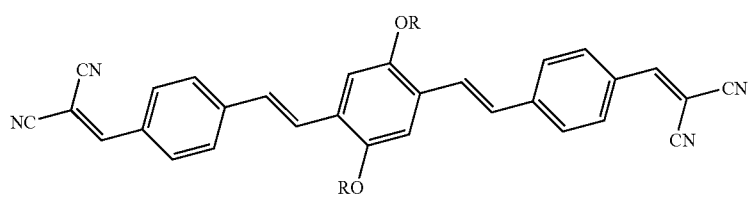
R = C₁₂H₂₅
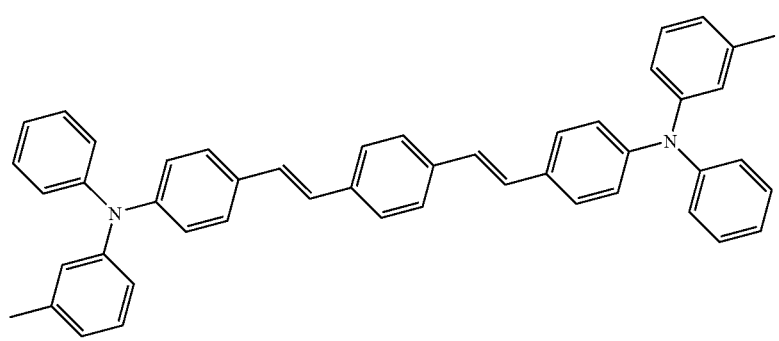
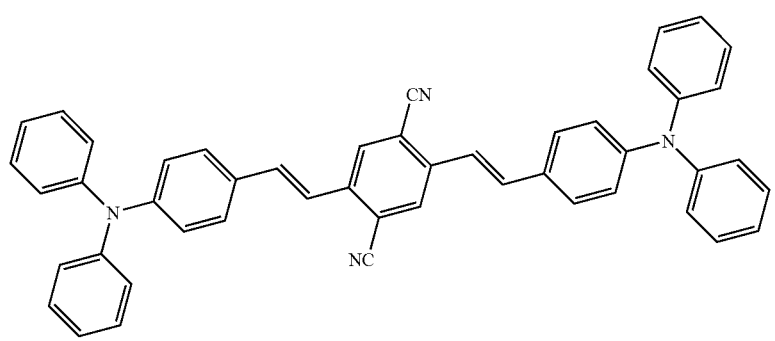

-continued
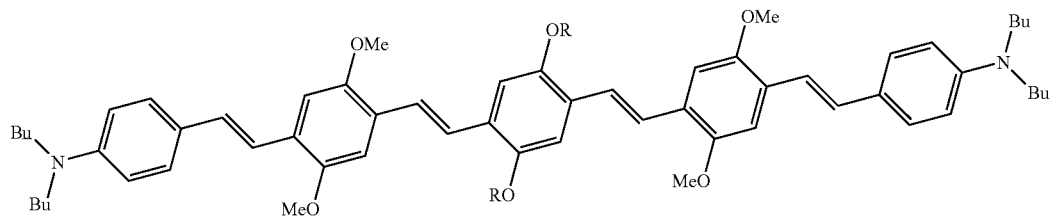
R = C₁₂H₂₅
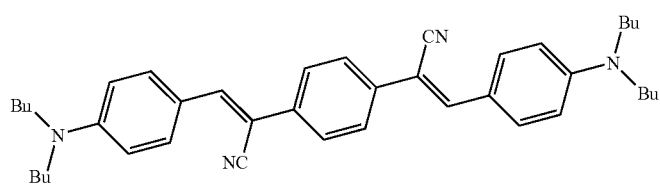
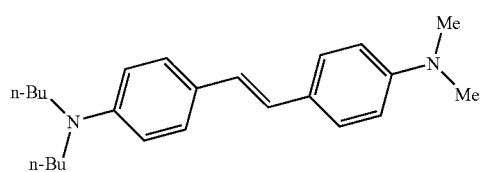
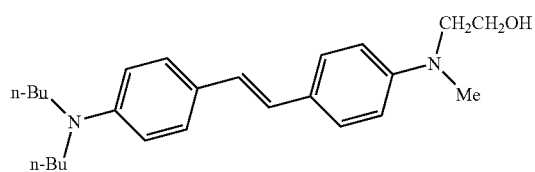
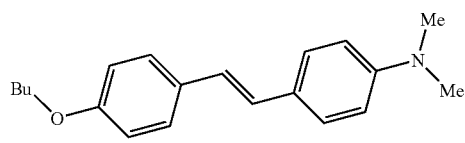
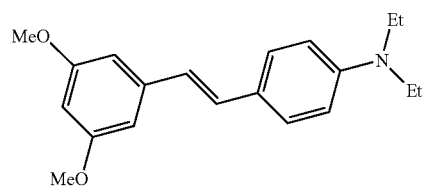
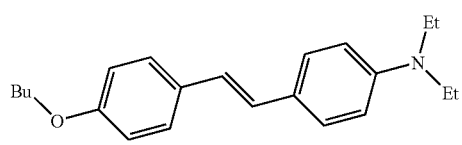
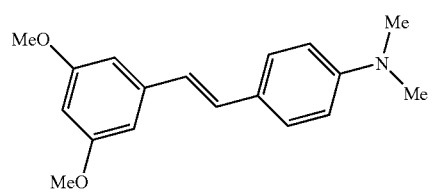
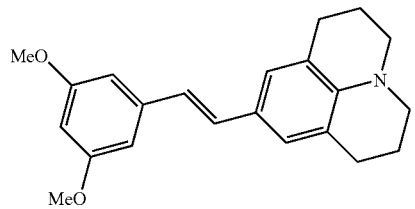
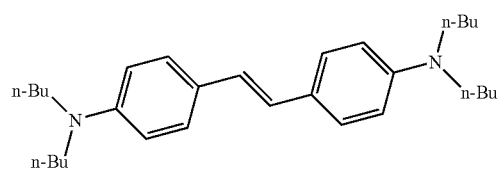
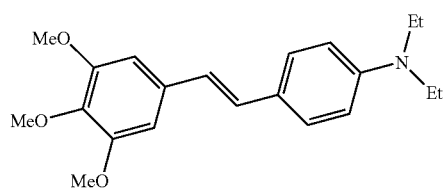
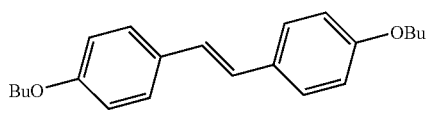
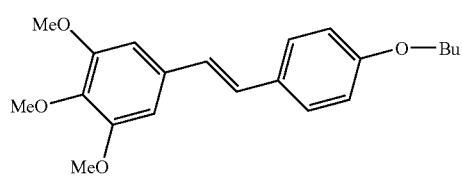
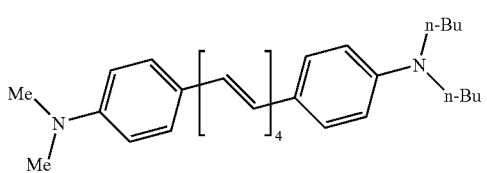

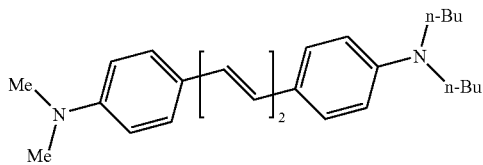
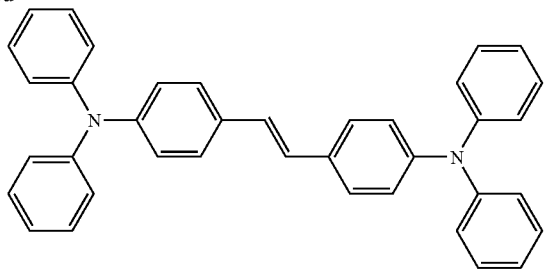
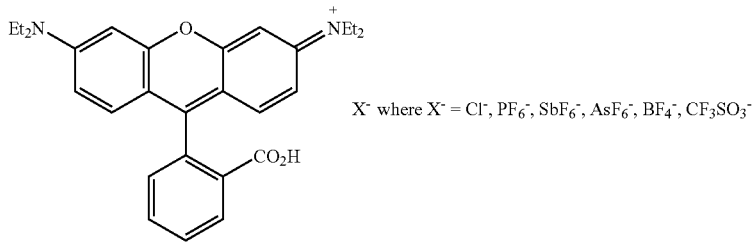

X⁻ where X⁻ = Cl⁻, $PF_6^-$, $SbF_6^-$, $AsF_6^-$, $BF_4^-$, $CF_3SO_3^-$

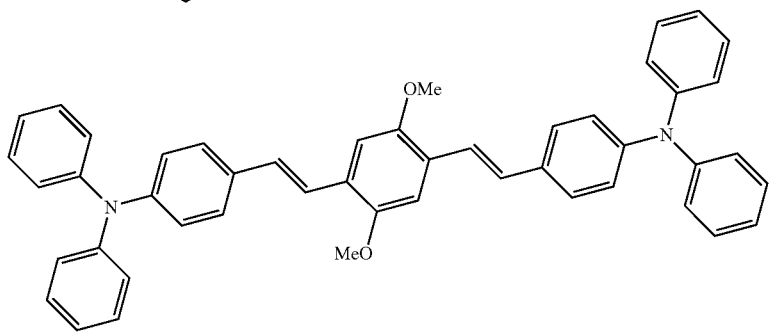

The four above-described classes of photosensitizers can be prepared by reacting aldehydes with ylides under standard Wittig conditions or by using the McMurray reaction, as detailed in International Patent Publication No. WO 98/21521.

Other compounds are described by Reinhardt et al. (for example, in U.S. Pat. Nos. 6,100,405, 5,859,251, and 5,770,737) as having large multiphoton absorption cross-sections, although these cross-sections were determined by a method other than that described above. Representative examples of such compounds include:

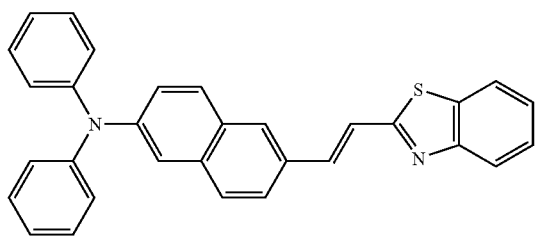
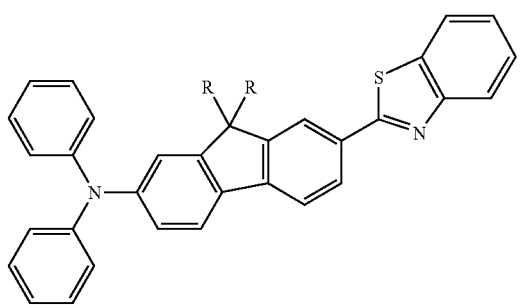

R = R = C2H5, C10H21, C18H37

-continued
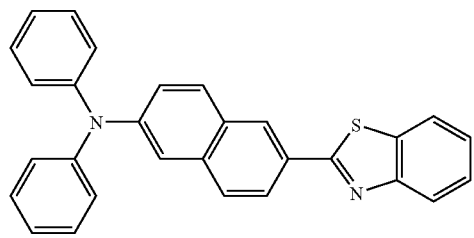
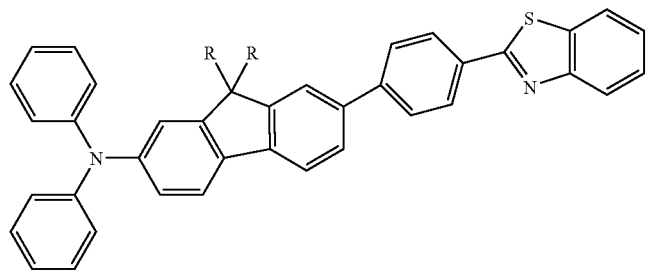
R = C₂H₅
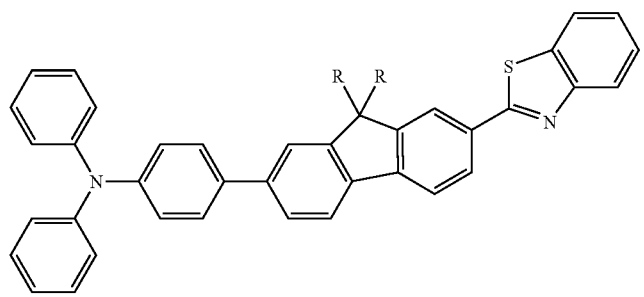
R = C₂H₅
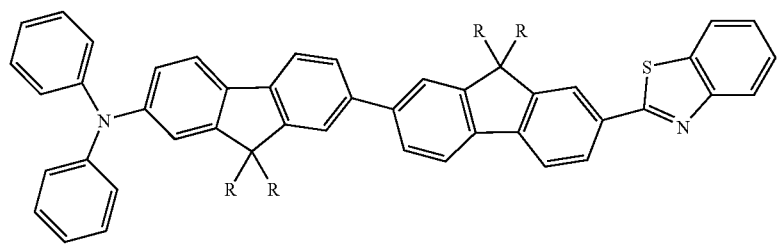
R = C₂H₅
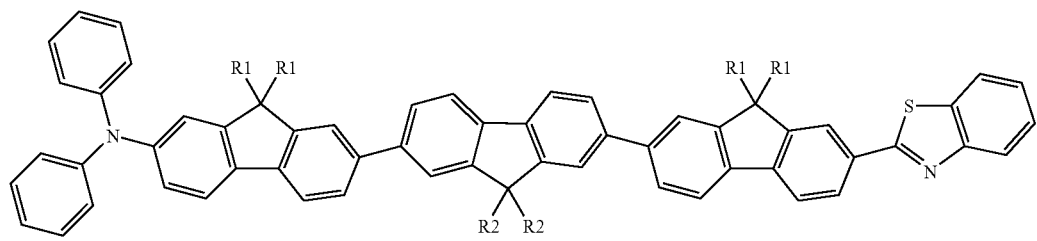
R1 = C₂H₅
R2 = C₁₀H₂₁

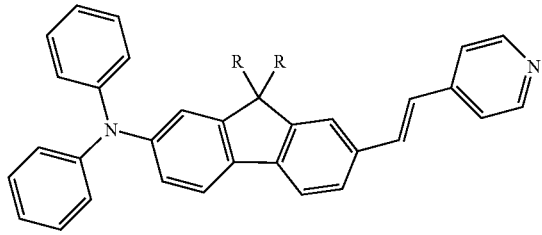

R = C₁₀H₂₁

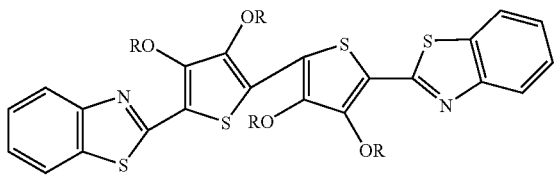

R = C₁₀H₂₁

Other compounds which may be useful as photosensitizers in the present invention include but are not limited to fluorescein, p-bis(o-methylstyryl)benzene, eosin, rose Bengal, erythrosin, Coumarin 307 (Eastman Kodak), Cascade Blue hydrazide trisodium salt, Lucifer Yellow CH ammonium salt, 4,4-difluoro-1,3,5,7,8-pentamethyl-4-bora-3α,4α-diazaindacene-2,6-disulfonic acid disodium salt, 1,1-dioctadecyl-3,3,3',3'-tetramethylindocarbocyanine perchlorate, Indo-1 pentapotassium salt (Molecular Probes), 5-dimethylaminonaphthalene-1-sulfonyl hydrazine, 4',6-diamidino-2-phenylindole dihydrochloride, 5,7-diiodo-3-butoxy-6-fluorone, 9-fluorenone-2-carboxylic acid, and compounds having the following structures:

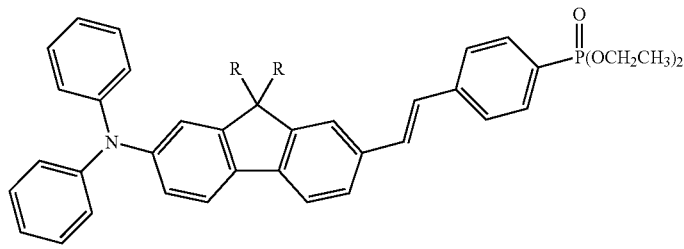

R = C₂H₅

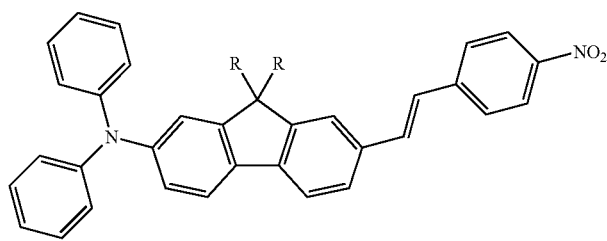

R = C₂H₅

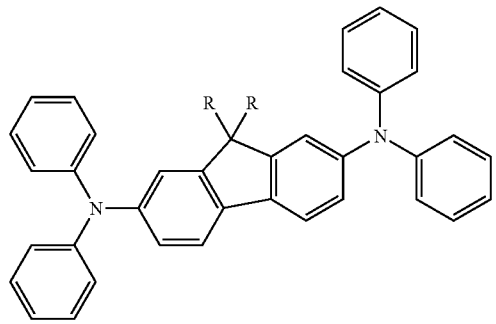

R = C₁₀H₂₁

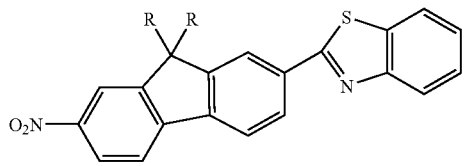

R = C₁₀H₂₁

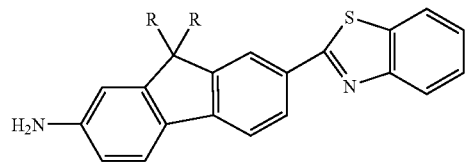

R = C₁₀H₂₁

-continued

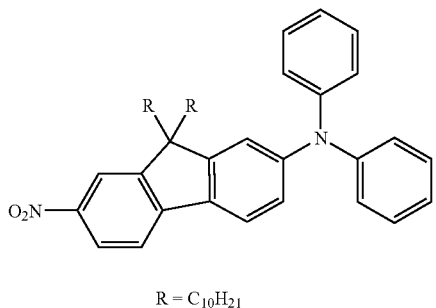

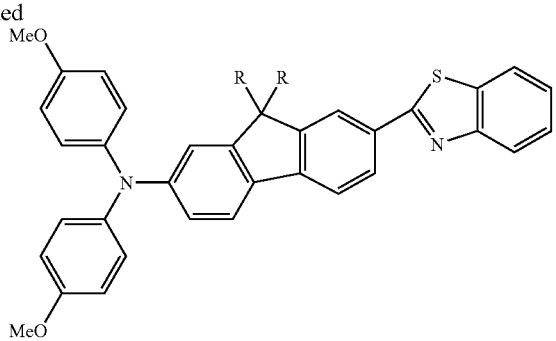

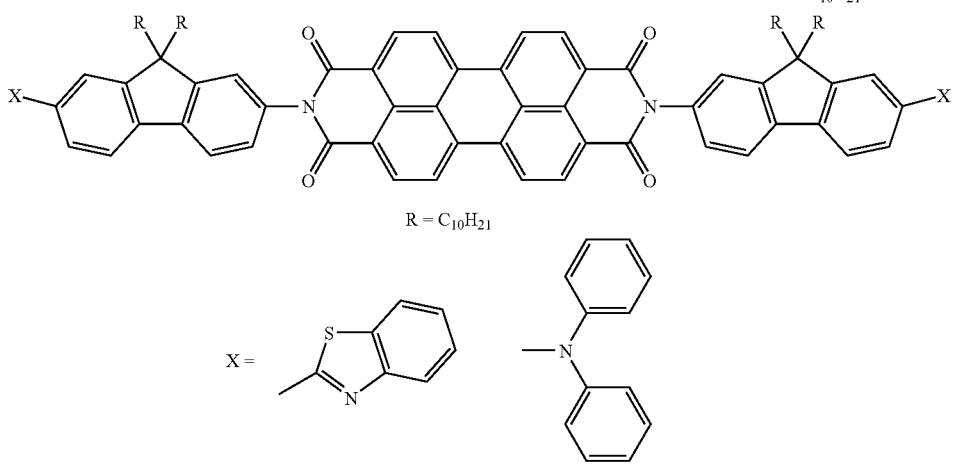

(2) Electron Donor Compounds

Electron donor compounds useful in the multiphoton photoinitiator system of the photoreactive compositions are those compounds (other than the photosensitizer itself) that are capable of donating an electron to an electronic excited state of the photosensitizer. The electron donor compounds preferably have an oxidation potential that is greater than zero and less than or equal to that of p-dimethoxybenzene vs. a standard saturated calomel electrode. Preferably, the oxidation potential is between about 0.3 and 1 volt vs. a standard saturated calomel electrode (SCE).

The electron donor compound is also preferably soluble in the reactive species and is selected based in part upon shelf stability considerations (as described above). Suitable donors are generally capable of increasing the speed of reaction (e.g., cure) or the image density of a photoreactive composition upon exposure to light of the desired wavelength.

When working with cationically-reactive species, those skilled in the art will recognize that the electron donor compound, if of significant basicity, can adversely affect the cationic reaction. (See, for example, the discussion in U.S. Pat. No. 6,025,406 (Oxman et al.) at column 7, line 62, through column 8, line 49.)

In general, electron donor compounds suitable for use with particular photosensitizers and photoinitiators can be selected by comparing the oxidation and reduction potentials of the three components (as described, for example, in U.S. Pat. No. 4,859,572 (Farid et al.)). Such potentials can be measured experimentally (for example, by the methods described by R. J. Cox, *Photographic Sensitivity*, Chapter 15, Academic Press (1973)) or can be obtained from references such as N. L. Weinburg, Ed., *Technique of Electroorganic Synthesis Part II Techniques of Chemistry*, Vol. V (1975), and C. K. Mann and K. K. Barnes, *Electrochemical Reactions in Nonaqueous Systems* (1970). The potentials reflect relative energy relationships and can be used in the following manner to guide electron donor compound selection.

When the photosensitizer is in an electronic excited state, an electron in the highest occupied molecular orbital (HOMO) of the photosensitizer has been lifted to a higher energy level (namely, the lowest unoccupied molecular orbital (LUMO) of the photosensitizer), and a vacancy is left behind in the molecular orbital it initially occupied. The photoinitiator can accept the electron from the higher energy orbital, and the electron donor compound can donate an electron to fill the vacancy in the originally occupied orbital, provided that certain relative energy relationships are satisfied.

If the reduction potential of the photoinitiator is less negative (or more positive) than that of the photosensitizer, an electron in the higher energy orbital of the photosensitizer is readily transferred from the photosensitizer to the lowest unoccupied molecular orbital (LUMO) of the photoinitiator, since this represents an exothermic process. Even if the process is instead slightly endothermic (that is, even if the reduction potential of the photosensitizer is up to 0.1 volt more negative than that of the photoinitiator) ambient thermal activation can readily overcome such a small barrier.

In an analogous manner, if the oxidation potential of the electron donor compound is less positive (or more negative)

than that of the photosensitizer, an electron moving from the HOMO of the electron donor compound to the orbital vacancy in the photosensitizer is moving from a higher to a lower potential, which again represents an exothermic process. Even if the process is slightly endothermic (that is, even if the oxidation potential of the photosensitizer is up to 0.1 volt more positive than that of the electron donor compound), ambient thermal activation can readily overcome such a small barrier.

Slightly endothermic reactions in which the reduction potential of the photosensitizer is up to 0.1 volt more negative than that of the photoinitiator, or the oxidation potential of the photosensitizer is up to 0.1 volt more positive than that of the electron donor compound, occur in every instance, regardless of whether the photoinitiator or the electron donor compound first reacts with the photosensitizer in its excited state. When the photoinitiator or the electron donor compound is reacting with the photosensitizer in its excited state, it is preferred that the reaction be exothermic or only slightly endothermic. When the photoinitiator or the electron donor compound is reacting with the photosensitizer ion radical, exothermic reactions are still preferred, but still more endothermic reactions can be expected in many instances to occur. Thus, the reduction potential of the photosensitizer can be up to 0.2 volt (or more) more negative than that of a second-to-react photoinitiator, or the oxidation potential of the photosensitizer can be up to 0.2 volt (or more) more positive than that of a second-to-react electron donor compound.

Suitable electron donor compounds include, for example, those described by D. F. Eaton in *Advances in Photochemistry*, edited by B. Voman et al., Volume 13, pp. 427–488, John Wiley and Sons, New York (1986); by Oxman et al. in U.S. Pat. No. 6,025,406 at column 7, lines 42–61; and by Palazzotto et al. in U.S. Pat. No. 5,545,676 at column 4, line 14 through column 5, line 18. Such electron donor compounds include amines (including triethanolamine, hydrazine, 1,4-diazabicyclo[2.2.2]octane, triphenylamine (and its triphenylphosphine and triphenylarsine analogs), aminoaldehydes, and aminosilanes), amides (including phosphoramides), ethers (including thioethers), ureas (including thioureas), sulfinic acids and their salts, salts of ferrocyanide, ascorbic acid and its salts, dithiocarbamic acid and its salts, salts of xanthates, salts of ethylene diamine tetraacetic acid, salts of (alkyl)$_n$(aryl)$_m$borates (n+m=4) (tetraalkylammonium salts preferred), various organometallic compounds such as $SnR_4$ compounds (where each R is independently chosen from among alkyl, aralkyl (particularly, benzyl), aryl, and alkaryl groups) (for example, such compounds as n-$C_3H_7Sn(CH_3)_3$, (allyl)$Sn(CH_3)_3$, and (benzyl)$Sn(n$-$C_3H_7)_3$), ferrocene, and the like, and mixtures thereof. The electron donor compound can be unsubstituted or can be substituted with one or more non-interfering substituents. Particularly preferred electron donor compounds contain an electron donor atom (such as a nitrogen, oxygen, phosphorus, or sulfur atom) and an abstractable hydrogen atom bonded to a carbon or silicon atom alpha to the electron donor atom.

Preferred amine electron donor compounds include alkyl-, aryl-, alkaryl- and aralkyl-amines (for example, methylamine, ethylamine, propylamine, butylamine, triethanolamine, amylamine, hexylamine, 2,4-dimethylaniline, 2,3-dimethylaniline, o-, m- and p-toluidine, benzylamine, aminopyridine, N,N'-dimethylethylenediamine, N,N'-diethylethylenediamine, N,N'-dibenzylethylenediamine, N,N'-diethyl-1,3-propanediamine, N,N'-diethyl-2-butene-1,4-diamine, N,N'-dimethyl-1,6-hexanediamine, piperazine, 4,4'-trimethylenedipiperidine, 4,4'-ethylenedipiperidine, p-N,N-dimethyl-aminophenethanol and p-N,N-dimethylaminobenzonitrile); aminoaldehydes (for example, p-N,N-dimethylaminobenzaldehyde, p-N,N-diethylaminobenzaldehyde, 9-julolidine carboxaldehyde, and 4-morpholinobenzaldehyde); and aminosilanes (for example, trimethylsilylmorpholine, trimethylsilylpiperidine, bis(dimethylamino)diphenylsilane, tris(dimethylamino)methylsilane, N,N-diethylaminotrimethylsilane, tris(dimethylamino)phenylsilane, tris(methylsilyl)amine, tris(dimethylsilyl)amine, bis(dimethylsilyl)amine, N,N-bis(dimethylsilyl)aniline, N-phenyl-N-dimethylsilylaniline, and N,N-dimethyl-N-dimethylsilylamine); and mixtures thereof. Tertiary aromatic alkylamines, particularly those having at least one electron-withdrawing group on the aromatic ring, have been found to provide especially good shelf stability. Good shelf stability has also been obtained using amines that are solids at room temperature. Good photographic speed has been obtained using amines that contain one or more julolidinyl moieties.

Preferred amide electron donor compounds include N,N-dimethylacetamide, N,N-diethylacetamide, N-methyl-N-phenylacetamide, hexamethylphosphoramide, hexaethylphosphoramide, hexapropylphosphoramide, trimorpholinophosphine oxide, tripiperidinophosphine oxide, and mixtures thereof.

Preferred alkylarylborate salts include $Ar_3B^-(n\text{-}C_4H_9)N^+(C_2H_5)_4$
$Ar_3B^-(n\text{-}C_4H_9)N^+(CH_3)_4$
$Ar_3B^-(n\text{-}C_4H_9)N^+(n\text{-}C_4H_9)_4$
$Ar_3B^-(n\text{-}C_4H_9)Li^+$
$Ar_3B^{-(n\text{-}C}{}_4H_9)N^+(C_6H_{13})_4$
$Ar_3B^-\!\!-\!(C_4H_9)N^+(CH_3)_3(CH_2)_2CO_2(CH_2)_2CH_3$
$Ar_3B^-\!\!-\!(C_4H_9)N^+(CH_3)_3(CH_2)_2OCO(CH_2)_2CH_3$
$Ar_3B^-\text{-}(sec\text{-}C_4H_9)N^+(CH_3)_3(CH_2)_2CO_2(CH_2)_2CH_3$
$Ar_3B^-\text{-}(sec\text{-}C_4H_9)N^+(C_6H_{13})_4$
$Ar_3B^-\!\!-\!(C_4H_9)N^+(C_8H_{17})_4$
$Ar_3B^-\!\!-\!(C_4H_9)N^+(CH_3)_4$
$(p\text{-}CH_3O\!\!-\!\!C_6H_4)_3B^-(n\text{-}C_4H_9)N^+(n\text{-}C_4H_9)_4$
$Ar_3B^-\!\!-\!(C_4H_9)N^+(CH_3)_3(CH_2)_2OH$
$ArB^-(n\text{-}C_4H_9)_3N^+(CH_3)_4$
$ArB^-(C_2H_5)_3N^+(CH_3)_4$
$Ar_2B^-(n\text{-}C_4H_9)_2N^+(CH_3)_4$
$Ar_3B^-(C_4H_9)N^+(C_4H_9)_4$
$Ar_4B^-N^+(C_4H_9)_4$
$ArB^-(CH_3)_3N^+(CH_3)_4$
$(n\text{-}C_4H_9)_4B^-N^+(CH_3)_4$
$Ar_3B^-(C_4H_9)P^+(C_4H_9)_4$ (where Ar is phenyl, naphthyl, substituted (preferably, fluoro-substituted) phenyl, substituted naphthyl, and like groups having greater numbers of fused aromatic rings), as well as tetramethylammonium n-butyltriphenylborate and tetrabutylammonium n-hexyl-tris(3-fluorophenyl)borate (available as CGI 437 and CGI 746 from Ciba Specialty Chemicals Corporation), and mixtures thereof.

Suitable ether electron donor compounds include 4,4'-dimethoxybiphenyl, 1,2,4-trimethoxybenzene, 1,2,4,5-tetramethoxybenzene, and the like, and mixtures thereof. Suitable urea electron donor compounds include N,N'-dimethylurea, N,N-dimethylurea, N,N'-diphenylurea, tetramethylthiourea, tetraethylthiourea, tetra-n-butylthiourea, N,N-di-n-butylthiourea, N,N'-di-n-butylthiourea, N,N-diphenylthiourea, N,N'-diphenyl-N,N'-diethylthiourea, and the like, and mixtures thereof.

Preferred electron donor compounds for free radical-induced reactions include amines that contain one or more julolidinyl moieties, alkylarylborate salts, and salts of aromatic sulfinic acids. However, for such reactions, the electron donor compound can also be omitted, if desired (for example, to improve the shelf stability of the photoreactive composition or to modify resolution, contrast, and reciprocity). Preferred electron donor compounds for acid-induced reactions include 4-dimethylaminobenzoic acid, ethyl 4-dimethylaminobenzoate, 3-dimethylaminobenzoic acid, 4-dimethylaminobenzoin, 4-dimethylaminobenzaldehyde, 4-dimethylaminobenzonitrile, 4-dimethylaminophenethyl alcohol, and 1,2,4-trimethoxybenzene.

(3) Photoinitiators

Suitable photoinitiators for the reactive species of the photoreactive compositions are those that are capable of being photosensitized by accepting an electron from an electronic excited state of the multiphoton photosensitizer, resulting in the formation of at least one free radical and/or acid. Such photoinitiators include iodonium salts (for example, diaryliodonium salts), chloromethylated triazines (for example, 2-methyl-4,6-bis(trichloromethyl)-s-triazine, 2,4,6-tris(trichloromethyl)-s-triazine, and 2-aryl-4,6-bis(trichloromethyl)-s-triazine), diazonium salts (for example, phenyldiazonium salts optionally substituted with groups such as alkyl, alkoxy, halo, or nitro), sulfonium salts (for example, triarylsulfonium salts optionally substituted with alkyl or alkoxy groups, and optionally having 2,2' oxy groups bridging adjacent aryl moieties), azinium salts (for example, an N-alkoxypyridinium salt), and triarylimidazolyl dimers (preferably, 2,4,5-triphenylimidazolyl dimers such as 2,2',4,4',5,5'-tetraphenyl-1,1'-biimidazole, optionally substituted with groups such as alkyl, alkoxy, or halo), and the like, and mixtures thereof.

The photoinitiator is preferably soluble in the reactive species and is preferably shelf-stable (that is, does not spontaneously promote reaction of the reactive species when dissolved therein in the presence of the photosensitizer and the electron donor compound). Accordingly, selection of a particular photoinitiator can depend to some extent upon the particular reactive species, photosensitizer, and electron donor compound chosen, as described above. Preferred photoinitiators are those that exhibit large multiphoton adsorption cross-sections, as described, e.g., by Marder, Perry et al., in PCT Patent Applications WO 98/21521 and WO 995/3242, and by Goodman et al., in PCT Patent Application WO 99/54784.

Suitable iodonium salts include those described by Palazzotto et al. in U.S. Pat. No. 5,545,676 at column 2, lines 28 through 46. Suitable iodonium salts are also described in U.S. Pat. Nos. 3,729,313, 3,741,769, 3,808,006, 4,250,053 and 4,394,403. The iodonium salt can be a simple salt (for example, containing an anion such as Cl$^-$, Br$^-$, I$^-$ or C$_4$H$_5$SO$_3^-$) or a metal complex salt (for example, containing SbF$_6^-$, PF$_6^-$, BF$_4^-$, tetrakis(perfluorophenyl)borate, SbF$_5$OH$^-$ or AsF$_6^-$). Mixtures of iodonium salts can be used if desired.

Examples of useful aromatic iodonium complex salt photoinitiators include diphenyliodonium tetrafluoroborate; di(4-methylphenyl)iodonium tetrafluoroborate; phenyl-4-methylphenyliodonium tetrafluoroborate; di(4-heptylphenyl)iodonium tetrafluoroborate; di(3-nitrophenyl)iodonium hexafluorophosphate; di(4-chlorophenyl)iodonium hexafluorophosphate; di(naphthyl)iodonium tetrafluoroborate; di(4-trifluoromethylphenyl)iodonium tetrafluoroborate; diphenyliodonium hexafluorophosphate; di(4-methylphenyl)iodonium hexafluorophosphate; diphenyliodonium hexafluoroarsenate; di(4-phenoxyphenyl)iodonium tetrafluoroborate; phenyl-2-thienyliodonium hexafluorophosphate; 3,5-dimethylpyrazolyl-4-phenyliodonium hexafluorophosphate; diphenyliodonium hexafluoroantimonate; 2,2'-diphenyliodonium tetrafluoroborate; di(2,4-dichlorophenyl)iodonium hexafluorophosphate; di(4-bromophenyl)iodonium hexafluorophosphate; di(4-methoxyphenyl)iodonium hexafluorophosphate; di(3-carboxyphenyl)iodonium hexafluorophosphate; di(3-methoxycarbonylphenyl)iodonium hexafluorophosphate; di(3-methoxysulfonylphenyl)iodonium hexafluorophosphate; di(4-acetamidophenyl)iodonium hexafluorophosphate; di(2-benzothienyl)iodonium hexafluorophosphate; and diphenyliodonium hexafluoroantimonate; and the like; and mixtures thereof. Aromatic iodonium complex salts can be prepared by metathesis of corresponding aromatic iodonium simple salts (such as, for example, diphenyliodonium bisulfate) in accordance with the teachings of Beringer et al., J. Am. Chem. Soc. 81, 342 (1959).

Preferred iodonium salts include diphenyliodonium salts (such as diphenyliodonium chloride, diphenyliodonium hexafluorophosphate, and diphenyliodonium tetrafluoroborate), diaryliodonium hexafluoroantimonate (for example, SarCat™ SR 1012 available from Sartomer Company), and mixtures thereof.

Useful chloromethylated triazines include those described in U.S. Pat. No. 3,779,778 (Smith et al.) at column 8, lines 45–50, which include 2,4-bis(trichloromethyl)-6-methyl-s-triazine, 2,4,6-tris(trichloromethyl)-s-triazine, and the more preferred chromophore-substituted vinylhalomethyl-s-triazines disclosed in U.S. Pat. Nos. 3,987,037 and 3,954,475 (Bonham et al.).

Useful diazonium salts include those described in U.S. Pat. No. 4,394,433 (Gatzke), which comprise a light sensitive aromatic moiety (for example, pyrrolidine, morpholine, aniline, and diphenyl amine) with an external diazonium group (—N$^+$≡N) and an anion (for example, chloride, tri-isopropyl naphthalene sulfonate, tetrafluoroborate, and the bis(perfluoroalkylsulfonyl)methides) associated therewith. Examples of useful diazonium cations include 1-diazo-4-anilinobenzene, N-(4-diazo-2,4-dimethoxy phenyl)pyrrolidine, 1-diazo-2,4-diethoxy-4-morpholino benzene, 1-diazo-4-benzoyl amino-2,5-diethoxy benzene, 4-diazo-2,5-dibutoxy phenyl morpholino, 4-diazo-1-dimethyl aniline, 1-diazo-N,N-dimethylaniline, 1-diazo-4-N-methyl-N-hydroxyethyl aniline, and the like.

Useful sulfonium salts include those described in U.S. Pat. No. 4,250,053 (Smith) at column 1, line 66, through column 4, line 2, which can be represented by the formulas:

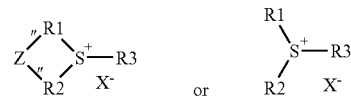

wherein R$_1$, R$_2$, and R$_3$ are each independently selected from aromatic groups having from about 4 to about 20 carbon atoms (for example, substituted or unsubstituted phenyl, naphthyl, thienyl, and furanyl, where substitution can be with such groups as alkoxy, alkylthio, arylthio, halogen, and so forth) and alkyl groups having from 1 to about 20 carbon atoms. As used here, the term "alkyl" includes substituted alkyl (for example, substituted with such groups as halogen, hydroxy, alkoxy, or aryl). At least one of R$_1$, R$_2$, and R$_3$ is aromatic, and, preferably, each is independently aromatic. Z is selected from the group consisting of a covalent bond, oxygen, sulfur, —S(=O)—, —C(=O)—, —(O=)S (=O)—, and —N(R)—, where R is aryl (of about 6 to about 20 carbons, such as phenyl), acyl (of about 2 to about 20 carbons, such as acetyl, benzoyl, and so forth), a carbon-to-carbon bond, or —($R_4$)C(—$R_5$)—, where $R_4$ and $R_5$ are independently selected from the group consisting of hydrogen, alkyl groups having from 1 to about 4 carbon atoms, and alkenyl groups having from about 2 to about 4 carbon atoms, and $X^-$ is as described below.

Suitable anions, $X^-$, for the sulfonium salts (and for any of the other types of photoinitiators) include a variety of anion types such as, for example, imide, methide, boron-centered, phosphorous-centered, antimony-centered, arsenic-centered, and aluminum-centered anions.

Illustrative, but not limiting, examples of suitable imide and methide anions include $(C_2F_5SO_2)_2N^-$, $(C_4F_9SO_2)_2N^-$, $(C_8F_{17}SO_2)_3C^-$, $(CF_3SO_2)_3C^-$, $(CF_3SO_2)_2N^-$, $(C_4F_9SO_2)_3C^-$, $(CF_3SO_2)_2(C_4F_9SO_2)C^-$, $(CF_3SO_2)(C_4F_9SO_2)N^-$, $((CF_3)_2NC_2F_4SO_2)_2N^-$, $(CF_3)_2NC_2F_4SO_2C-(SO_2CF_3)_2$, $(3,5$-bis$(CF_3)C_6H_3)SO_2N-SO_2CF_3$, $C_6H_5SO_2C-(SO_2CF_3)_2$, $C_6H_5SO_2N-SO_2CF_3$, and the like. Preferred anions of this type include those represented by the formula $(R_fSO_2)_3C^-$, wherein $R_f$ is a perfluoroalkyl radical having from 1 to about 4 carbon atoms.

Illustrative, but not limiting, examples of suitable boron-centered anions include $F_4B^-$, $(3,5$-bis$(CF_3)C_6H_3)_4B^-$, $(C_6F_5)_4B^-$, (p-$CF_3C_6H_4)_4B^-$, (m-$CF_3C_6H_4)_4B^-$, (p-$FC_6H_4)_4B^-$, $(C_6F_5)_3(CH_3)B^-$, $(C_6F_5)_3(n-C_4H_9)B^-$, (p-$CH_3C_6H_4)_3(C_6F_5)B^-$, $(C_6F_5)_3FB^-$, $(C_6H_5)_3(C_6F_5)B^-$, $(CH_3)_2$(p-$CF_3C_6H_4)_2B^-$, $(C_6F_5)_3(n-C_{18}H_{37}O)B^-$, and the like. Preferred boron-centered anions generally contain 3 or more halogen-substituted aromatic hydrocarbon radicals attached to boron, with fluorine being the most preferred halogen. Illustrative, but not limiting, examples of the preferred anions include $(3,5$-bis$(CF_3)C_6H_3)_4B^-$, $(C_6F_5)_4B^-$, $(C_6F_5)_3(n-C_4H_9)B^-$, $(C_6F_5)_3FB^-$, and $(C_6F_5)_3(CH_3)B^-$.

Suitable anions containing other metal or metalloid centers include, for example, $(3,5$-bis$(CF_3)C_6H_3)_4Al^-$, $(C_6F_5)_4Al^-$, $(C_6F_5)_2F_4P^-$, $(C_6F_5)F_5P^-$, $F_6P^-$, $(C_6F_5)F_5Sb^-$, $F_6Sb^-$, $(HO)F_5Sb^-$, and $F_6As^-$. The foregoing lists are not intended to be exhaustive, as other useful boron-centered nonnucleophilic salts, as well as other useful anions containing other metals or metalloids, will be readily apparent (from the foregoing general formulas) to those skilled in the art.

Preferably, the anion, $X^-$, is selected from tetrafluoroborate, hexafluorophosphate, hexafluoroarsenate, hexafluoroantimonate, and hydroxypentafluoroantimonate (for example, for use with cationically-reactive species such as epoxy resins).

Examples of suitable sulfonium salt photoinitiators include:
triphenylsulfonium tetrafluoroborate
methyldiphenylsulfonium tetrafluoroborate
dimethylphenylsulfonium hexafluorophosphate
triphenylsulfonium hexafluorophosphate
triphenylsulfonium hexafluoroantimonate
diphenylnaphthylsulfonium hexafluoroarsenate
tritolysulfonium hexafluorophosphate
anisyldiphenylsulfonium hexafluoroantimonate
4-butoxyphenyldiphenylsulfonium tetrafluoroborate
4-chlorophenyldiphenylsulfonium hexafluorophosphate
tri(4-phenoxyphenyl)sulfonium hexafluorophosphate
di(4-ethoxyphenyl)methylsulfonium hexafluoroarsenate
4-acetonylphenyldiphenylsulfonium tetrafluoroborate
4-thiomethoxyphenyldiphenylsulfonium hexafluorophosphate
di(methoxysulfonylphenyl)methylsulfonium hexafluoroantimonate
di(nitrophenyl)phenylsulfonium hexafluoroantimonate
di(carbomethoxyphenyl)methylsulfonium hexafluorophosphate
4-acetamidophenyldiphenylsulfonium tetrafluoroborate
dimethylnaphthylsulfonium hexafluorophosphate
trifluoromethyldiphenylsulfonium tetrafluoroborate
p-(phenylthiophenyl)diphenylsulfonium hexafluoroantimonate
10-methylphenoxathiinium hexafluorophosphate
5-methylthianthrenium hexafluorophosphate
10-phenyl-9,9-dimethylthioxanthenium hexafluorophosphate
10-phenyl-9-oxothioxanthenium tetrafluoroborate
5-methyl-10-oxothianthrenium tetrafluoroborate
5-methyl-10,10-dioxothianthrenium hexafluorophosphate Preferred sulfonium salts include triaryl-substituted salts such as triarylsulfonium hexafluoroantimonate (for example, SarCat™ SR1010 available from Sartomer Company), triarylsulfonium hexafluorophosphate (for example, SarCat™ SR 1011 available from Sartomer Company), and triarylsulfonium hexafluoroantimonate (for example, SarCat™ K185 available from Sartomer Company).

Useful azinium salts include those described in U.S. Pat. No. 4,859,572 (Farid et al.) at column 8, line 51, through column 9, line 46, which include an azinium moiety, such as a pyridinium, diazinium, or triazinium moiety. The azinium moiety can include one or more aromatic rings, typically carbocyclic aromatic rings (for example, quinolinium, isoquinolinium, benzodiazinium, and naphthodiazonium moieties), fused with an azinium ring. A quaternizing substituent of a nitrogen atom in the azinium ring can be released as a free radical upon electron transfer from the electronic excited state of the photosensitizer to the azinium photoinitiator. In one preferred form, the quaternizing substituent is an oxy substituent. The oxy substituent, —O-T, which quaternizes a ring nitrogen atom of the azinium moiety can be selected from among a variety of synthetically convenient oxy substituents. The moiety T can, for example, be an alkyl radical, such as methyl, ethyl, butyl, and so forth. The alkyl radical can be substituted. For example, aralkyl (for example, benzyl and phenethyl) and sulfoalkyl (for example, sulfomethyl) radicals can be useful. In another form, T can be an acyl radical, such as an —OC(O)-$T^1$ radical, where $T^1$ can be any of the various alkyl and aralkyl radicals described above. In addition, $T^1$ can be an aryl radical, such as phenyl or naphthyl. The aryl radical can in turn be substituted. For example, $T^1$ can be a tolyl or xylyl radical. T typically contains from 1 to about 18 carbon atoms, with alkyl moieties in each instance above preferably being lower alkyl moieties and aryl moieties in each instance preferably containing about 6 to about 10 carbon atoms. Highest activity levels have been realized when the oxy substituent, —O-T, contains 1 or 2 carbon atoms. The azinium nuclei need include no substituent other than the quaternizing substituent. However, the presence of other substituents is not detrimental to the activity of these photoinitiators.

Useful triarylimidazolyl dimers include those described in U.S. Pat. No. 4,963,471 (Trout et al.) at column 8, lines 18–28. These dimers include, for example, 2-(o-chlorophenyl)-4,5-bis(m-methoxyphenyl)-1,1'-biimidazole; 2,2'-bis(o-chlorophenyl)-4,4',5,5'-tetraphenyl-1,1'-biimidazole; and 2,5-bis(o-chlorophenyl)-4-[3,4-dimethoxyphenyl]-1,1'-biimidazole.

Preferred photoinitiators include iodonium salts (more preferably, aryliodonium salts), chloromethylated triazines, triarylimidazolyl dimers (more preferably, 2,4,5-triphenylimidazolyl dimers), sulfonium salts, and diazonium salts. More preferred are aryliodonium salts, chloromethylated triazines, and the 2,4,5-triphenylimidazolyl dimers (with aryliodonium salts and the triazines being most preferred).

Preparation of Photoreactive Composition

The reactive species, multiphoton photosensitizers, electron donor compounds, and photoinitiators can be prepared by the methods described above or by other methods known in the art, and many are commercially available. These four components can be combined under "safe light" conditions using any order and manner of combination (optionally, with stirring or agitation), although it is sometimes preferable (from a shelf life and thermal stability standpoint) to add the photoinitiator last (and after any heating step that is optionally used to facilitate dissolution of other components). Solvent can be used, if desired, provided that the solvent is chosen so as to not react appreciably with the components of the composition. Suitable solvents include, for example, acetone, dichloromethane, and acetonitrile. The reactive species itself can also sometimes serve as a solvent for the other components.

The components of the photoinitiator system are present in photochemically effective amounts (as defined above). Generally, the composition contains at least about 5%, preferably at least about 10%, and more preferably, at least about 20%, by weight of one or more reactive species. Generally, the composition contains up to about 99.79%, preferably up to about 95%, and more preferably up to about 80%, by weight of one or more reactive species. Generally, the composition contains at least about 0.01%, preferably at least about 0.1%, more preferably, at least about 0.2%, by weight of one or more photosensitizers. Generally, the composition contains up to about 10%, preferably up to about 5%, and more preferably up to about 2%, by weight of one or more photosensitizers. Preferably, the composition contains at least about 0.1% by weight of one or more electron donors. Preferably, the composition contains up to about 10%, and preferably up to about 5%, by weight of one or more electron donors. Preferably, the composition contains at least about 0.1% by weight of one or more photoinitiators. Preferably, the composition contains up to about 10%, and preferably up to about 5%, by weight of one or more photoinitiators. When the reactive species is a leuco dye, the composition generally can contain at least about 0.01%, preferably at least about 0.3%, more preferably at least about 1%, and most preferably at least about 2%, by weight of one or more leuco dyes. When the reactive species is a leuco dye, the composition generally can contain up to about 10% by weight of one or more leuco dyes. These percentages are based on the total weight of solids, i.e., the total weight of components other than solvent.

A wide variety of adjuvants can be included in the photoreactive compositions, depending upon the desired end use. Suitable adjuvants include solvents, diluents, resins, binders, plasticizers, pigments, dyes, inorganic or organic reinforcing or extending fillers (at preferred amounts of about 10% to 90% by weight based on the total weight of the composition), thixotropic agents, indicators, inhibitors, stabilizers, ultraviolet absorbers, medicaments (for example, leachable fluorides), and the like. The amounts and types of such adjuvants and their manner of addition to the compositions will be familiar to those skilled in the art.

It is within the scope of this invention to include nonreactive polymeric binders in the compositions in order, for example, to control viscosity and to provide film-forming properties. Such polymeric binders can generally be chosen to be compatible with the reactive species. For example, polymeric binders that are soluble in the same solvent that is used for the reactive species, and that are free of functional groups that can adversely affect the course of reaction of the reactive species, can be utilized. Binders can be of a molecular weight suitable to achieve desired film-forming properties and solution rheology (for example, molecular weights between about 5,000 and 1,000,000 daltons; preferably between about 10,000 and 500,000 daltons; more preferably, between about 15,000 and 250,000 daltons). Suitable polymeric binders include, for example, polystyrene, poly(methyl methacrylate), poly(styrene)-co-(acrylonitrile), cellulose acetate butyrate, and the like.

Prior to exposure, the resulting photoreactive compositions can be coated on a substrate, if desired, by any of a variety of coating methods known to those skilled in the art (including, for example, knife coating and spin coating). The substrate can be chosen from a wide variety of films, sheets, and other surfaces, depending upon the particular application and the method of exposure to be utilized. Preferred substrates are generally sufficiently flat to enable the preparation of a layer of photoreactive composition having a uniform thickness. For applications where coating is less desirable, the photoreactive compositions can alternatively be exposed in bulk form.

Exposure System and its Use

Useful exposure systems include at least one light source (usually a pulsed laser) and at least one optical element. Suitable light sources include, for example, femtosecond near-infrared titanium sapphire oscillators (for example, a Coherent Mira Optima 900-F) pumped by an argon ion laser (for example, a Coherent Innova). This laser, operating at 76 MHz, has a pulse width of less than 200 femtoseconds, is tunable between 700 and 980 nm, and has average power up to 1.4 Watts. However, in practice, any light source that provides sufficient intensity (to effect multiphoton absorption) at a wavelength appropriate for the photosensitizer (used in the photoreactive composition) can be utilized. Such wavelengths can generally be in the range of about 300 nm to about 1500 nm; preferably, from about 600 nm to about 1100 nm; more preferably, from about 750 nm to about 850 nm. Peak intensities can generally range from at least about $10^6$ W/cm$^2$. The upper limit on the pulse fluence (energy per pulse per unit area) is generally dictated by the ablation threshold of the photoreactive composition. For example, Q-switched Nd:YAG lasers (for example, a Spectra-Physics Quanta-Ray PRO), visible wavelength dye lasers (for example, a Spectra-Physics Sirah pumped by a Spectra-Physics Quanta-Ray PRO), and Q-switched diode pumped lasers (for example, a Spectra-Physics FCbar™) can also be utilized. Preferred light sources are near infrared-pulsed lasers having a pulse length less than about 10 nanoseconds (more preferably, less than about 1 nanosecond; most preferably, less than about 10 picoseconds). Other pulse lengths can be used as long as the peak intensity and fluence criteria given above are met.

Optical elements useful in carrying out the method of the invention include refractive optical elements (for example, lenses and prisms), reflective optical elements (for example, retroreflectors or focusing mirrors), diffractive optical elements (for example, gratings, phase masks, and holograms), diffusers, Pockels cells, wave-guides, wave plates, birefringent liquid crystals, and the like. Such optical elements are useful for focusing, beam delivery, beam/mode shaping, pulse shaping, and pulse timing. Generally, combinations of optical elements can be utilized, and other appropriate combinations will be recognized by those skilled in the art. It is often desirable to use optics with large numerical aperture to provide highly-focused light. However, any combination of optical elements that provides a desired intensity profile (and spatial placement thereof) can be utilized. For example, the exposure system can include a scanning confocal microscope (BioRad MRC600) equipped with a 0.75 NA objective (Zeiss 20× Fluar).

Generally, exposure of the photoreactive composition can be carried out using a light source (as described above) along with an optical system as a means for controlling the three-dimensional spatial distribution of light intensity within the composition. For example, the light from a pulsed laser can be passed through a focusing lens in a manner such that the focal point is within the volume of the composition. The focal point can be scanned or translated in a three-dimensional pattern that corresponds to a desired shape, thereby creating the desired shape. The exposed or illuminated volume of the composition can be scanned either by moving the composition itself or by moving the light source (for example, moving a laser beam using galvo-mirrors).

If the light induces, for example, a reaction of the reactive species that produces a material having solubility characteristics different from those of the reactive species, the resulting image can optionally be developed by removing either the exposed or the unexposed regions through use of an appropriate solvent, for example, or by other art-known means. Complex, three-dimensional objects can be prepared in this manner.

Exposure times generally depend upon the type of exposure system used to cause image formation (and its accompanying variables such as numerical aperture, geometry of light intensity spatial distribution, the peak light intensity during the laser pulse (higher intensity and shorter pulse duration roughly correspond to peak light intensity)), as well as upon the nature of the composition exposed (and its concentrations of photosensitizer, photoinitiator, and electron donor compound). Generally, higher peak light intensity in the regions of focus allows shorter exposure times, everything else being equal. Linear imaging or "writing" speeds generally can be about 5 to 100,000 microns/second using a laser pulse duration of about $10^{-8}$ to $10^{-15}$ seconds (preferably, about $10^{-11}$ to $10^{-14}$ second) and about $10^2$ to $10^9$ pulses per second (preferably, about $10^3$ to $10^8$ pulses per second).

EXAMPLES

Objects and advantages of this invention are further illustrated by the following examples, but the particular materials and amounts thereof recited in these examples, as well as other conditions and details, should not be construed to unduly limit this invention. These examples discuss the use of optical elements to recycle unabsorbed light used in a multiphoton absorption process back into the focal region to increase the conversion efficiency of the incident light during, e.g., a photopolymerization process.

Unless otherwise noted, chemicals used in the examples were commercially available from Aldrich Chemical Co., Milwaukee, Wis. Tris(2-hydroxyethylene)isocyanurate triacrylate, 2-phenoxyethyl acrylate, and trimethylolpropane triacrylate were commercially available from Sartomer Co., West Chester, Pa. under the tradenames SR-368, SR339, and SR-351 respectively. SR-9008 is an alkoxylated trifunctional acrylate commercially available from Sartomer Co., West Chester, Pa.

The aromatic iodonium complex salts such as diphenyliodonium hexafluorophosphate may be prepared by metathesis of corresponding aromatic iodonium simple salts (such as, for example, diphenyliodonium bisulfate) in accordance with the teachings of Beringer et al., *J. Am. Chem. Soc.*, 81, 342 (1959). Thus, for example, the complex salt diphenyliodonium tetrafluoroborate was prepared by the addition at 60° C. of an aqueous solution containing 29.2 grams (g) silver fluoroborate, 2 g fluoroboric acid, and 0.5 g phosphorous acid in about 30 milliliters (mL) of water to a solution of 44 g (139 millimoles) of diphenyliodonium chloride. The silver halide that precipitated was filtered off and the filtrate concentrated to yield diphenyliodonium fluoroborate, which may be purified by recrystallization.

The two-photon sensitizing dye, bis-[4-(diphenylamino) styryl]-1,4-(dimethoxy)benzene was prepared as follows: (1) Reaction of 1,4-bis-bromomethyl-2,5-dimethoxybenzene with triethyl phosphite (Horner Eamons reagent): 1,4-bis-bromomethyl-2,5-dimethoxybenzene was prepared according to the literature procedure (Syper et. al., *Tetrahedron*, 1983, 39, 781–792). 1,4-bis-bromomethyl-2,5-dimethoxybenzene (253 g, 0.78 mol) was placed into a 1000-mL round bottom flask. Triethyl phosphite (300 g, 2.10 mol) was added. The reaction was heated to vigorous reflux with stirring for 48 hours under nitrogen atmosphere. The reaction mixture was cooled and the excess $P(OEt)_3$ was removed under vacuum using a Kugelrohr apparatus. The desired product was not actually distilled, but the Kugelrohr was used to remove the excess $P(OEt)_3$ by distilling it away from the product. Upon heating to 100° C. at 0.1 millimeter (mm) Hg, a clear oil resulted. Upon cooling the desired product solidified. The product was suitable for use directly in the next step, and $^1$H NMR was consistent with the proposed structure. Recrystallization from toluene yielded colorless needles and resulted in a purer product, but this was not necessary for subsequent steps in most cases.

(2) Synthesis of Bis-[4-(diphenylamino)stryl]-1,4-(dimethoxy)benzene: A 1000-mL round bottom flask was fitted with a calibrated dropping funnel and a magnetic stirrer. The flask was charged with the product from the above synthesis (a Homer Eamons reagent) (19.8 g, 45.2 mol), and it was also charged with N,N-diphenylamino-p-benzaldehyde (Fluka, 25 g, 91.5 mmol). The flask was flushed with nitrogen and sealed with septa. Anhydrous tetrahydrofuran (750 mL) was cannulated into the flask and all solids dissolved. The dropping funnel was charged with KOtBu (potassium t-butoxide) (125 mL, 1.0 M in THF). The solution in the flask was stirred and the KOtBu solution was added to the contents of the flask over the course of 30 minutes. The solution was then left to stir at ambient temperature overnight. The reaction was then quenched by the addition of $H_2O$ (500 mL). The reaction continued to stir and after about 30 minutes a highly fluorescent yellow solid had formed in the flask. The solid was isolated by filtration and air-dried. It was then recrystallized from toluene (450 mL). The desired product was obtained as fluorescent needles (24.7 g, 81% yield). 1H NMR was consistent with the proposed structure.

Example 1

This example describes the use of an array of curved reflective mirrors to recycle unabsorbed light used for reacting one or more monomers with two-photon initiators. The light source consists of a Nd:YAG microchip laser operating at a wavelength of 1.06 micrometer (μm), pulse width of 800 picoseconds (ps), pulse repetition rate of 12 kilohertz (kHz), and an average output power of 35 milliwatts (mW). The optical train consists of low dispersion turning mirrors and an optical attenuator to vary the optical power to the sample. After the attenuator, a beam expansion system enlarges the light from the laser to fill an imaging lens consisting of a 40×-microscope objective having a numerical aperture of 0.65. The focal length of this objective lens is 4.39 mm. With this optical system, the lens produces focal spots having a radius of approximately 2 μm. For these test substrates, reaction (e.g., photocuring) is accomplished by positioning the focal spot of the objective lens to coincide with the substrate/polymer interface. The test structures consist of continuously scanned lines that are 5 centimeters (cm) long with 0.5 cm spacing between lines, with all lines lying in the same plane. Each line is the result of a single pass of the energy from the laser.

The example substrates have two faces or sides. One face consists of an array of microreflectors having spherical focusing surfaces directing and focusing light at or near the second face of the substrate. The actual microreflectors in the microreflector array come from aluminizing glass or polymeric substrates that have spherical microlens arrays formed on one face of the substrate. The microreflector array is an aluminized microlens array with spherical focusing elements. The individual spherical lenslets, once aluminized, behave as spherical focusing microreflectors. For a spherical focusing element, the focal length is f=(1/2n)r, where n is the index of refraction for the medium between the reflector and its focus and r is the radius of curvature. In this example, the value of the radius of curvature yields a focal length equal to the thickness of the substrate. For the comparative analysis, half of the array is vacuum coated with aluminum and half is not.

A thin layer of a photoreactive composition having a 1% loading of a two-photon initiator covers the opposite face of the substrate. The photoreactive composition consists of 40% by weight tris(2-hydroxyethylene) isocyanurate triacrylate, 59% by weight methyl methacrylate (MMA), and 1% by weight two-photon absorber such as, for example, 1,4-bis(dodecyl)-2,5-bis(2,5-dimethoxy-4-(2,2-dicyanoethenyl)styryl)benzene, dissolved to 40% concentration in a dioxane solvent. This layer of photoreactive composition on the planar side of the substrate is approximately 100 μm thick.

Exposure of the photoreactive composition covered microreflector substrate occurs by continuously moving the sample beneath the highly focused light from the microscope objective. Lines are scanned across the mircroreflector substrate from the metallized to the unmetallized sections at a constant speed. A second comparative sample of the same photoreactive material coats a planar substrate and serves to establish the writing threshold. The writing threshold for this sample provides the baseline power level for the microreflector substrate. Writing powers bracketing the threshold expose the two-photon initiator loaded photoreactive composition covering the microreflector substrate.

Developing the reacted polymeric coating using a dioxane solvent removes the unreacted regions from the substrate, revealing photoreacted lines. The individual photoreacted lines have thicknesses of approximately 20 μm and widths of approximately 15 μm. Moreover, the photoreacted polymeric lines exhibit good adhesion to the polymeric substrate. At the writing threshold, photoreacted lines appear on both metallized and unmetallized portions of the microreflector substrate. Below the writing threshold, photoreacted lines appear only on the metallized portion of the microreflector substrate.

Example 2

Figure 5:
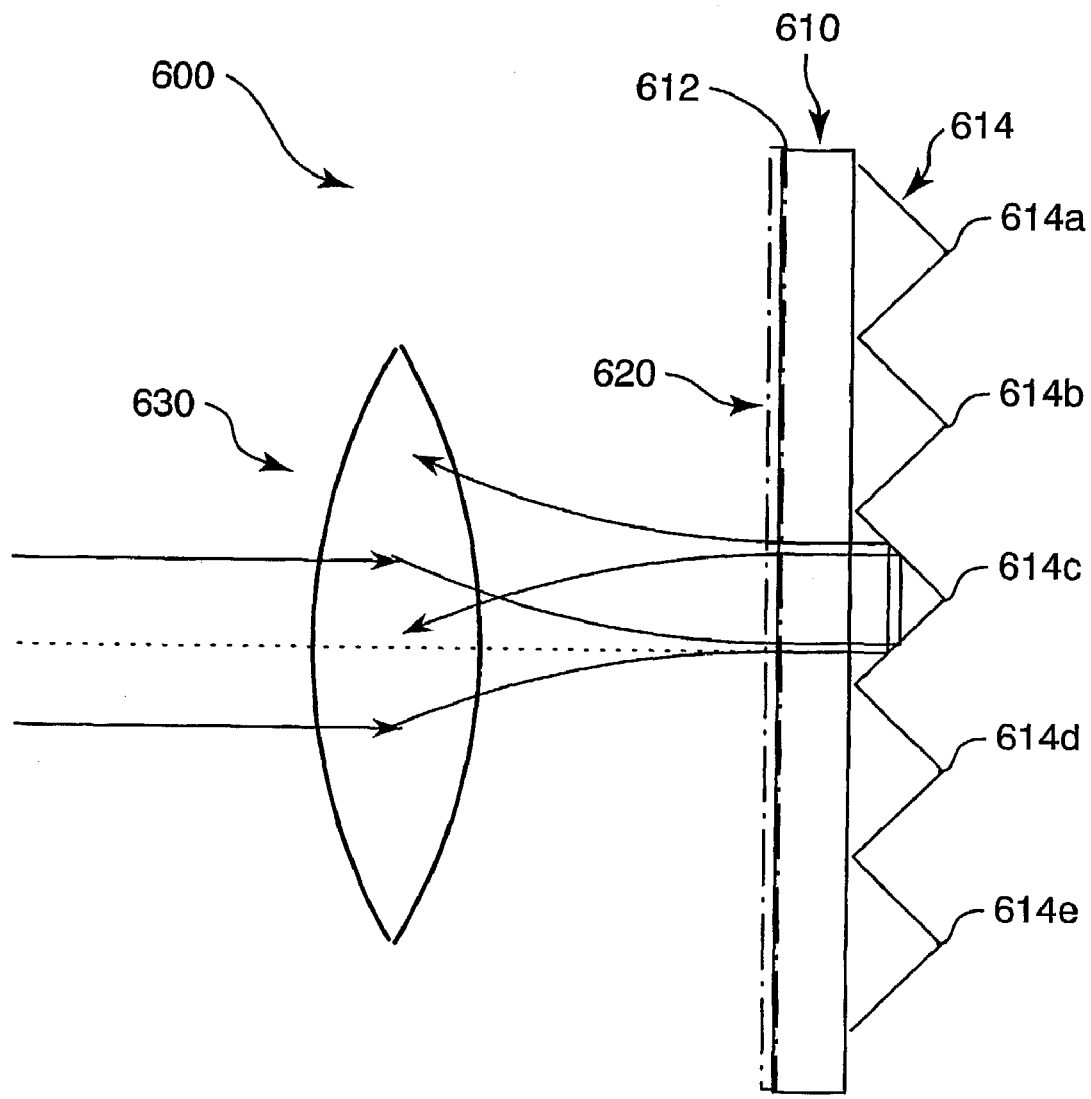
FIG. 5 illustrates a multipass multiphoton absorption apparatus used in Example 2.

As depicted in FIG. 5, a multipass multiphoton absorption apparatus 600 includes a test substrate 610 consisting of a polymeric film with two faces: a first face 612 and a second face 614. The first face 612 is planar while the second face 614 has a microreplicated array of retroreflective corner cubes 614a–614e. These retroreflective corner cube elements have edge lengths of 20 μm. On the planar face 612, a two-photon initiator loaded photoreactive composition 620 coats the surface 612. On the corner cube face 614, one half of the corner cubes are as fabricated and one half are filled with an acrylate polymer to effectively eliminate the retroreflective properties of the corner cubes.

The 2-photon writing light source (not shown) consists of a Nd:YAG microchip laser operating at a wavelength of 1.06 μm, pulse width of 800 ps, pulse repetition rate of 12 kHz, and an average output power of 35 mW. The optical train consists of turning mirrors and an optical attenuator to vary the optical power to the sample. After the attenuator, a beam expansion system enlarges the light from the laser to fill an imaging lens 630 consisting of a 40×-microscope objective having a numerical aperture of 0.65. The focal length of this objective lens 630 is 4.39 mm. With this optical system, the lens 630 produces focal points having a radius of approximately 2 μm. For these test substrates, reaction (e.g., photocuring) occurs by positioning the focal point of the objective lens 630 to coincide with the substrate/photoreactive composition interface. The test structures consist of continuously scanned lines that are 5 cm long with 0.5 cm spacing between lines, with all lines lying in the same plane. Each line is the result of a single pass of the energy from the laser.

A thin layer of a photoreactive composition 620 having a 1% loading of a two-photon initiator covers the opposite face 612 of the substrate 610. The photoreactive composition 620 consists of 40% by weight tris(2-hydroxyethylene) isocyanurate triacrylate, 59% by weight methyl methacrylate (MMA), and 1% by weight two-photon absorber dissolved to 40% concentration in a dioxane solvent. This layer of photoreactive composition 620 on the planar side 612 of the substrate 610 is approximately 100 μm thick.

Exposure of the photoreactive composition covered retroreflective substrate 610 occurs by continuously moving the sample beneath the highly focused light from the microscope objective. Lines are scanned at constant speed across the substrate 610 from the retroreflective to the nonretroreflective sections. A second comparative sample of the same photoreactive composition coats a planar substrate and serves to establish the writing threshold. The writing threshold for this sample provides the baseline power level for the retroreflective substrate. Writing powers bracketing the threshold expose the two-photon initiator loaded photoreactive composition covering the retroreflective substrate.

Developing the reacted coating in a dioxane solvent removes the unreacted regions from the sample substrate, revealing photoreacted lines. The individual photoreacted lines have thicknesses of approximately 20 μm and widths of approximately 15 μm. Moreover, the photoreacted polymeric lines have good adhesion to the polymeric substrate. At the writing threshold, photoreacted lines appear on both retroreflective regions and nonretroreflective portions of the substrate 610. Below the writing threshold, photoreacted lines appear only on the retroreflective portion of the sample substrate.

Example 3

This example describes the use of a reflective substrate to recycle unabsorbed light used for reacting one or monomers with two-photon initiators. The light source was a diode pumped Ti:sapphire laser (Spectra-Physics, Mountain View, Calif.) operating at a wavelength of 800 nanometers (nm), pulse width 100 femptoseconds (fs), pulse repetition rate of 80 megahertz (MHz), beam diameter of approximately 2 millimeters (mm), and an average output power of 860 milliwatts (mW). The optical train consisted of low dispersion turning mirrors, an optical attenuator to vary the optical power, and a 10×-microscope objective (0.25 NA) to focus the light into the sample. With this optical system, the lens produced focal spots having a diameter of approximately 8 μm and a depth of focus of approximately 120 μm. For these test substrates, reaction was accomplished by positioning the focal spot of the objective lens to coincide with the substrate/polymer interface. The test structures consisted of continuously scanned lines that were 0.5 to 5 cm long with 0.0625 cm spacing between the lines, with all lines lying in the same plane. Each line was the result of a single pass of energy from the laser. The average power delivered to the sample, measured where the beam exits the microscope objective using a calibrated photodiode (photodiode head PD300-3W, commercially available from Ophir Optronics Inc., Danvers, Mass.), was 20 mW in this example.

The sample substrates were 4-inch silicon wafer with a native oxide, where one half were vacuum coated with 1500 Å of aluminum to form a mirror-like coating. To promote polymer adhesion, a 2% solution of trimethoxysilylpropyl-methacrylate in aqueous ethanol (pH of approximately 4.5) was spun coated on the substrates, which were then baked in a 130° C. oven for 10 minutes (min). A thin layer of the photoreactive composition (see Table 1), 40% by weight of solids in dioxane (available from Mallinckrodt Baker, Phillipsburg, N.J.), was then spun coated over the entire wafer and baked in an 80° C. oven to remove the solvent. The final layer of photoreactive coating was approximately 20 μm thick.

TABLE 1

Photoreactive composition for Example 3

| Ingredient | Weight % |
|---|---|
| Poly(styrene-co-acrylonitrile) (MW approximately 165,000 g/mol) | 26.55 |
| SR-368 (Sartomer Co., West Chester, PA) | 35.40 |
| SR-9008 (Sartomer Co., West Chester, PA) | 35.40 |
| Diphenyliodonium hexafluorophosphate | 1.77 |
| Bis-[4-(diphenylamino)stryl]-1,4-(dimethoxy)benzene | 0.88 |

Figure 7:
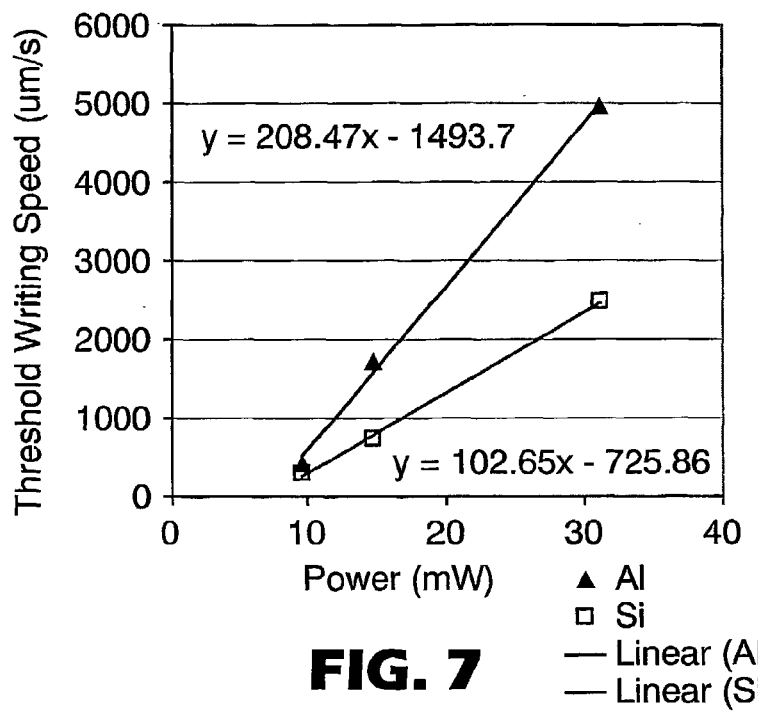
FIG. 7 is a graph of the power dependence of threshold writing speed.

Exposure of the photoreactive composition covered, partially aluminized wafer occurred by continuously moving the sample beneath the highly focussed light from the microscope objective. Lines were scanned across the substrate from the metallized to the unmetallized regions at constant speed. With each successive pass of the laser, the stage velocity was increased by a factor $\sqrt{2}$ to cover a range from 77 to 27520 micrometers per second (μm/s). The dose array was repeated on different areas of the substate with different average laser powers in order to bracket the threshold dose. Developing the reacted polymeric coating using N,N-dimethyl formamide removed the unreacted regions from the substrate, revealing photoreacted lines. The individual photoreacted lines had widths that decreased from 24 μm to 8 μm as the speed was increased. Moreover, the photoreacted lines exhibited good adhesion to both the metallized and unmetallized parts of the silicon substrate. The writing threshold, for a given average laser power, is defined as the highest stage speed at which a photoreacted line is visible when examined using an optical microscope after development. The results on silicon and on aluminum are shown in FIG. 7. The increase in the slope of the power dependence indicates that the writing speed on the metallized region was at least twice that of the bare silicon. Such a result is consistent with the forward and reflected pulses acting independently so that the photoreactive composition on the aluminum receives twice the energy or dose of the photoreactive composition on the silicon.

Example 4

A test substrate consisted of a polymeric film with two faces. One face was planar while the second face had a microreplicated array of retroreflective corner cubes prepared as described in U.S. Pat. No. 5,138,488, Comparative Example A. The thickness of the test substrate was approximately 380 μm. On the planar face, a two-photon initiator loaded, photoreactive composition was coating the surface. The photoreactive composition consisted of reactive monomers in a thermoplastic matrix. The refractive index and density of the photoreactive composition was increased in the illuminated areas as a result of polymerization and subsequent monomer diffusion into the illuminated area. After the desired structures were created, the entire film was blanket exposed using a one-photon source to permanently fix the image. On the corner cube face, one half of the corner cubes were as fabricated and one half were filled with an acrylate polymer to effectively eliminate the retroreflective properties of the corner cubes. The polymeric film was mounted on a glass substrate and lightly taped at the edges.

The light source was a diode pumped Ti:sapphire laser (Spectra-Physics) operating at a wavelength of 800 nm, pulse width 100 fs, pulse repetition rate of 80 MHz, beam diameter of approximately 2 mm, and an average output power of 860 mW. The optical train consisted of low dispersion turning mirrors, an optical attenuator to vary the optical power, and a 5×-microscope objective with 39 mm effective focal length and numerical aperture of 0.09 to focus the light into the sample. With this optical system, the objective produced focal spots having a diameter of approximately 18 μm and a depth of focus of approximately 650 μm. The long depth of focus was necessary so that both the forward and retroreflected spots were in focus in the photoreactive composition (see FIG. 5). The average power delivered to the sample, measured where the beam exits the microscope objective using a calibrated photodiode (photodiode head PD300-3W, commercially available from Ophir Optronics Inc., Danvers, Mass.), was 120 mW in this example.

Reaction was accomplished by positioning the focal spot of the objective lens to coincide with the corner cube/glass substrate interface. The test structures consisted of continuously scanned lines that are 0.5 to 5 cm long with 0.0625 cm spacing between the lines, with all lines lying in the same plane. Each line was the result of a single pass of energy from the laser.

TABLE 2

Photoreactive composition for Example 4

| Ingredient | Weight % |
| --- | --- |
| Cellulose acetate butyrate CAB-531-1 (Eastman Chemicals, Kingsport, TN) | 50.96 |
| Phenoxyethyl acrylate SR-339 (Sartomer Co., West Chester, PA) | 39.51 |
| 2-(1-Naphthoxy)ethyl acrylate* | 5.64 |
| SR-351 (Sartomer Co., West Chester, PA) | 0.94 |
| Bis-[4-(diphenylamino)stryl]-1,4-(dimethoxy)benzene | 0.98 |
| Diphenyliodonium hexafluorophosphate SR1012 (Sartomer Co., West Chester, PA) | 1.96 |

2-(1-Naphthoxy)ethyl acrylate was made as described in U.S. patent application Ser. No. 09/746613, filed on Dec. 21, 2000.

The photoreactive composition described in Table 2 was dissolved in 1,2-dichloroethane to 33% solids and spun coated on to the planar side of the retroreflective substrate. The solvent was removed by baking in an 80° C. oven for 10 minutes. The final layer of photoreactive coating was approximately 20 µm thick. Exposure of the photoreactive composition covered, retroreflective substrate occurred by continuously moving the sample beneath the highly focused light from the microscope objective. Lines were scanned across the substrate at constant speed. With each successive pass of the laser, the stage velocity was increased by a factor $\sqrt{2}$ to cover a range from 77 to 27520 micrometers per second (µm/s). The dose array was repeated on different areas of the substrate with different average laser powers in order to bracket the threshold dose. Following imagewise exposure, the photoreactive composition was blanket exposed using a bank of three Philips TLD 15W-03 bulbs for 30 minutes. A second comparative sample of the same photoreactive composition coated a planar substrate and served to establish the writing threshold.

Figure 8A:
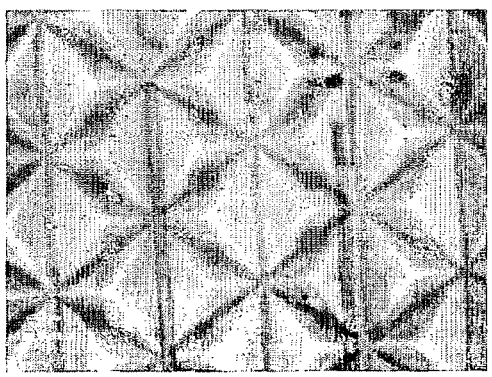
FIG. 8a is an optical micrograph of filled cubes.
Figure 8B:
FIG. 8b is an optical micrograph of open cubes.

FIGS. 8a and 8b shows optical micrographs of the scanned lines. An index matching oil was placed beneath the corner cubes to reduce the reflection from the corner cubes. Retroreflected spots appear along side the line created by the first pass of the focused beam. The spots do not appear where the retroreflective properties were eliminated by filling with acrylate monomer. It is interesting to note that retroreflected spots continued to appear at faster writing speeds, even when the line created by the initial pass through the photoreactive composition was no longer discernable. This may be due to imperfect positioning of the focal point or self-focusing of the light in the photoreactive composition.

Example 5

Figure 6:
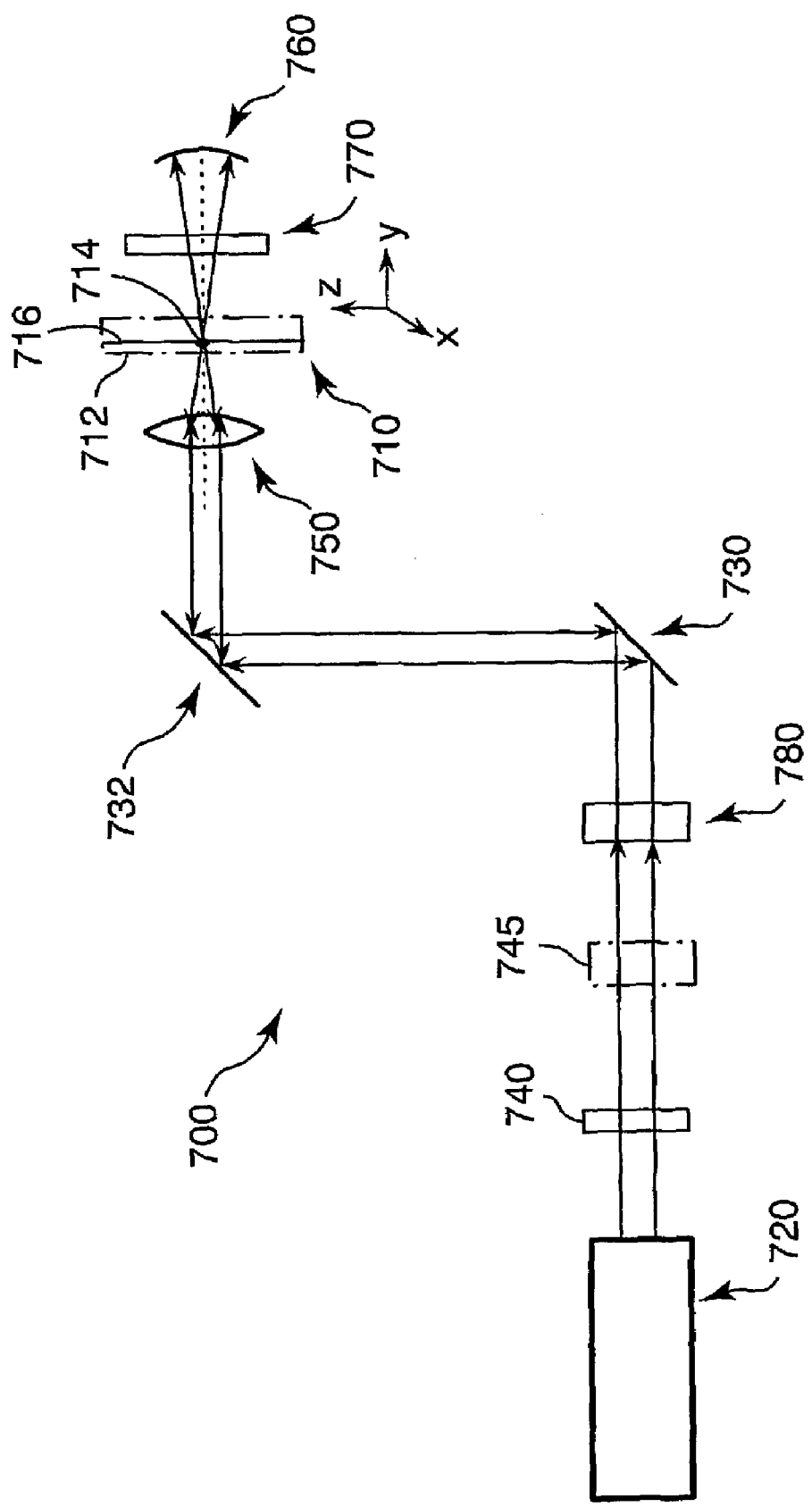
FIG. 6 illustrates a multipass multiphoton absorption apparatus used in Example 5.

As depicted in FIG. 6, a multipass multiphoton absorption apparatus 700 utilizing a transparent substrate 710 and the transmitted light was recycled and used to perform another exposure. The light source 720 was a diode pumped Ti:sapphire laser (Spectra-Physics) operating at a wavelength of 800 nm, pulse width 100 fs, pulse repetition rate of 80 MHz, beam diameter of approximately 2 mm, and an average output power of 860 mW. The optical train, shown in FIG. 6, consisted of low dispersion turning mirrors 730 and 732, an optical attenuator 740 to vary the optical power, a shutter 745, and a 10×-microscope objective 750 (0.25 NA) to focus the light into the sample 710. The objective 750 produced focal points having a diameter of approximately 8 µm and a depth of focus of approximately 120 µm. The transmitted light was collected and re-focused on to the sample 710 by a 25-mm diameter, aluminum coated spherical focusing mirror 760 (commercially available from Newport Corp., Irvine, Calif.) with 10-cm focal length, that was mounted on a 3-axis translation stage and gimbal mirror mount, 20 cm from the photoreactive composition coated substrate 710. A zero order quarter wave plate 770 (commercially available from CVI Laser Corp.) was placed between the sample 710 and the focusing mirror 760 to rotate the polarization of the reflected light by ninety degrees. Combined with the linear polarizing cube 780, these optics formed an efficient optical isolator to prevent the reflected light from returning to the laser cavity 720.

The test substrate 710 consisted of a photoreactive composition 712 coated on to one side of an optically transparent microscope slide. To promote polymer adhesion, a 2% solution of trimethoxysilylpropylmethacrylate in aqueous ethanol (pH of approximately 4.5) was spun coat on the substrates, which were then baked in an 130° C. oven for 10 min. A thin layer of the photoreactive composition (see Table 3), 40% by weight of solids in dioxane, was then spun coated over the entire wafer and baked in an 80° C. oven to remove the solvent. The final layer of photoreactive coating was approximately 20 µm thick.

TABLE 3

Photoreactive composition for Example 5

| Ingredient | Weight % |
| --- | --- |
| Polymethylmethacrylate (MW approximately 300,00 g/mol) | 26.55 |
| SR-368 (Sartomer Company, West Chester, PA) | 35.40 |
| SR-9008 (Sartomer Company, West Chester, PA) | 35.40 |
| Diphenyliodonium hexafluorophosphate | 1.77 |
| Bis-[4-(diphenylamino)stryl]-1,4-(dimethoxy)benzene | 0.88 |

Reaction was accomplished by positioning a focal point 714 of the objective lens 750 to coincide with the substrate polymer interface 716. The image of the focal point 714 produced by the focusing mirror 760 was also positioned at this interface 716. Test structures consisted of continuously scanned lines that were 0.5 cm long with 0.125 cm spacing between the lines, all with lines lying in the same plane. Each line was the result of a single pass of energy from the laser 720. Exposure of the photoreactive composition covered slides 710 occurred by continuously moving the sample beneath the highly focused light from the microscope objective 750 and the focusing mirrors 760. Lines were scanned across the substrate 710 at constant speed. With each successive pass of the laser, the stage velocity was increased by a factor $\sqrt{2}$ to cover a range from 77 to 27520 µm/s. The dose array was repeated on different areas of the substrate with different average laser powers in order to bracket the threshold dose. Developing the exposed photoreactive composition 712 using N,N-dimethyl formamide removed the unreacted regions from the substrate 710, revealing photoreacted lines. The individual photoreacted lines had widths that decreased from 24 µm to 8 µm as the speed was increased. Moreover, the photoreacted lines exhibited good adhesion to the glass substrate 710. The writing threshold, for a given average laser power, was defined as the highest stage speed at which a photoreacted line was visible when examined using an optical microscope after development.

Figure 9A:
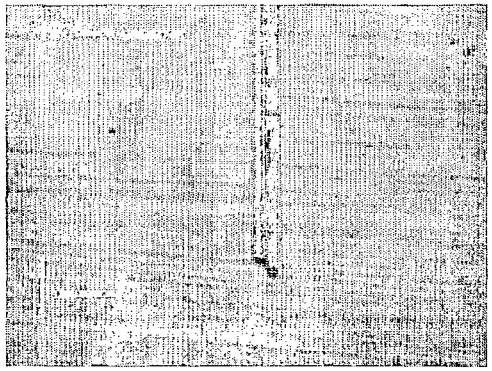
FIG. 9a is an optical micrograph of scanned lines (mirror unblocked).
Figure 9B:
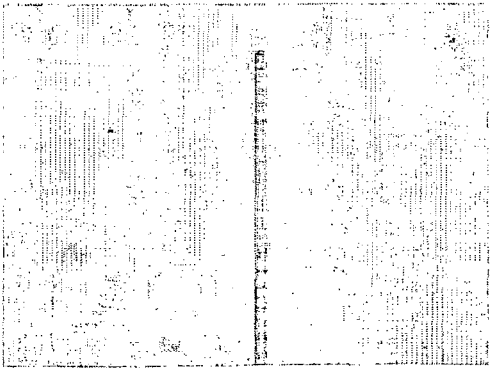
FIG. 9b is an optical micrograph of scanned lines (mirror blocked).

In one example, the reflected spot 714 from the focusing mirror 760 was positioned slightly offset from the region exposed on the first pass through the sample. In this case, two parallel lines appeared wherever the sample had been scanned. See, FIG. 9a. When the reflected beam from the focusing mirror was blocked, only a single line appeared (see FIG. 9b). In a second example, the reflected spot 714 was directed back on to the first focus region to increase the exposure. The sample was then scanned both with the mirror 760 blocked and when it is covered by a non-focusing, scattering substrate. Table 4 shows the threshold speed using an average power of approximately 53 mW, both with the mirror blocked and when the transmitted and reflected focal points were overlapped. Sample IV of Table 4 demonstrates that when the mirror 760 was unblocked but the focal points were not overlapped, there was no enhancement of the threshold writing speed.

TABLE 4

Threshold speed with and without the reflected spot

| Sample | Threshold speed ($\mu$m/s) Mirror Blocked | Threshold speed ($\mu$m/s) Mirror Unblocked | Comments |
|---|---|---|---|
| I | 310 | 620 | Overlapped |
| II | 215 | 430 | Overlapped |
| III | — | 525 | Overlapped |
| IV | 215 | 215 | Not overlapped |

The complete disclosures of the patents, patent documents, and publications cited herein are incorporated by reference in their entirety as if each were individually incorporated. Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

What is claimed is:

1. A method of increasing the efficiency of a multiphoton absorption exposure process, the method comprising:
    providing a photoreactive composition;
    providing a source of infrared or visible light sufficient for simultaneous absorption of at least two photons by the photoreactive composition;
    exposing the photoreactive composition to at least light of a first transit of light from the light source to effect simultaneous absorption of at least two photons by the photoreactive composition;
    directing at least a portion of the light from the first transit of light back into the photoreactive composition using at least one optical element and focusing the light sufficiently to effect simultaneous absorption of at least two photons by the photoreactive composition; and
    wherein a plurality of photons not absorbed in the first transit are used to expose the photoreactive composition in a subsequent transit;
    wherein the efficiency of the multiphoton absorption exposure process is increased relative to the same process that uses only one transit of light;
    and further wherein directing at least a portion of the first transit of the light back into the photoreactive composition comprises directing at least a portion of the first transit of the light back into the photoreactive composition at a location different from that exposed to the first transit of light.

2. The method of claim 1 wherein the photoreactive composition comprises a reactive species.

3. The method of claim 2 wherein the reactive species is a curable species.

4. The method of claim 1 wherein the photoreactive composition comprises a multiphoton photosensitizer.

5. The method of claim 1 wherein the photoreactive composition comprises an electron donor compound.

6. The method of claim 1 wherein the photoreactive composition comprises a photoinitiator.

7. The method of claim 1 wherein the photoreactive composition comprises about 5% to about 99.79% by weight of the at least one reactive species, about 0.01% to about 10% by weight of the at least one multiphoton photosensitizer, up to about 10% by weight of the at least one electron donor compound, and about 0.1% to about 10% by weight of the at least one photoinitiator, based upon the total weight of solids.

8. The method of claim 1 wherein exposing comprises pulse irradiating.

9. The method of claim 8 wherein the pulse irradiating is carried out using a near infrared pulsed laser having a pulse length less than about 10 nanoseconds.

10. The method of claim 1 wherein the light source comprises a pulsed laser.

11. A method of increasing the efficiency of a multiphoton absorption exposure process, the method comprising:
    providing a photoreactive composition;
    providing a source of sufficient light for simultaneous absorption of at least two photons by the photoreactive composition;
    exposing the photoreactive composition to light from the light source and focusing the light sufficiently at a first focal point to effect simultaneous absorption of at least two photons by the photoreactive composition;
    reflecting the light back into the photorective composition without effecting simultaneous absorption of at least two photons by the photoreactive composition; and
    subsequently directing at least a portion of the light back into the photoreactive composition and focusing the light sufficiently at a second focal point to effect simultaneous absorption of at least two photons by the photoreactive composition;
    wherein the efficiency of the multiphoton absorption exposure process is increased relative to the same process that uses only one transit of light;
    and further wherein reflecting the light comprises reflecting multiple transits of the light through the photoreactive composition without focusing.

12. A method of increasing the efficiency of a multiphoton absorption exposure process, the method comprising:
    providing a photoreactive composition;
    providing a source of sufficient light for simultaneous absorption of at least two photons by the photoreactive composition;
    exposing the photoreactive composition to light from the light source and focusing the light sufficiently at a first focal point to effect simultaneous absorption of at least two photons by the photoreactive composition;
    reflecting the light back into the photorective composition without effecting simultaneous absorption of at least two photons by the photoreactive composition; and
    subsequently directing at least a portion of the light back into the photoreactive composition and focusing the light sufficiently at a second focal point to effect simultaneous absorption of at least two photons by the photoreactive composition;
    wherein the efficiency of the multiphoton absorption exposure process is increased relative to the same process that uses only one transit of light;

and further wherein reflecting the light through the photoreactive composition and subsequently focusing the light is repeated one or more times to create a plurality of focal points.

13. The method of claim 12 wherein the photoreactive composition is cured proximate the first focal point.

14. The method of claim 12 wherein the photoreactive composition is cured proximate the second focal point.

15. The method of claim 12 wherein the photoreactive composition comprises a reactive species.

16. The method of claim 15 wherein the reactive species is a curable species.

17. The method of claim 12 wherein the photoreactive composition comprises a multiphoton photosensitizer.

18. The method of claim 12 wherein the photoreactive composition comprises an election donor compound.

19. The method of claim 12 wherein the photoreactive composition comprises a photoinitiator.

20. The method of claim 12 wherein the photoreactive composition comprises about 5% to about 99.79% by weight of the at least one reactive species, about 0.01% to about 10% by weight of the at least one multiphoton photosensitizer, up to about 10% by weight of the at least one electron donor compound, and about 0.1% to about 10% by weight of the at least one photoinitiator, based upon the total weight of solids.

21. The method of claim 12 wherein the light source comprises a pulsed laser.

22. The method of claim 12 wherein the first focal point and second focal point are at the same location within the photoreactive composition.

23. A method of increasing the efficiency of a multiphoton absorption exposure process, the method comprising:
providing a photoreactive composition disposed on a reflective substrate;
providing a source of sufficient light for simultaneous absorption of at least two photons by the photoreactive composition;
exposing the photoreactive composition to the light from the light source at a first focal point to effect simultaneous absorption of at least two photons by the photoreactive composition;
reflecting the light back into the photoreactive composition by the reflective substrate; and
directing the light to an optical element for reflecting the light back into the photoreactive composition and focusing the light sufficiently at a second focal point to effect simultaneous absorption of at least two photons by the photoreactive composition;
wherein reflecting the light by the reflective substrate and reflecting the light by an optical element are repeated one or more times to create a plurality of focal points;
and further wherein the reflective substrate comprises an array of microreflectors.

24. A method of increasing the efficiency of a multiphoton absorption exposure process, the method comprising:
providing a photoreactive composition disposed on a reflective substrate;
providing a source of sufficient light for simultaneous absorption of at least two photons by the photoreactive composition;
exposing the photoreactive composition to the light from the light source at a first focal point to effect simultaneous absorption of at least two photons by the photoreactive composition;
reflecting the light back into the photoreactive composition by the reflective substrate; and
directing the light to an optical element for reflecting the light back into the photoreactive composition and focusing the light sufficiently at a second focal point to effect simultaneous absorption of at least two photons by the photoreactive composition;
wherein reflecting the light by the reflective substrate and reflecting the light by an optical element are repeated one or more times to create a plurality of focal points;
and further wherein the reflective substrate comprises a microreplicated array of retroreflective corner cubes.

25. A method of increasing the efficiency of a multiphoton absorption exposure process, the method comprising;
providing a photoreactive composition;
providing a source of sufficient light for simultaneous absorption of at least two photons by the photoreactive composition;
exposing the photoreactive composition to light from the light source and focusing the light sufficiently at a first focal point to effect simultaneous absorption of at least two photons by the photoreactive composition;
reflecting the light back into the photorective composition without effecting simultaneous absorption of at least two photons by the photoreactive composition; and
subsequently directing at least a portion of the light back into the photoreactive composition and focusing the light sufficiently at a second focal point to effect simultaneous absorption of at least two photons by the photoreactive composition;
wherein the efficiency of the multiphoton absorption exposure process is increased relative to the same process that uses only one transit of light;
and further wherein the first focal point and second focal point are at different locations within the photoreactive composition.

26. A method of increasing the efficiency of a multiphoton absorption exposure process, the method comprising;
providing a photoreactive composition;
providing a source of light sufficient for simultaneous absorption of at least two photons by the photoreactive composition;
exposing the photoreactive composition to at least a first transit from the light source and focusing the light sufficiently to effect simultaneous absorption of at least two photons by the photoreactive composition;
directing at least a portion of the light from the first transit of light back into the photoreactive composition using at least one optical element and focusing the light sufficiently to effect simultaneous absorption of at least two photons by the photoreactive composition; and
wherein a plurality of photons not absorbed in the first transit are used to expose the photoreactive composition in a subsequent transit;
wherein the efficiency of the multiphoton absorption exposure process is increased relative to the same process that uses only one transit of light;
and further wherein directing at least a portion of the first transit of the light back into the photoreactive composition comprises directing at least a portion of the first transit of the light back into the photoreactive composition at a location different from that exposed to the first transit of light.

27. The method of claim 26 wherein directing at least a portion of the first transit of the light back into the photoreactive composition comprises directing at least a portion of the first transit of the light back into the photoreactive composition at the same location exposed to the first transit of light.

* * * * *

UNITED STATES PATENT AND TRADEMARK OFFICE
CERTIFICATE OF CORRECTION

PATENT NO.        : 7,166,409 B2
APPLICATION NO. : 10/297968
DATED             : January 23, 2007
INVENTOR(S)      : Patrick R. Fleming It is certified that error appears in the above-identified patent and that said Letters Patent is hereby corrected as shown below:

On the Title Page, Item -56-
Page 3 of the Title Pages, under (Other Publications)
Line 42, delete "SPIEvol." and insert -- SPIE vol. --, therefor.

On the Title Page, Item -56-
Page 3 of the Title Pages, under (Other Publications)
Line 2, delete "3993," and insert -- 3933, --, therefor.
Line 28, delete "Amplifcation" and insert -- Amplification--, therefor.
Line 49, delete "resisst" and insert -- resist --, therefor.
Line 67, delete "Photopolymerizaton," and insert -- Photopolymerization, --, therefor.

On the Title Page Item -56-
Page 4 of the Title Pages, under (Other Publications)
Line 22, delete "1996," and insert -- 1966, --, therefor.
Line 22, delete "Hillpp." and insert -- Hill, pp. --, therefor.

On the Title Page Item -56-
Page 4 of the Title Pages, under (Other Publications)
Line 9, delete "Tetrahedronvol." and insert -- Tetrahedron, vol. --, therefor.

Col. 6
Line 58, delete "f" and insert -- $f$ --, therefor.
Line 62, delete "f" and insert -- $f$ --, therefor.

Col 14
Line 40, delete "$R^1$" and insert -- $R_1$ --, therefor.
Lines 64-67, below "atoms;" delete "and $R^{11}$ is selected from alkyl ---------of this type of leuco dye:" and insert the same on line 63 after "atom;" as a continuous paragraph.

Col. 33
Lines 31-32, delete "Photochemistiy," and insert -- Photochemistry, --, therefor.

Col. 34
Line 32, delete "$^{(n-C}4H_9)$" and insert -- $(n-C_4H_9)$ --, therefor.

Col. 35
Line 51, delete "$^{or\,C}4H_5$" and insert -- or $C_4H_9$ --, therefor.

UNITED STATES PATENT AND TRADEMARK OFFICE
CERTIFICATE OF CORRECTION

PATENT NO. : 7,166,409 B2
APPLICATION NO. : 10/297968
DATED : January 23, 2007
INVENTOR(S) : Patrick R. Fleming It is certified that error appears in the above-identified patent and that said Letters Patent is hereby corrected as shown below:

Col. 37
Line 15, delete "N–," and insert -- $N^-$, --, therefor.
Line 16, delete "N–," and insert -- $N^-$, --, therefor.
Line 16, delete "C–," and insert -- $C^-$, --, therefor.
Line 16, delete "C–," and insert -- $C^-$, --, therefor.
Line,16, delete "N–," and insert -- $N^-$, --, therefor.
Line 17, delete "C–," and insert -- $C^-$, --, therefor.
Line 17, delete "C–," and insert -- $C^-$, --, therefor.
Line 18, delete "N–," and insert -- $N^-$, --, therefor.
Line 18, delete "N–," and insert -- $N^-$, --, therefor.
Line 19, delete "C–" and insert -- $C^-$ --, therefor.
Line 19, delete "N–" and insert -- $N^-$ --, therefor.
Line 20, delete "C–" and insert -- $C^-$ --, therefor.
Line 20, delete "N–" and insert -- $N^-$ --, therefor.

Col. 41
Line 10, delete "20x" and insert -- 20X --, therefor.

Col. 42
Line 45, delete "Homer" and insert -- Horner --, therefor.

Col. 43
Line 10, delete "40x" and insert -- 40X --, therefor.

Col. 44
Line 27, delete "40x" and insert -- 40X --, therefor.

Col. 45
Line 17, delete "10x" and insert -- 10X --, therefor.

Col. 46
Line 48, delete "5x" and insert -- 5X --, therefor.

Col. 47
Line 63, delete "10x" and insert -- 10X --, therefor.

Col. 51
Line 16, in Claim 18, delete "election" and insert -- electron --, therefor.

UNITED STATES PATENT AND TRADEMARK OFFICE
CERTIFICATE OF CORRECTION

PATENT NO.         : 7,166,409 B2
APPLICATION NO. : 10/297968
DATED              : January 23, 2007
INVENTOR(S)        : Patrick R. Fleming It is certified that error appears in the above-identified patent and that said Letters Patent is hereby corrected as shown below:

Col. 52
Line 11, in Claim 25, delete "comprising;" and insert -- comprising: --, therefor.
Line 35, in Claim 26, delete "comprising;" and insert -- comprising: --, therefor.

Signed and Sealed this

Twenty-second Day of May, 2007

JON W. DUDAS
*Director of the United States Patent and Trademark Office*